United States Patent
Asao et al.

(10) Patent No.: US 7,745,894 B2
(45) Date of Patent: Jun. 29, 2010

(54) SEMICONDUCTOR MEMORY DEVICE

(75) Inventors: Yoshiaki Asao, Sagamihara (JP);
Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 383 days.

(21) Appl. No.: 11/943,831

(22) Filed: Nov. 21, 2007

(65) Prior Publication Data

US 2008/0308887 A1    Dec. 18, 2008

(30) Foreign Application Priority Data

Nov. 24, 2006    (JP)    ............................. 2006-317520

(51) Int. Cl.
*H01L 21/98*    (2006.01)
(52) U.S. Cl. ............... 257/421; 257/295; 257/E29.323; 365/66; 365/158
(58) Field of Classification Search ................. 257/295, 257/421; 365/66, 158
See application file for complete search history.

(56) References Cited

U.S. PATENT DOCUMENTS 6,172,898 B1    1/2001    Kajiyama
6,271,081 B2    8/2001    Kajiyama
7,091,539 B2 *    8/2006    Asao ........................... 257/295
7,142,447 B2 *    11/2006    Ueda et al. .................. 365/158
7,272,035 B1 *    9/2007    Chen et al. .................. 365/158
2004/0100835 A1    5/2004    Sugibayashi et al. ........ 365/200
2005/0073897 A1 *    4/2005    Miyatake et al. ............ 365/222
2006/0220084 A1 *    10/2006    Umehara et al. ............ 257/296

FOREIGN PATENT DOCUMENTS

JP    2003-218326    7/2003

* cited by examiner

*Primary Examiner*—Alexander G Ghyka
(74) *Attorney, Agent, or Firm*—Oblon, Spivak, McClelland, Maier & Neustadt, L.L.P.

(57) ABSTRACT

A semiconductor memory device includes first to third wiring layers formed above a semiconductor substrate, extending in a first direction, and sequentially arranged in a second direction perpendicular to the first direction, a plurality of active areas formed in the semiconductor substrate, and extending in a direction oblique to the first direction, first and second selection transistors formed in each of the active areas, and sharing a source region electrically connected to the second wiring layer, a first magnetoresistive element having one terminal electrically connected to a drain region of the first selection transistor, and the other terminal electrically connected to the first wiring layer, and a second magnetoresistive element having one terminal electrically connected to a drain region of the second selection transistor, and the other terminal electrically connected to the third wiring layer.

20 Claims, 47 Drawing Sheets

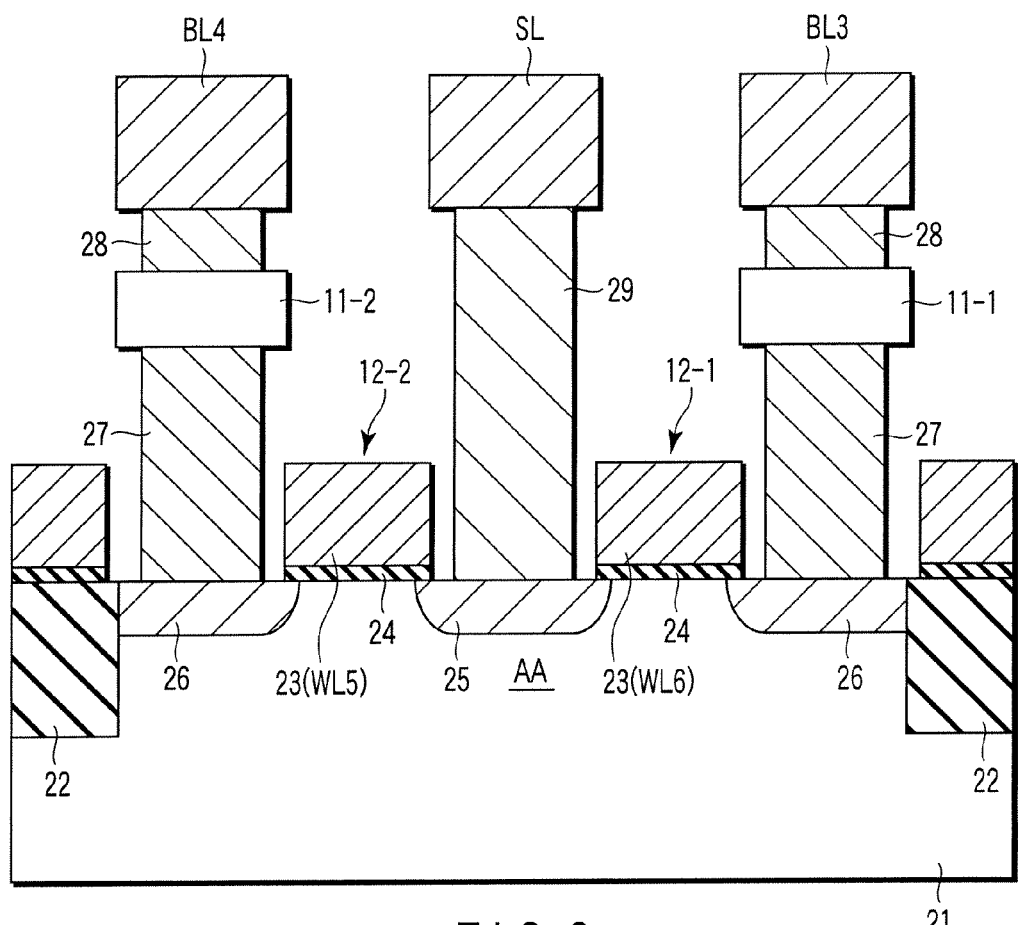
F I G. 2
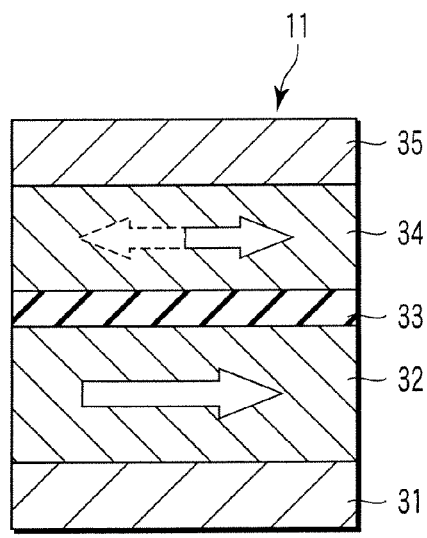
F I G. 4

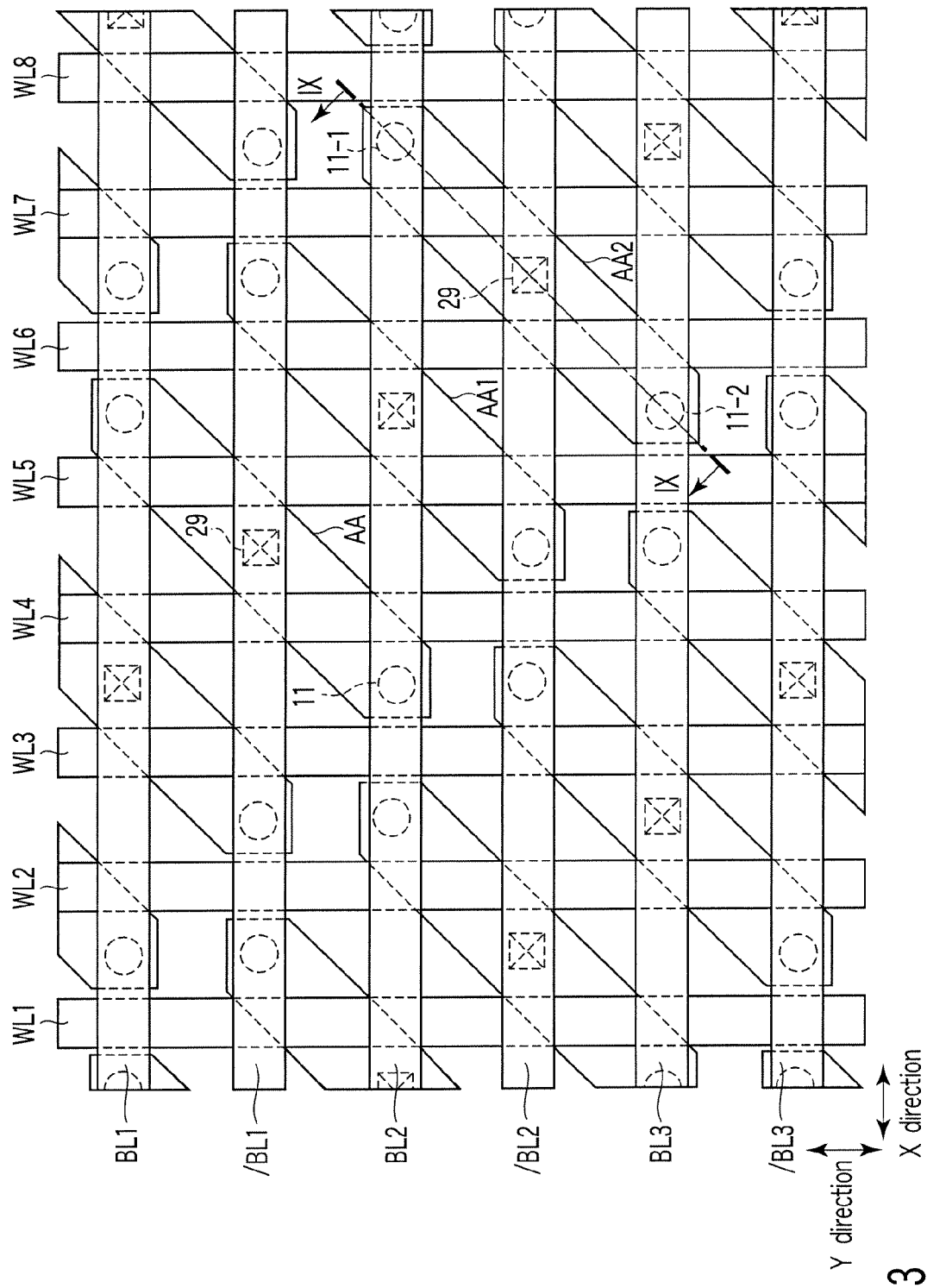
F I G. 13

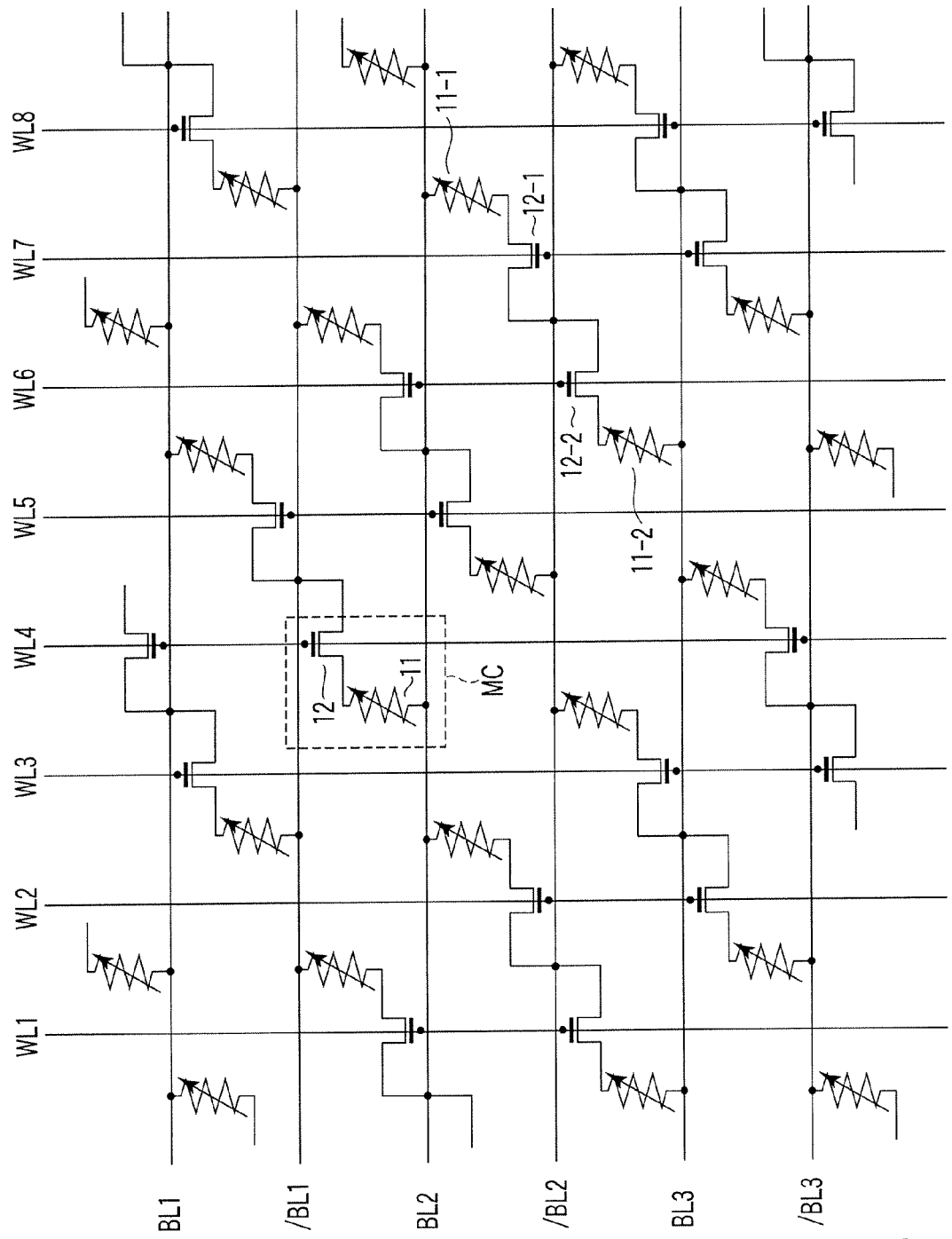
F I G. 14

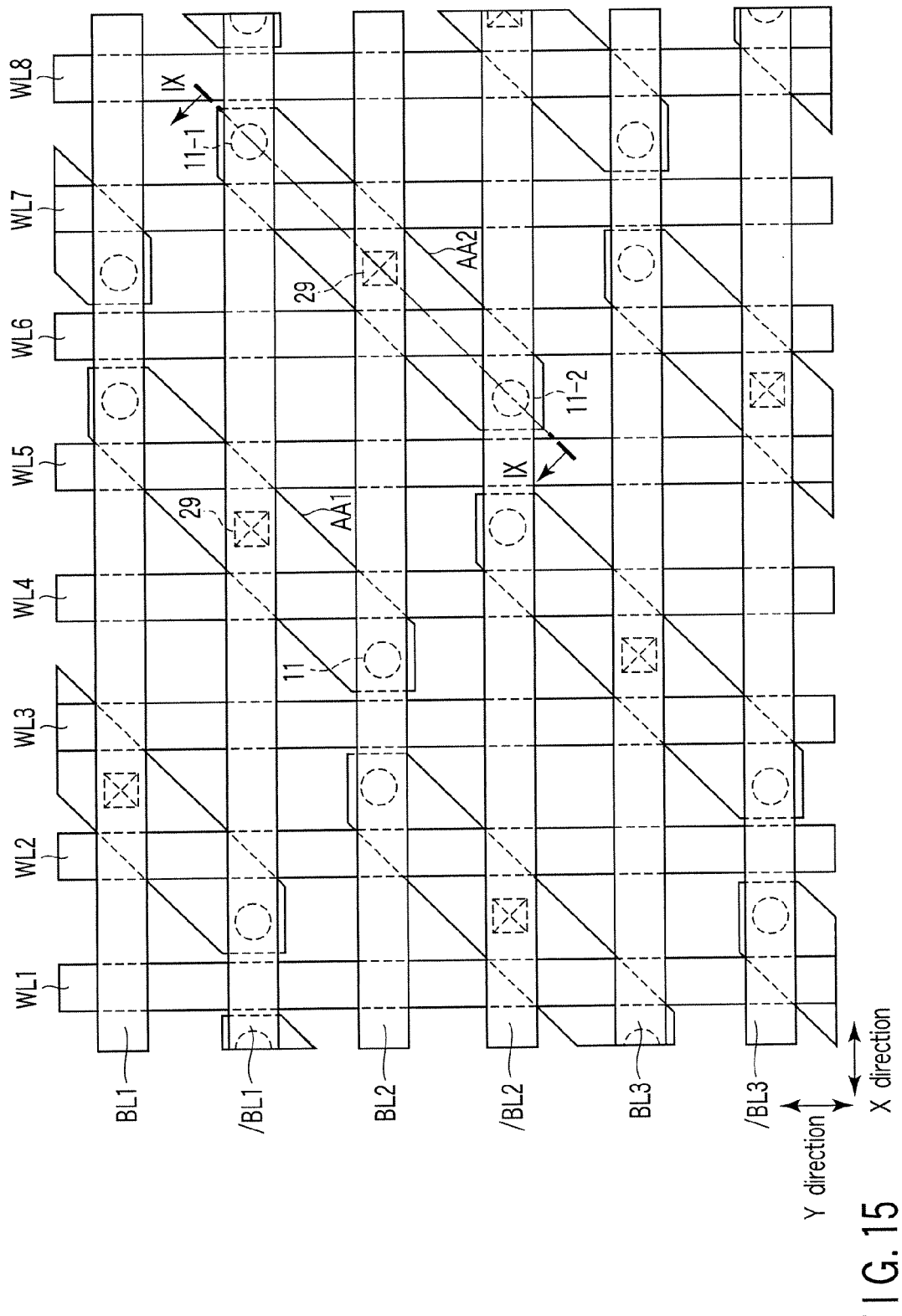
F I G. 15

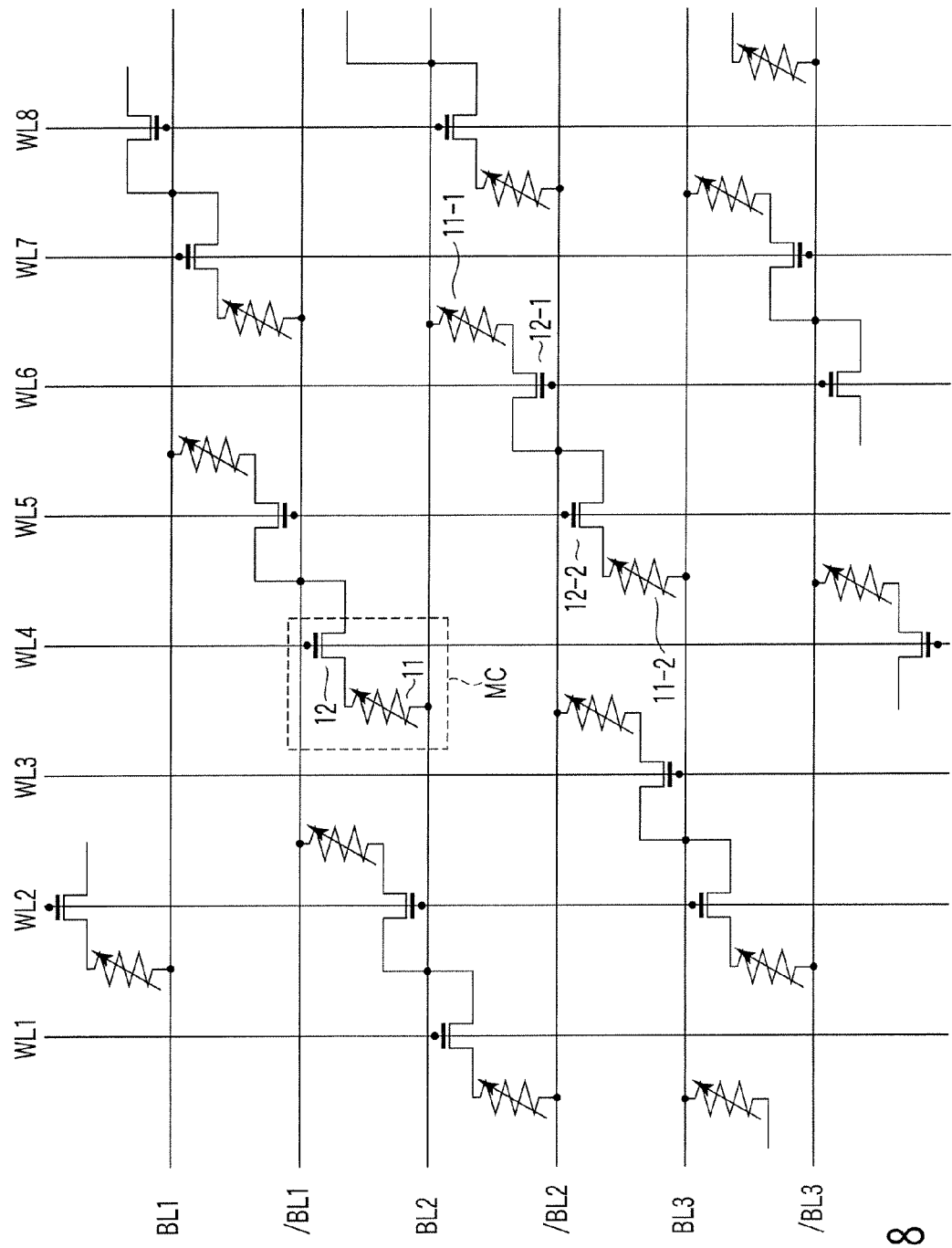
F I G. 18

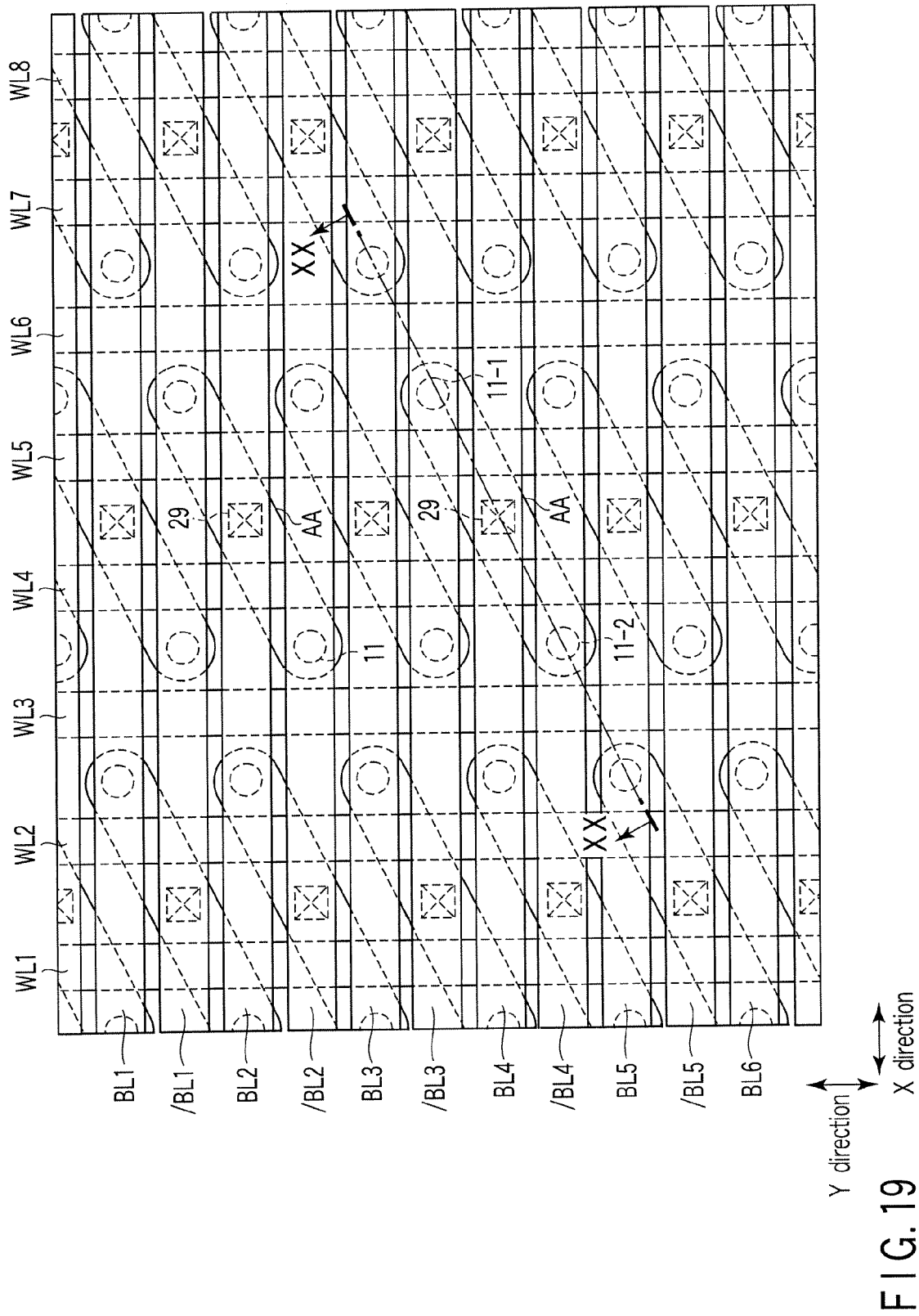
F I G. 19

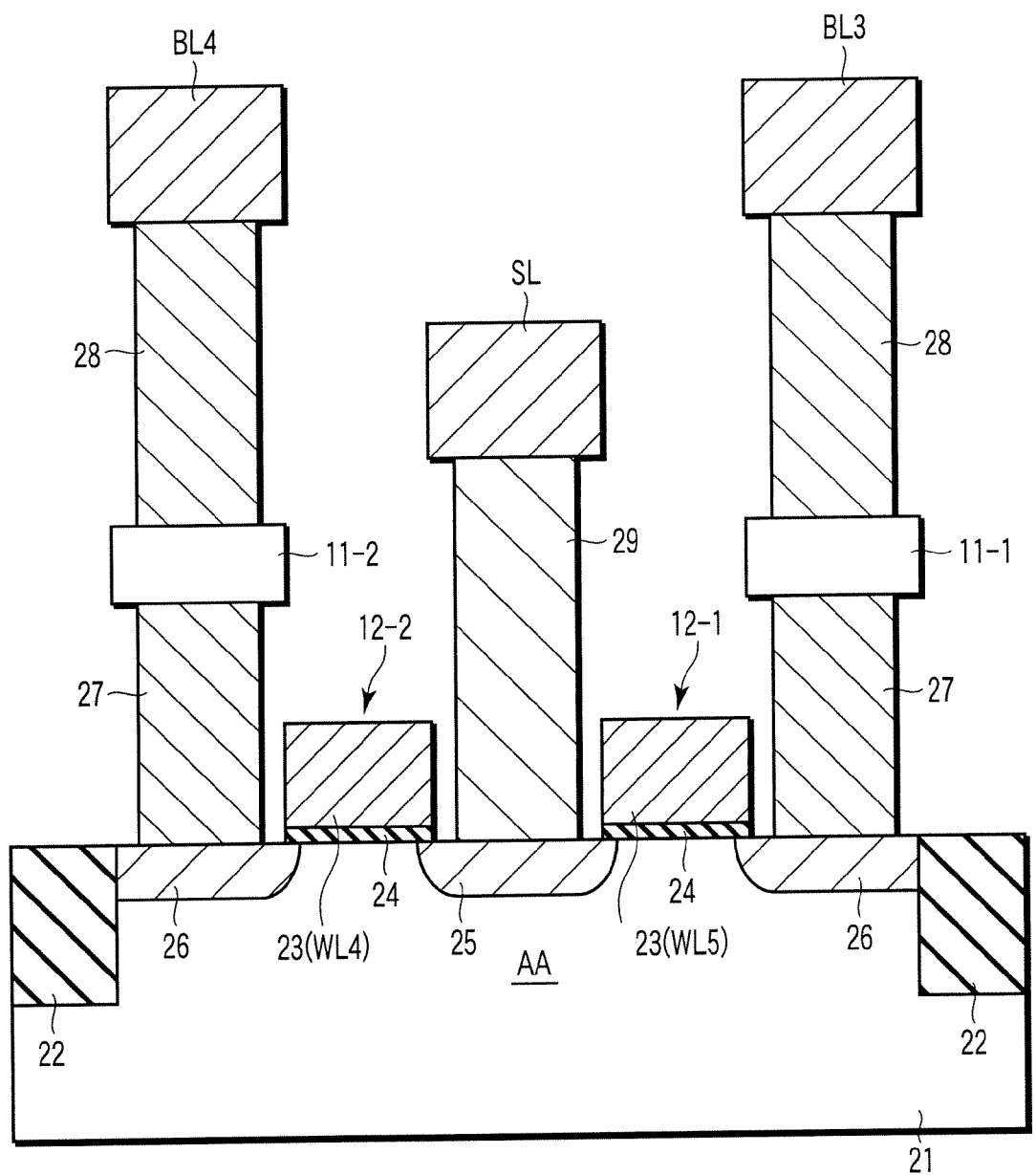
F I G. 23

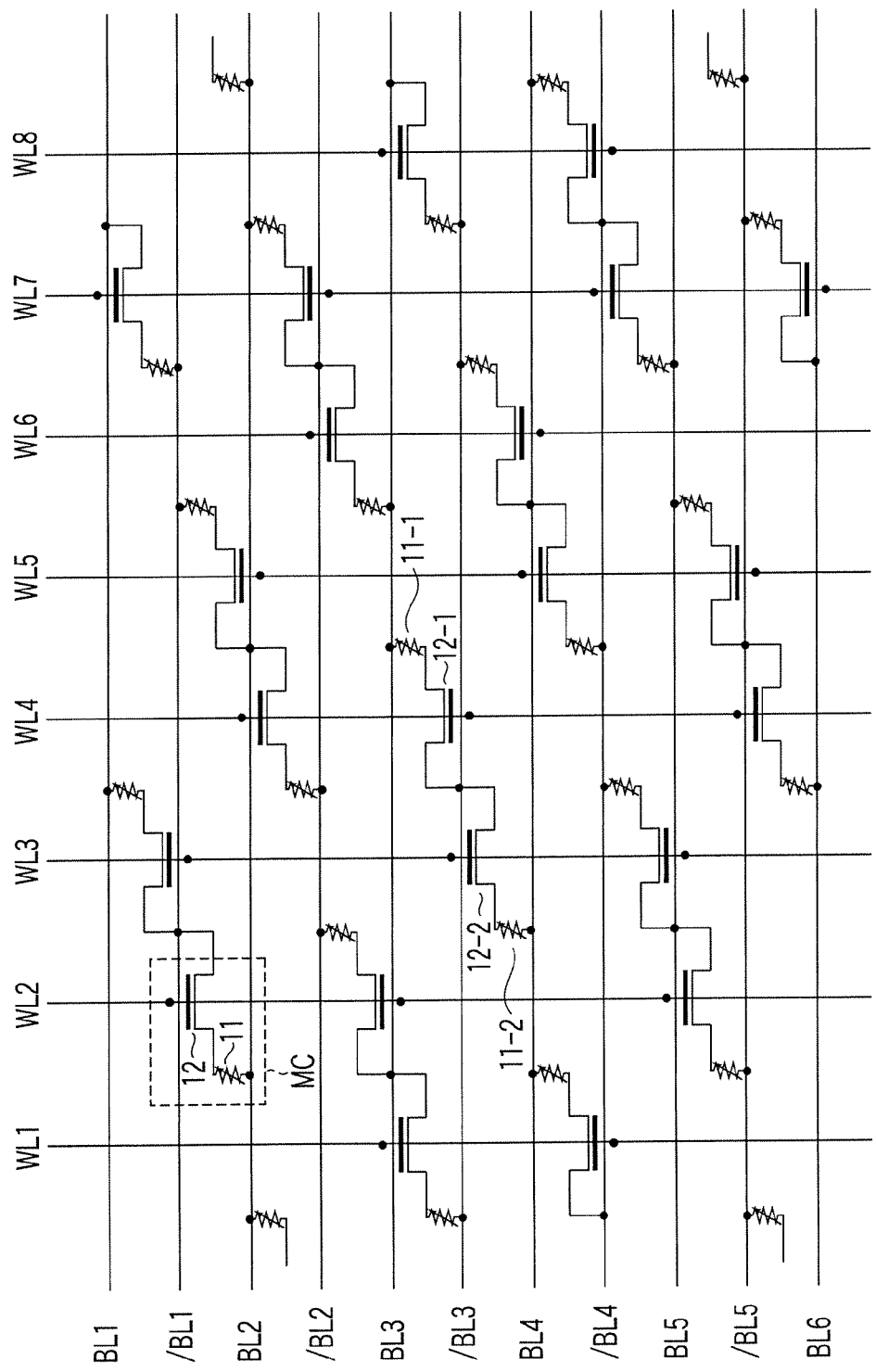
F I G. 30

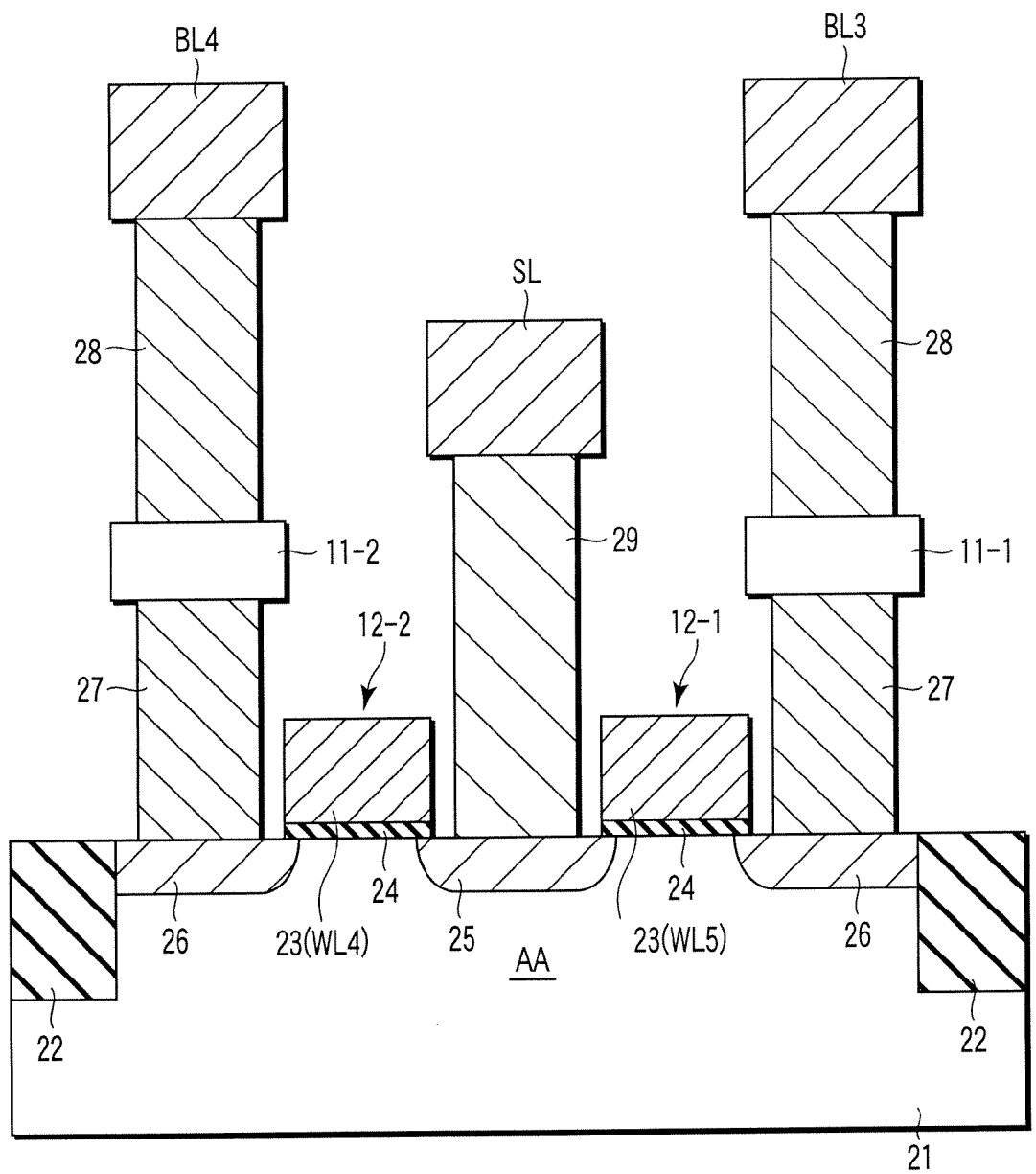
F I G. 36

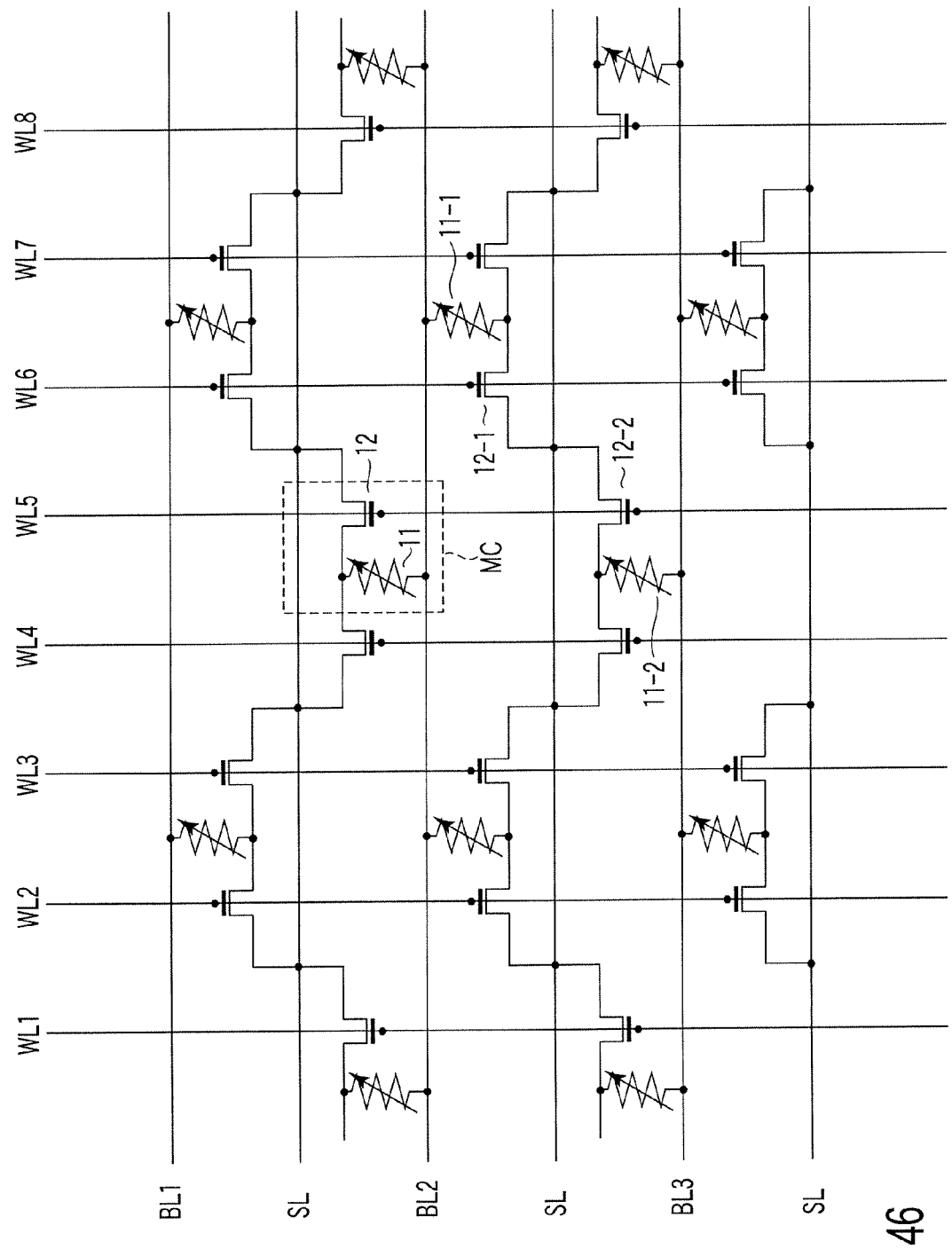
F I G. 46

SEMICONDUCTOR MEMORY DEVICE

CROSS-REFERENCE TO RELATED APPLICATIONS

This application is based upon and claims the benefit of priority from prior Japanese Patent Application No. 2006-317520, filed Nov. 24, 2006, the entire contents of which are incorporated herein by reference.

BACKGROUND OF THE INVENTION

1. Field of the Invention

The present invention relates to a semiconductor memory device, e.g., a semiconductor memory device including a memory element capable of storing a binary digit by supplying currents bidirectionally.

2. Description of the Related Art

Recently, many solid-state memories for storing data on the basis of new principles have been proposed. In particular, a magnetic random access memory (MRAM) using the tunneling magnetoresistive effect is attracting attention as a solid-state magnetic memory. The MRAM is characterized by storing data in accordance with the magnetization state of a magnetic tunnel junction (MTJ) element.

In the conventional MRAM in which data is written by a magnetic field generated by a line current, the holding force increases when the size of the MTJ element decreases. This often increases the write current. The conventional MRAM described above cannot decrease the cell size for the purpose of increasing the capacity and decrease the current at the same time.

A spin-injection-type MRAM using the spin momentum transfer (SMT) write method as a write method capable of solving the above problem has been proposed. In this spin-injection-type MRAM, data is written by a current flowing through the MTJ element in a direction perpendicular to the film surface, and the spin direction in a free layer is changed by the direction of this current. Also, a memory cell comprises an MTJ element and selection transistor. For example, this selection transistor shares a source region with an adjacent cell in order to reduce the cell area.

When two selection transistors share the source region in the spin-injection-type MRAM, the source potential is supplied by a wiring layer by (1) forming a source potential line parallel to the gate electrode of the selection transistor, or (2) forming a source potential line perpendicularly to the gate electrode of the selection transistor. Method 2 has the problem that in an active area formed perpendicularly to the gate electrode of the selection transistor, no contact can be directly formed from the source potential line to the source region of the selection transistor.

As a related technique of this kind, a technique that improves the reliability and suppresses crosstalk by increasing the degree of integration in an MRAM in which data is written by using a current magnetic field is disclosed (Jpn. Pat. Appln. KOKAI Publication No. 2003-218326).

BRIEF SUMMARY OF THE INVENTION

According to a first aspect of the present invention, there is provided a semiconductor memory device comprising:

a semiconductor substrate;

a first wiring layer, a second wiring layer, and a third wiring layer formed above the semiconductor substrate, extending in a first direction, and sequentially arranged in a second direction perpendicular to the first direction;

a plurality of active areas formed in the semiconductor substrate, and extending in a direction oblique to the first direction;

a first selection transistor and a second selection transistor formed in each of the active areas, and sharing a source region electrically connected to the second wiring layer;

a first magnetoresistive element which changes a resistance in accordance with a direction of a supplied current, and has one terminal electrically connected to a drain region of the first selection transistor, and the other terminal electrically connected to the first wiring layer; and a second magnetoresistive element which changes a resistance in accordance with a direction of a supplied current, and has one terminal electrically connected to a drain region of the second selection transistor, and the other terminal electrically connected to the third wiring layer.

According to a second aspect of the present invention, there is provided a semiconductor memory device comprising:

a semiconductor substrate;

a first wiring layer, a second wiring layer, and a third wiring layer formed above the semiconductor substrate, extending in a first direction, and sequentially arranged in a second direction perpendicular to the first direction;

a plurality of active areas formed in the semiconductor substrate, having a V-shape, and including a first member which inclines in one direction with respect to the first direction, and a second member which inclines in the other direction with respect to the first direction;

a first selection transistor and a second selection transistor formed in each of the active areas, and sharing a source region electrically connected to the second wiring layer;

a first magnetoresistive element which changes a resistance in accordance with a direction of a supplied current, and has one terminal electrically connected to a drain region of the first selection transistor, and the other terminal electrically connected to the first wiring layer; and a second magnetoresistive element which changes a resistance in accordance with a direction of a supplied current, and has one terminal electrically connected to a drain region of the second selection transistor, and the other terminal electrically connected to the third wiring layer.

BRIEF DESCRIPTION OF THE SEVERAL VIEWS OF THE DRAWING

FIG. 2 is a sectional view of the MRAM taken along a line II-II in FIG. 1;

FIG. 4 is a sectional view illustrating the arrangement of an MTJ element 11;

FIG. 13 is a plan view illustrating the arrangement of an MRAM according to the third embodiment of the present invention;

FIG. 14 is a circuit diagram of the MRAM shown in FIG. 13;

FIG. 15 is a plan view illustrating another embodiment of the MRAM;

FIG. 18 is a circuit diagram of the MRAM shown in FIG. 17;

FIG. 19 is a plan view illustrating the arrangement of an MRAM according to the fourth embodiment of the present invention;

FIG. 23 is a sectional view of the MRAM taken along a line XXIII-XXIII in FIG. 22;

FIG. 30 is a circuit diagram of the MRAM shown in FIG. 27;

FIG. 36 is a sectional view of the MRAM taken along a line XXXVI-XXXVI in FIG. 35;

FIG. 46 is a circuit diagram of the MRAM shown in FIG. 45;

DETAILED DESCRIPTION OF THE INVENTION

Figure 1:
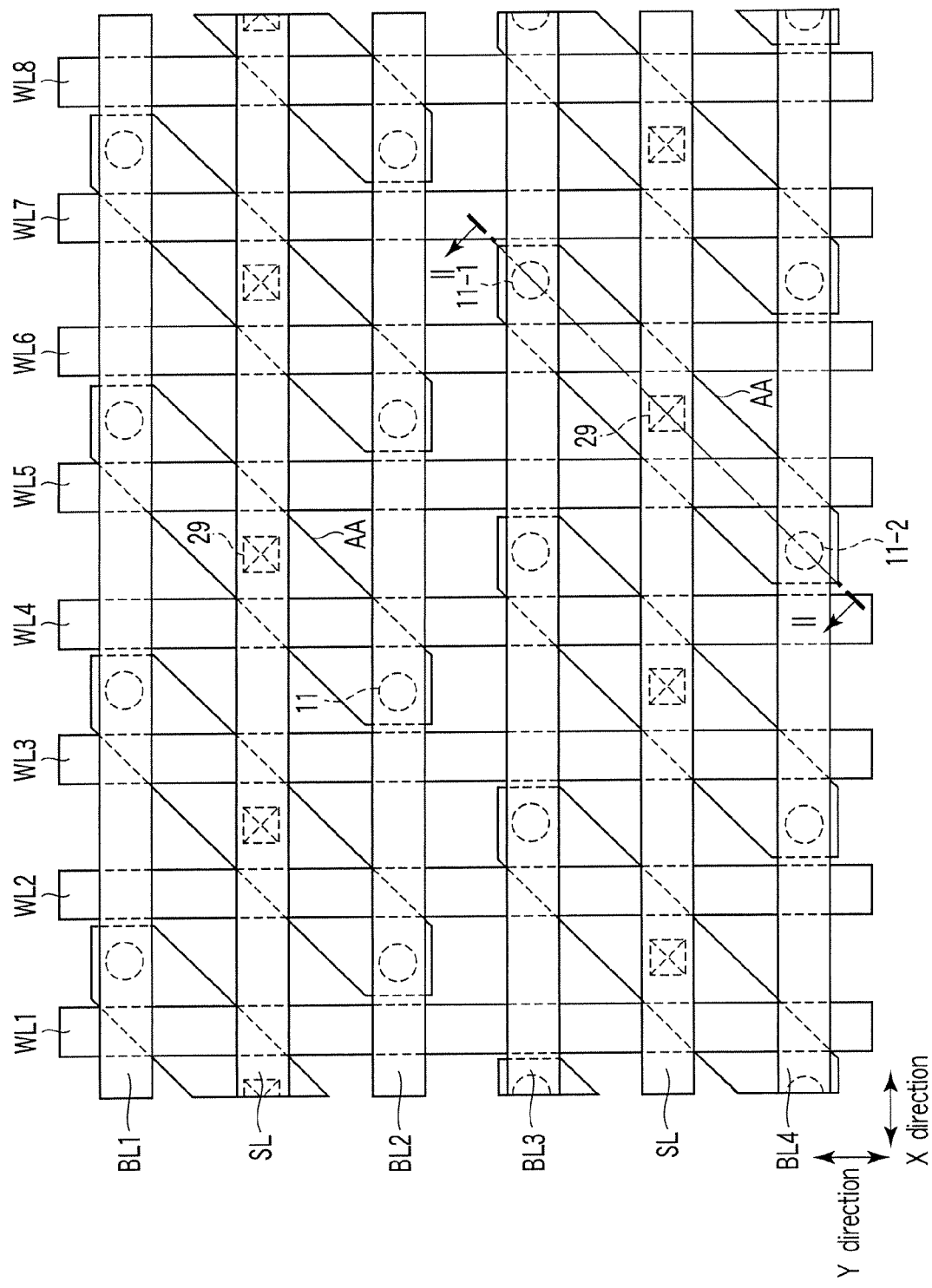
FIG. 1 is a plan view illustrating the arrangement of a semiconductor memory device (MRAM) according to the first embodiment of the present invention.

Embodiments of the present invention will be explained below with reference to the accompanying drawings. Note that in the following explanation, the same reference numerals denote elements having the same functions and arrangements, and a repetitive explanation will be made only when necessary.

First Embodiment

FIG. 1 is a plan view illustrating the arrangement of a semiconductor memory device according to the first embodiment of the present invention. FIG. 2 is a sectional view of the semiconductor memory device taken along a line II-II in FIG. 1. Note that in FIG. 2, interlayer dielectric layers (hatching) formed between a substrate and wiring layers are omitted in order to facilitate understanding of the arrangement. This similarly applies to other sectional views.

This embodiment uses a magnetoresistive element (MTJ element) 11 as a memory element 11 for storing data. That is, the semiconductor memory shown in FIG. 1 is an MRAM.

Referring to FIG. 2, a p-type substrate 21 is, e.g., a p-type semiconductor substrate, a semiconductor substrate having a p-type well, or a silicon-on-insulator (SOI) substrate having a p-type semiconductor layer. The semiconductor substrate 21 is made of silicon (Si) or the like. The semiconductor substrate 21 has element isolation insulating layers 22 in the surface region. Those portions of the surface region of the semiconductor substrate 21 in which no element isolation insulating layers 22 are formed are element regions (active areas) AA for forming elements. The element isolation insulating layer 22 is formed by, e.g., shallow trench isolation (STI). The STI 22 is made of a silicon oxide film or the like.

Two selection transistors 12 are formed in each active area AA. More specifically, a source region 25 and drain regions 26 are formed in the active area AA. Each of the source region 25 and drain regions 26 is an n$^+$-type diffusion region formed by heavily doping an n$^+$-type impurity (e.g., phosphorus [P] or arsenic [As]) into the active area AA.

Between the source region 25 and drain regions 26, gate electrodes 23 are formed on gate insulating films 24 on the active area AA (i.e., on a channel region). The gate electrode 23 is a word line WL shown in FIG. 1. The gate insulating film 24 is made of, e.g., a silicon oxide film. The gate electrode 23 is made of, e.g., polysilicon.

MTJ elements 11 are formed on contact layers 27 on the drain regions 26. The planar shape of the MTJ element 11 is not particularly limited. Examples are a circle, square, and ellipse. This embodiment shows a square MTJ element 11 as an example. Bit lines BL running in the X direction are formed on contact layers 28 on the MTJ elements 11. A source line SL running in the X direction is formed on a contact layer 29 on the source region 25.

The two selection transistors 12 formed in the same active area AA share the source region 25. The two selection transistors 12 are connected to the same source line SL via the source region 25.

Figure 3:
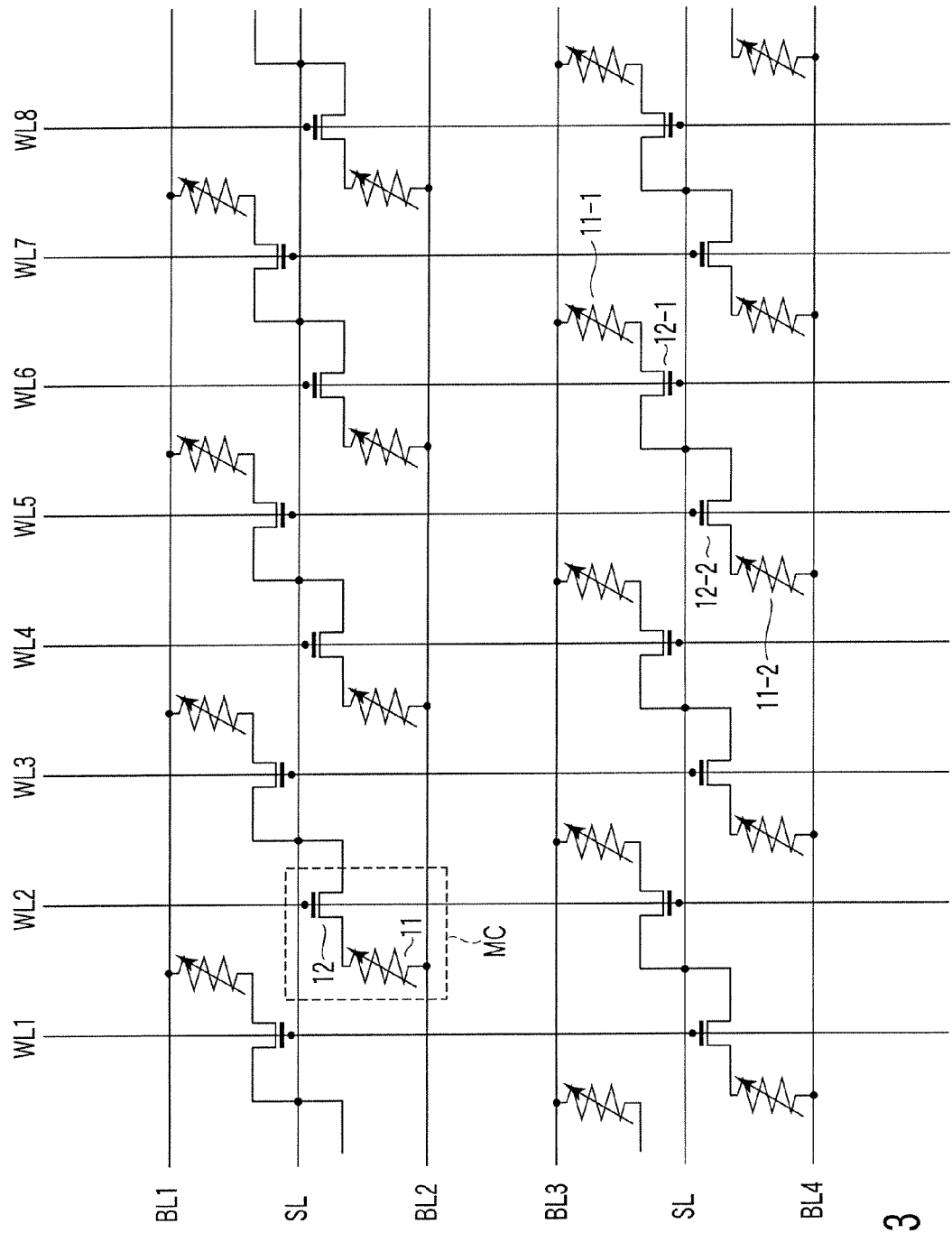
FIG. 3 is a circuit diagram of the MRAM shown in FIG. 1.

FIG. 3 is a circuit diagram of the MRAM shown in FIG. 1. This MRAM comprises bit lines BL (in this embodiment, bit lines BL1 to BL4) running in the X direction, word lines WL (in this embodiment, word lines WL1 to WL8) running in the Y direction (perpendicular to the X direction), and source lines SL running in the X direction. The source lines SL are electrically connected.

Memory cells MC are arranged at the intersections of the bit lines BL and word lines WL. Each memory cell MC comprises the MTJ element 11 and selection transistor 12. One terminal of the MTJ element 11 is connected to the bit line BL. The other terminal of the MTJ element 11 is connected to the drain terminal of the selection transistor 12. The source terminal of the selection transistor 12 is connected to the source line SL. The gate terminal of the selection transistor 12 is connected to the word line WL. Memory cells connected to the bit line BL1 and memory cells connected to the bit line BL2 are connected to the same source line SL.

The memory cells MC are selected by the word lines WL and bit lines BL. Also, data is written to and read from the memory cells MC by applying a predetermined voltage to the bit lines BL and source lines SL by a power supply circuit (not shown). More specifically, a fixed voltage is applied to the source lines SL. On the other hand, different voltages corresponding to data to be written are applied to the bit lines BL so that bidirectional write currents flow through the MTJ elements in accordance with the data.

An example of the arrangement of the MTJ element 11 will be explained below. FIG. 4 is a sectional view illustrating the arrangement of the MTJ element 11. Referring to FIG. 4, arrows drawn in magnetic layers indicate the magnetization directions.

The MTJ element 11 has a stacked structure including a fixed layer 32 (to be also referred to as a pinned layer hereinafter), a recording layer 34 (to be also referred to as a free layer hereinafter), and a nonmagnetic layer 33 sandwiched between the pinned layer 32 and free layer 34. A lower electrode 31 and upper electrode 35 are respectively formed on the bottom surface and upper surface of this stacked structure. The lower electrode 31 and upper electrode 35 are made of, e.g., tantalum (Ta).

The pinned layer 32 is made of a ferromagnetic material, and has a fixed magnetization (or spin) direction. The free layer 34 is made of a ferromagnetic material, and has a magnetization direction that changes (reverses). The MTJ element 11 is a magnetoresistive effect element which is written to by reversing the magnetization direction in the free layer 34 by supplying currents in two directions perpendicular to the film surface (or the stacked layer surface). That is, the MTJ element 11 is a magnetoresistive effect element for use in the so-called spin injection write method in which the bidirectional currents transfer the spin momentum in the pinned layer 32 from the pinned layer 32 to the free layer 34, and this spin momentum is transferred to the spin in the free layer 34 in accordance with the conservation law of spin momentum, thereby reversing the magnetization direction in the free layer 34.

The film thickness of the pinned layer 32 is larger than that of the free layer 34 in order to fix the magnetization direction. It is also possible to add an antiferromagnetic layer to the ferromagnetic layer, and fix the magnetization direction by exchange coupling between the ferromagnetic layer and antiferromagnetic layer. Consequently, any current has almost no influence on the magnetization direction in the pinned layer 32.

As the ferromagnetic layer, it is possible to use a metal such as Fe, Co, or Ni, or an alloy of any of these metals. As the antiferromagnetic layer, it is possible to use, e.g., Fe—Mn, Pt—Mn, Pt—Cr—Mn, Ni—Mn, Ir—Mn, NiO, or $Fe_2O_3$. The nonmagnetic layer 33 can be a metal or insulator. The MTJ element 11 exhibits the tunneling magnetoresistive (TMR) effect when the nonmagnetic layer 33 is an insulator, and the giant magnetoresistive (GMR) effect when the nonmagnetic layer 33 is a metal. Examples of the insulator are MgO and AlO (e.g., $Al_2O_3$), and examples of the metal are Cu and Pt.

A binary digit is written to the MTJ element constructed as above as follows. First, currents are supplied to the MTJ element 11 in two directions perpendicular to the film surface (or the stacked layer surface).

When electrons are supplied from the pinned layer 32 (i.e., when electrons flowing from the pinned layer 32 to the free layer 34 are supplied), electrons spin-polarized in the same direction as the magnetization direction in the pinned layer 32 are injected into the free layer 34. In this case, the magnetization direction in the free layer 34 is matched with that in the pinned layer 32. As a consequence, the magnetization directions in the pinned layer 32 and free layer 34 form a parallel arrangement. In this parallel arrangement, the resistance of the MTJ element 11 is a minimum. This case is defined as binary 0.

On the other hand, when electrons are supplied from the free layer 34 (i.e., when electrons flowing from the free layer 34 to the pinned layer 32 are supplied), these electrons are reflected by the pinned layer 32, so electrons spin-polarized in the direction opposite to the magnetization direction in the pinned layer 32 are injected into the free layer 34. In this case, the magnetization direction in the free layer 34 is matched with the direction opposite to the magnetization direction in the pinned layer 32. Consequently, the magnetization directions in the pinned layer 32 and free layer 34 form an antiparallel arrangement. In this antiparallel arrangement, the resistance of the MTJ element 11 is a maximum. This case is defined as binary 1. Note that "parallel" means that the spin directions in two magnetic layers are the same, and "antiparallel" means that the spin directions in two magnetic layers are reversely parallel (parallel and opposite).

A binary digit is read by supplying a read current to the MTJ element 11. This read current is made smaller than the write current. As described above, the MTJ element 11 changes its resistance as a result of the magnetoresistive effect in accordance with whether the magnetization directions in the pinned layer 32 and free layer 34 form the parallel arrangement or antiparallel arrangement. This change in resistance is detected on the basis of the read current.

As shown in FIG. 1, each active area AA is formed to extend obliquely to the X or Y direction. Also, the planar shape of each active area AA is, e.g., a hexagon. The planar shape of the active area AA is not particularly limited as long as the active area AA extends obliquely to the X or Y direction. That is, the planar shape may also be a square or have round end portions.

An MTJ element 11-1 is formed on the contact layer 27 on one end (i.e., on the drain region 26 of a selection transistor 12-1) of the active area AA. The bit line BL3 running in the X direction is formed on the contact layer 28 on the MTJ element 11-1.

An MTJ element 11-2 is formed on the contact layer 27 on the other end (i.e., on the drain region 26 of a selection transistor 12-2) of the active area AA. The bit line BL4 running in the X direction is formed on the contact layer 28 on the MTJ element 11-2.

The source line SL is formed between the two bit lines BL3 and BL4. Two selection transistors obliquely adjacent to each other on the two sides of the source line SL are connected to the same source line SL. The bit lines BL and source lines SL are formed in an wiring layer on the same level.

In a plan view, the active area AA is formed to intersect (or formed across) three lines (the bit line BL3, source line SL, and bit line BL4). That is, the length in the Y direction of the active area AA is made almost equal to or greater than the length corresponding to the three lines in the Y direction.

The active areas AA adjacent to each other in the X direction are translationally symmetrical. Note that "translationally symmetrical" means that when a certain active area AA is moved parallel at a predetermined interval in one direction, the active area AA overlaps another active area AA. Note also that the active areas AA obliquely adjacent to each other are translationally symmetrical.

In this embodiment as described in detail above, the area of the MRAM can be reduced by using the layout shown in FIG. 1. It is also possible to reduce one wiring layer (one level layer) of the MRAM because the bit lines BL and source lines SL can be formed in a wiring layer on the same level. Since this decreases the number of process steps, the fabrication cost can be reduced. Micropatterning in the longitudinal direction of the MRAM is also possible.

In addition, since the active area AA is formed to obliquely extend, the source line SL and the source region 25 of the selection transistor 12 can be connected via the contact layer 29. This obviates the need for an extracting line used to connect the source line SL to the source region 25. As a consequence, the fabrication cost can be reduced.

It is also possible to reduce the area of the MRAM and increase the distance between adjacent active areas AA at the same time. Since this makes it possible to arrange the MTJ elements 11 and selection transistors 12 not too close to each other but at predetermined intervals, deterioration of the characteristics of these elements can be prevented.

Figure 5:
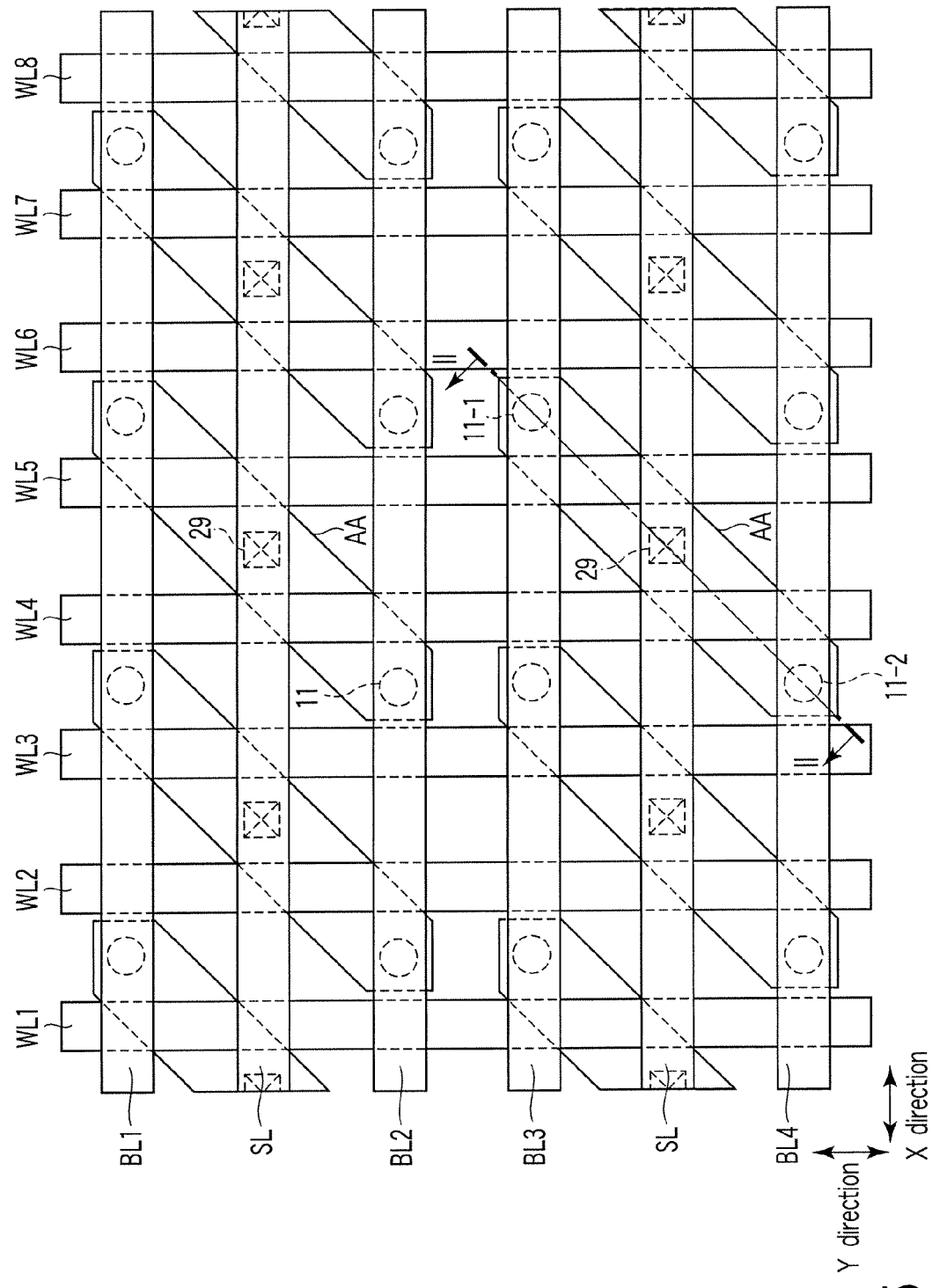
FIG. 5 is a plan view illustrating another embodiment of the MRAM.
Figure 6:
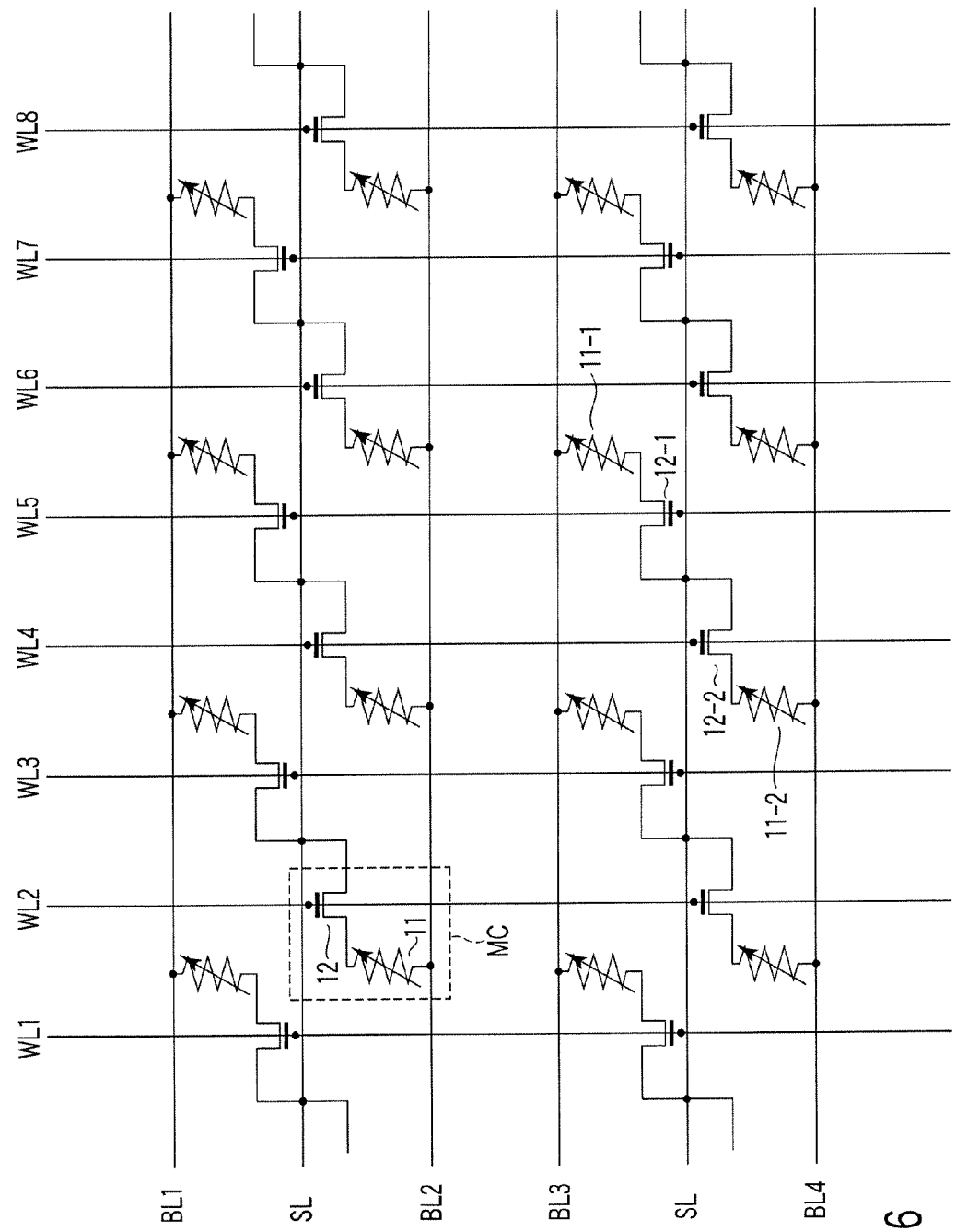
FIG. 6 is a circuit diagram of the MRAM shown in FIG. 5.

FIG. 5 is a plan view illustrating another embodiment of the MRAM. FIG. 6 is a circuit diagram of the MRAM shown in FIG. 5. Note that a sectional view taken along a line II-II in FIG. 5 is the same as FIG. 2.

Referring to FIG. 5, each active area AA is formed to extend obliquely to the X or Y direction. Also, the active areas AA adjacent to each other in the X direction are translationally symmetrical. Likewise, the active areas AA adjacent to each other in the Y direction are translationally symmetrical.

Even when the MRAM is constructed as above, the bit lines BL and source lines SL can be formed in the same wiring layer. It is also possible to connect the source line SL and a source region 25 of a selection transistor 12 via a contact layer 29.

Note that this embodiment is explained by taking the case that the MTJ element 11 is used as the memory element 11 as an example, but another type of memory element 11, e.g., a phase-change element 11 can also be used. That is, a phase-change random access memory (PRAM) can also be used as a semiconductor memory.

Figure 7:
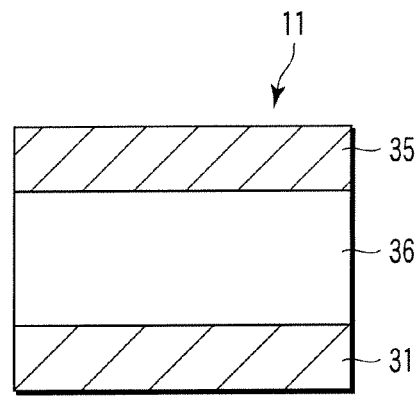
FIG. 7 is a sectional view illustrating the arrangement of a phase-change element 11.

The phase-change memory 11 has a phase-change film 36 as a recording layer. FIG. 7 is a sectional view illustrating the arrangement of the phase-change element 11. The phase-change film 36 is formed between a lower electrode 31 and upper electrode 35.

The phase-change film 36 changes its phase from the crystalline state to the amorphous state, or from the amorphous state to the crystalline state, in accordance with heat generated when a current flows from the upper electrode 35 to the lower electrode 31. The phase-change film 36 decreases in resistance in the crystalline (low-resistance) state, and increases in resistance in the amorphous (high-resistance) state.

Examples of the material of the phase-change film 36 are chalcogen compounds such as Ge—Sb—Te, In—Sb—Te, Ag—In—Sb—Te, and Ge—Sn—Te. These materials are desirable to ensure high-speed switching, repetitive write stability, and high reliability.

The operation of writing to a memory cell MC comprising the phase-change element 11 and a selection transistor 12 will be explained below. First, a pulsed current is supplied to the phase-change film 36. The current pulses heat the phase-change film 36. The magnitude of the pulses is set such that the temperature of the phase-change film 36 becomes greater than or equal to a crystallization temperature threshold TH. Note that the crystallization temperature threshold TH is the temperature at which the crystalline state changes to the amorphous state. The temperature of the phase-change film 36 heated by the current pulses falls rapidly after that. In this case, the phase-change film 36 changes to the amorphous (high-temperature) state.

A small current is supplied to the phase-change film 36 subsequent to the pulsed current. In this case, the temperature of the phase-change film 36 heated by the current pulses falls slowly because of the small current. Consequently, the phase-change film 36 changes to the crystalline (low-resistance) state.

That is, the phase-change film 36 is heated by the current to a temperature greater than or equal to the crystallization temperature threshold TH. In accordance with the rising condition of the applied current pulses, the phase-change film 36 changes to the crystalline (low-resistance) state if the temperature drop near the crystallization temperature threshold TH is small, and maintains the amorphous (high-resistance) state if the temperature drop near the crystallization temperature threshold TH is large.

A binary digit can be written to the memory cell MC by defining the case that the phase-change film 36 is in the amorphous (high-resistance) state as binary 0, and the case that the phase-change film 36 is in the crystalline (low-resistance) state as binary 1. Note that the current supplied to the phase-change film 36 is set by controlling a bit line BL and source line SL. A binary digit is read in the same manner as in the MTJ element described earlier.

As described above, this embodiment can also be applied to the PRAM using the phase-change element 11 as the memory element 11. This similarly applies to the following embodiments.

This embodiment is further applicable to a resistance-change-type nonvolatile memory (ReRAM) using a resistance-change element as the memory element 11.

A resistance-change element 11 comprises a lower electrode 31, an upper electrode 35, and a resistance-change layer 36 sandwiched between them. The resistance-change layer 36 is made of a perovskite-based oxide film or binary transition metal oxide film. Examples of the perovskite-based oxide film are $Pr_{0.7}Ca_{0.3}MnO_3$, $SrZrO_3/SrTiO_3$, and $Pb(Zr, Ti)O_3/Zn_{0.4}Cd_{0.6}S$. Examples of the binary transition metal oxide film are NiO, TiN, $TiO_2$, $HfO_2$, and $ZrO_2$.

The resistance-change layer 36 changes its resistance in response to the application of a voltage pulse. That is, the resistance-change layer 36 has a high-resistance (reset) state and a low-resistance (set) state, and changes to either state in response to the application of a voltage pulse.

That is, assuming that a voltage which changes the resistance-change layer 36 from the high-resistance (reset) state to the low-resistance (set) state is a set voltage Vset and a voltage which changes the resistance-change layer 36 from the low-resistance (set) state to the high-resistance (reset) state is a reset voltage Vreset, the set voltage Vset is set to a positive bias that applies a positive voltage to the upper electrode 35 with respect to the lower electrode 31, and the reset voltage Vreset is set to a negative bias that applies a negative voltage to the upper electrode 35 with respect to the lower electrode 31. A binary digit can be stored in the resistance-change element 11 by making the low-resistance and high-resistance states correspond to binary 0 and binary 1, respectively.

A binary digit can be read by supplying a sufficiently low read voltage about 1/1000 to 1/4 times as high as the reset voltage Vreset to the resistance-change element 11, and detecting the change in current at that time.

Second Embodiment

In the second embodiment, each active area AA is formed obliquely to a direction in which bit lines run, and a plurality of active areas AA are arranged to be translationally symmetrical in the Y direction.

Figure 9:
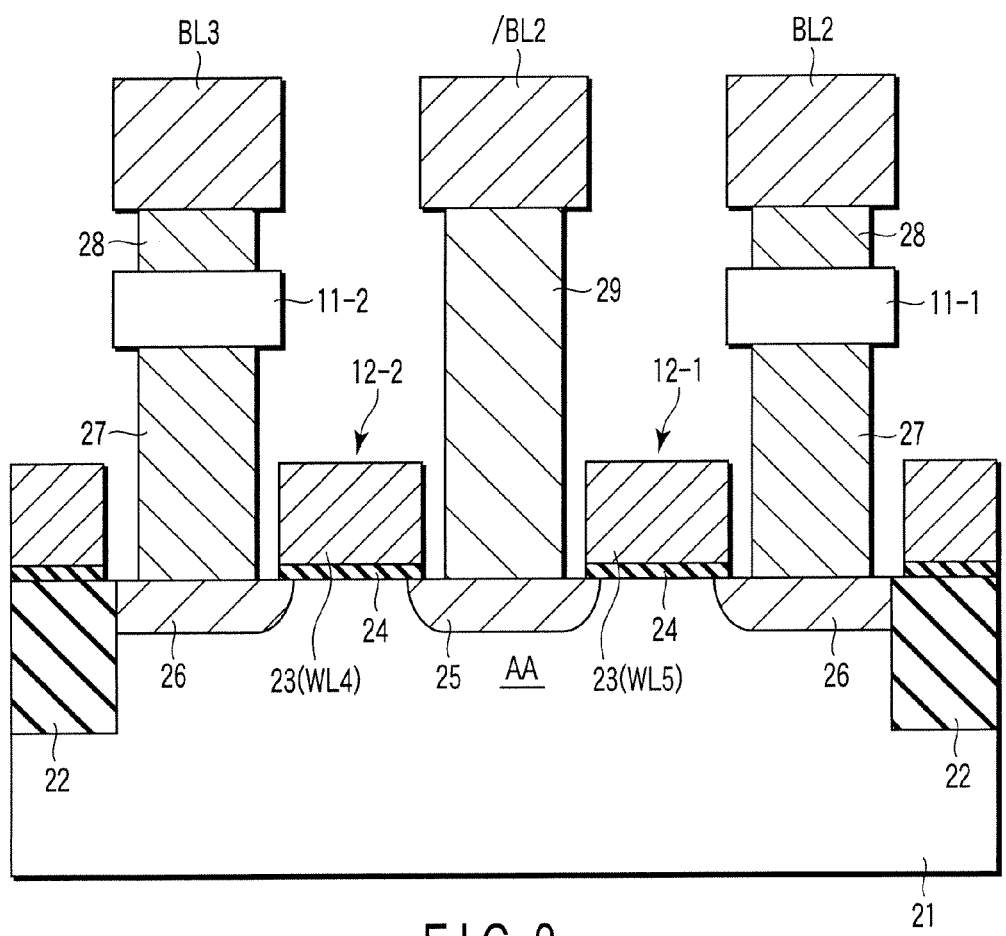
FIG. 9 is a sectional view of the MRAM taken along a line IX-IX in FIG. 8.
Figure 8:
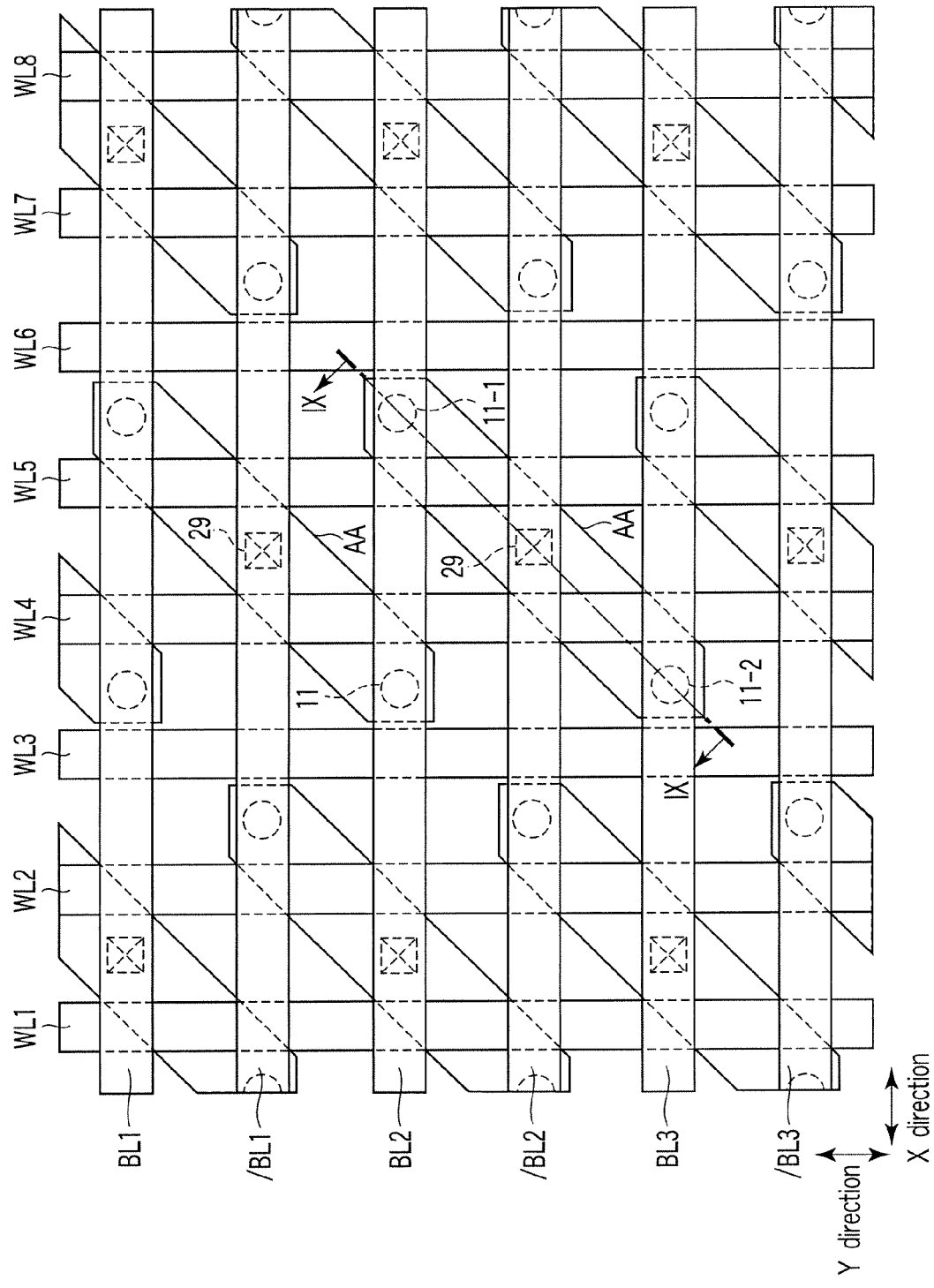
FIG. 8 is a plan view illustrating the arrangement of an MRAM according to the second embodiment of the present invention.
Figure 10:
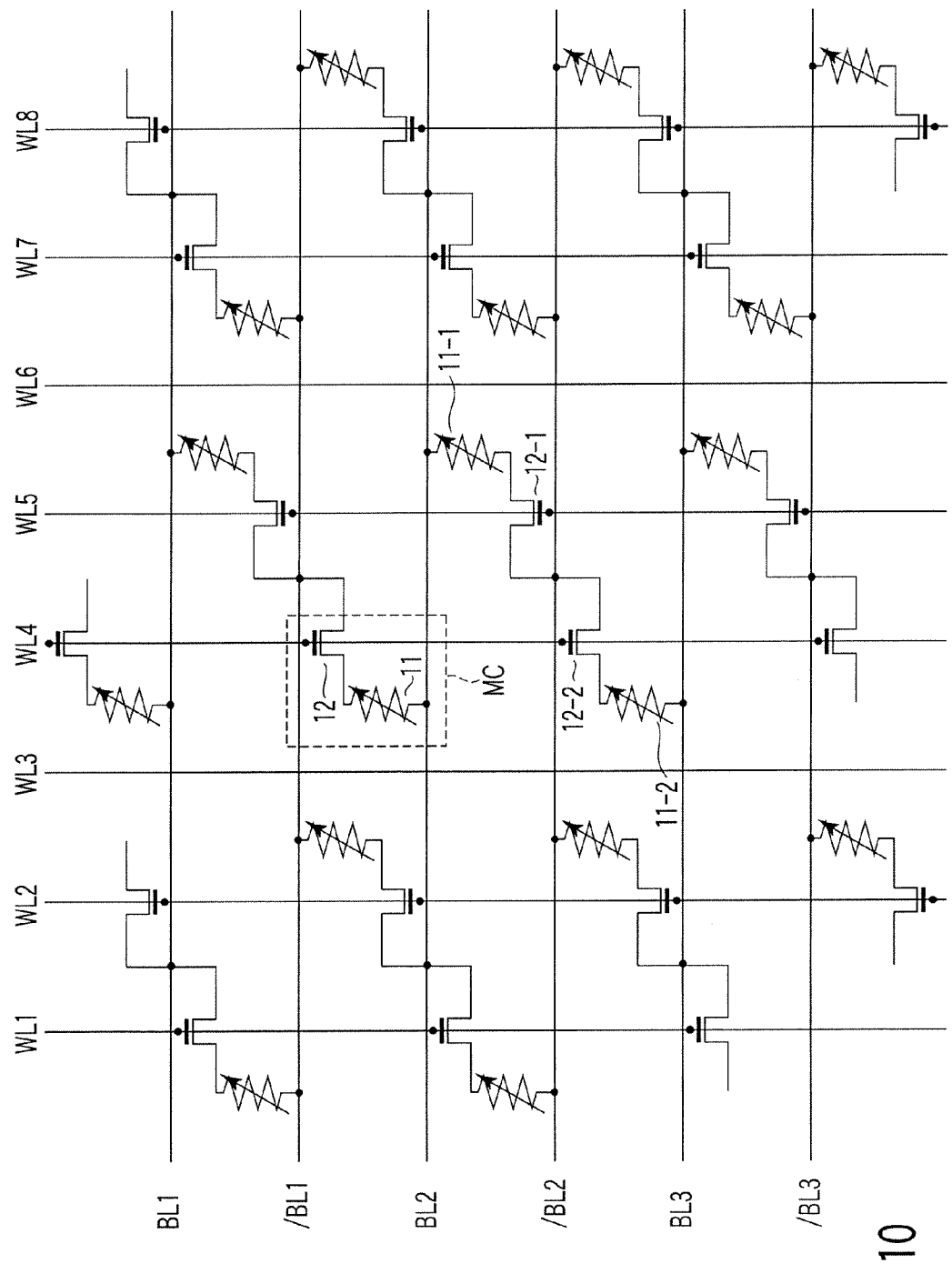
FIG. 10 is a circuit diagram of the MRAM shown in FIG. 8.

FIG. 8 is a plan view illustrating the arrangement of an MRAM according to the second embodiment. FIG. 9 is a sectional view of the MRAM taken along a line IX-IX in FIG. 8. FIG. 10 is a circuit diagram of the MRAM shown in FIG. 8.

The MRAM comprises first bit lines BL (in this embodiment, bit lines BL1 to BL3) running in the X direction, second bit lines /BL (in this embodiment, bit lines /BL1 to /BL3) running in the X direction, and word lines WL (in this embodiment, word lines WL1 to WL8) running in the Y direction. The first bit lines BL and second bit lines /BL are alternately arranged.

Each active area AA is formed to extend obliquely to the X or Y direction. Two selection transistors 12-1 and 12-2 are formed in the active area AA. The selection transistors 12-1 and 12-2 share a source region 25. The second bit line /BL2 running in the X direction is formed on a contact layer 29 on the source region 25.

An MTJ element 11-1 is formed on a contact layer 27 on one end (i.e., on a drain region 26 of the selection transistor 12-1) of the active area AA. The first bit line BL2 running in the X direction is formed on a contact layer 28 on the MTJ element 11-1.

An MTJ element 11-2 is formed on a contact layer 27 on the other end (i.e., on a drain region 26 of the selection transistor 12-2) of the active area AA. The first bit line BL3 running in the X direction is formed on a contact layer 28 on the MTJ element 11-2. The first bit lines BL and second bit lines /BL are formed in a wiring layer on the same level.

Referring to FIG. 8, active areas AA adjacent to each other in the Y direction are translationally symmetrical. Also, active areas AA obliquely adjacent to each other are translationally symmetrical. Furthermore, two active areas AA adjacent to each other in the X direction are spaced apart by one line in the Y direction.

In a plan view, each active area AA is formed to intersect three lines (the first bit line BL2, second bit line /BL2, and first bit line BL3). That is, the length in the Y direction of the active area AA is made almost equal to or greater than the length corresponding to the three lines in the Y direction.

In addition, as shown in FIG. 10, the MTJ elements 11 and the source terminals of the selection transistors 12 are connected to the first bit lines BL. Similarly, the MTJ elements 11 and the source terminals of the selection transistors 12 are connected to the second bit lines /BL. Accordingly, different voltages corresponding to write data are applied to the first bit lines BL. Likewise, different voltages corresponding to write data are applied to the second bit lines /BL.

In the MRAM constructed as above, it is possible to reduce the area of the MRAM and increase the distance between adjacent active areas AA at the same time. It is also possible to form the first bit lines BL and second bit lines /BL in a wiring layer on the same level. Furthermore, the bit line and the source region 25 of the selection transistor 12 can be connected via the contact layer 29.

Figure 11:
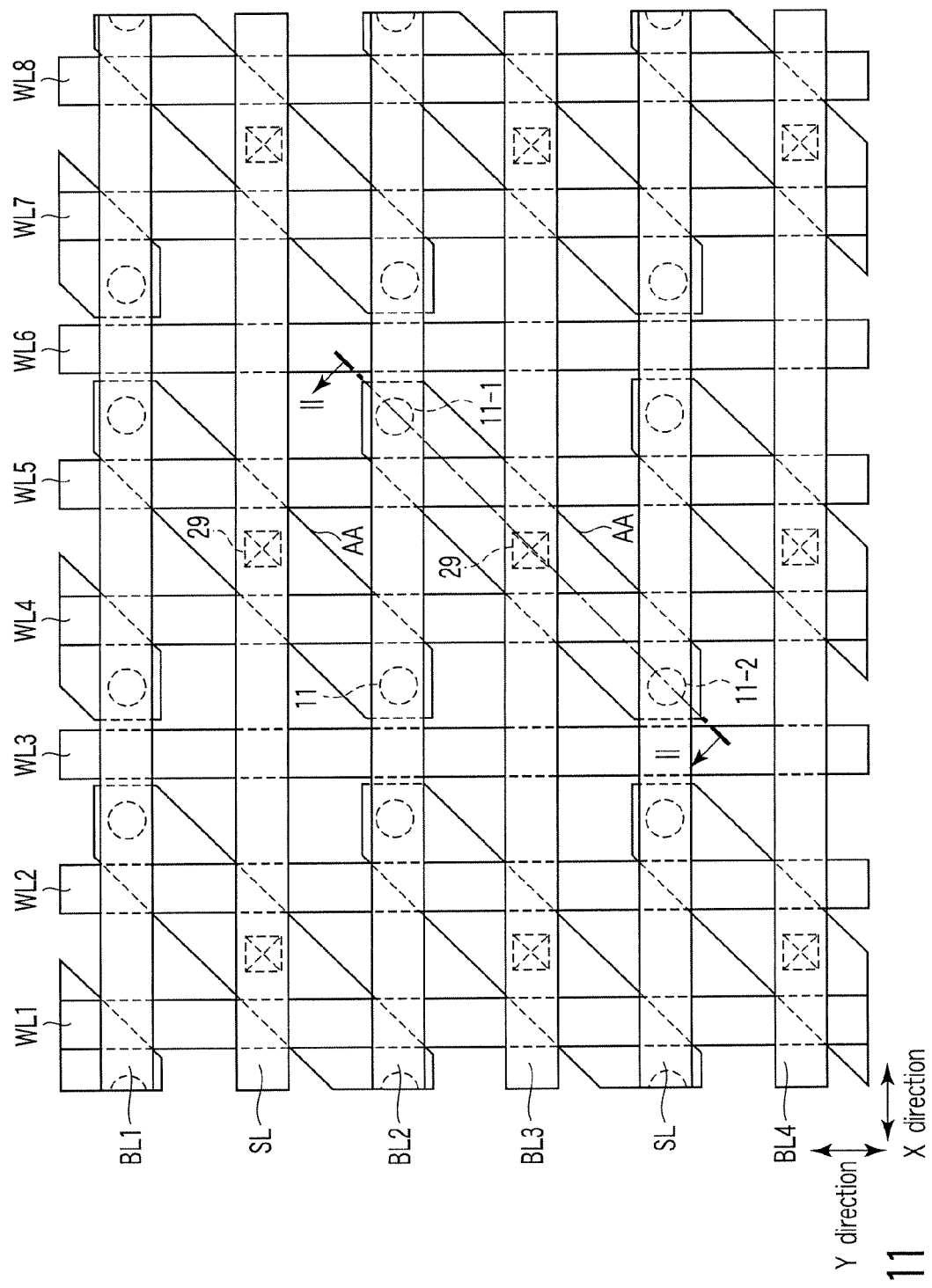
FIG. 11 is a plan view illustrating another embodiment of the MRAM.
Figure 12:
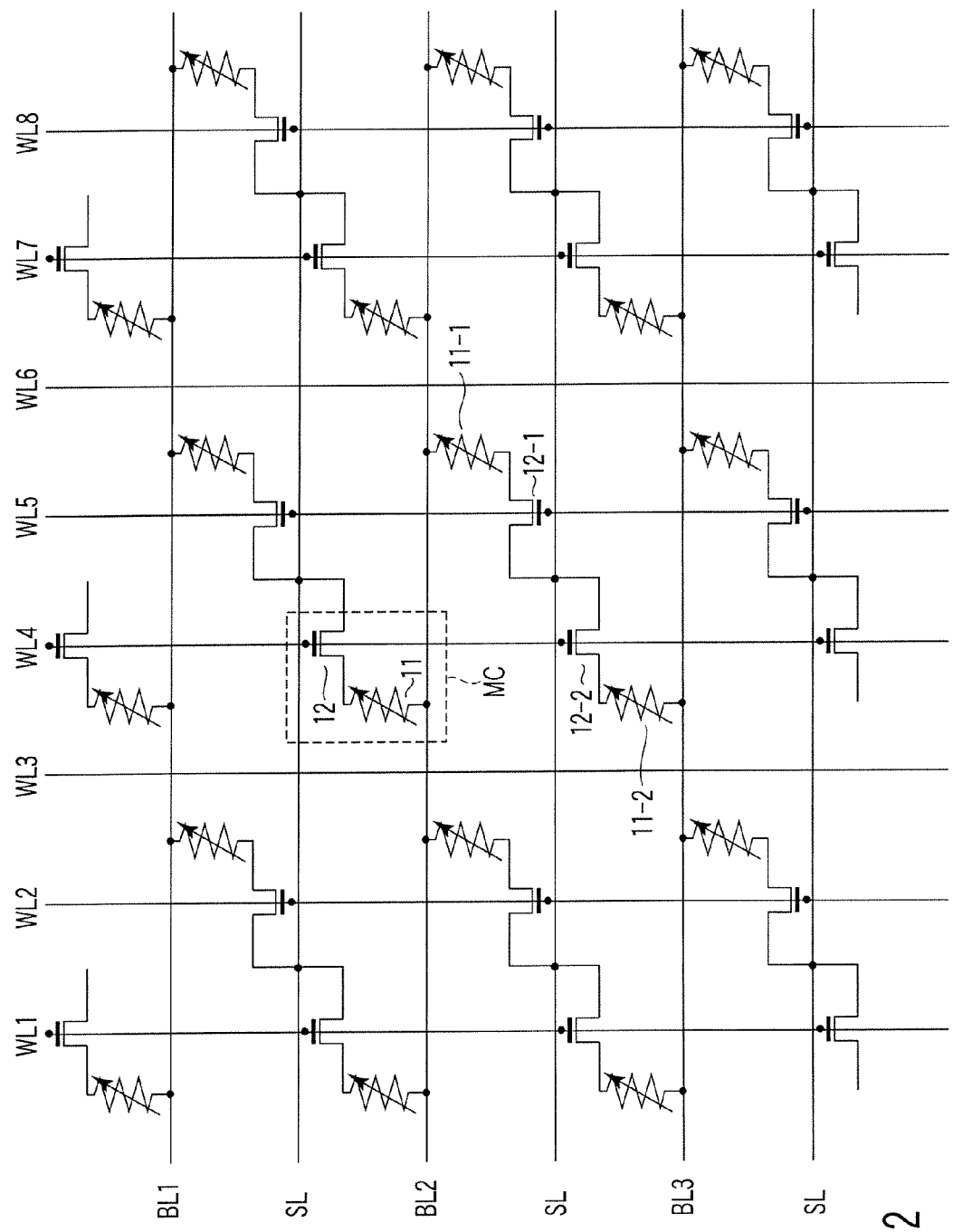
FIG. 12 is a circuit diagram of the MRAM shown in FIG. 11.

FIG. 11 is a plan view illustrating another embodiment of the MRAM. FIG. 12 is a circuit diagram of the MRAM shown in FIG. 11. Note that a sectional view taken along a line II-II shown in FIG. 11 is the same as FIG. 2.

Referring to FIG. 11, bit lines BL and source lines running in the X direction are alternately arranged. Each active area AA is formed to extend obliquely to the X or Y direction. Active areas AA adjacent to each other in the Y direction are translationally symmetrical. Active areas AA adjacent to each other in the X direction are translationally symmetrical.

Even when the MRAM is constructed as above, the bit lines BL and source lines SL can be formed in a wiring layer on the same level. It is also possible to connect the source line SL and a source region 25 of a selection transistor 12 via a contact layer 29.

Third Embodiment

In the third embodiment, each active area AA is formed obliquely to a direction in which bit lines or word lines run, and a plurality of active areas AA are arranged to be obliquely translationally symmetrical.

FIG. 13 is a plan view illustrating the arrangement of an MRAM according to the third embodiment of the present invention. FIG. 14 is a circuit diagram of the MRAM shown in FIG. 13. A sectional view taken along a line IX-IX in FIG. 13 is the same as FIG. 9.

The MRAM comprises first bit lines BL (in this embodiment, bit lines BL1 to BL3) running in the X direction, second bit lines /BL (in this embodiment, bit lines /BL1 to /BL3) running in the X direction, and word lines WL (in this embodiment, word lines WL1 to WL8) running in the Y direction. The first bit lines BL and second bit lines /BL are alternately arranged.

Each active area AA is formed to extend obliquely to the X or Y direction. Also, active areas AA adjacent to each other in a direction perpendicular to the direction in which the active areas AA extend are translationally symmetrical. Furthermore, a first active area AA1 is spaced apart by one word line in the X direction and one bit line in the Y direction from a second active area AA2 obliquely adjacent to the first active area AA1.

The area can be reduced in the MRAM constructed as above. It is also possible to form the first bit lines BL and second bit lines /BL in a wiring layer on the same level. Furthermore, the bit line and a source region 25 of a selection transistor 12 can be connected via a contact layer 29.

Figure 16:
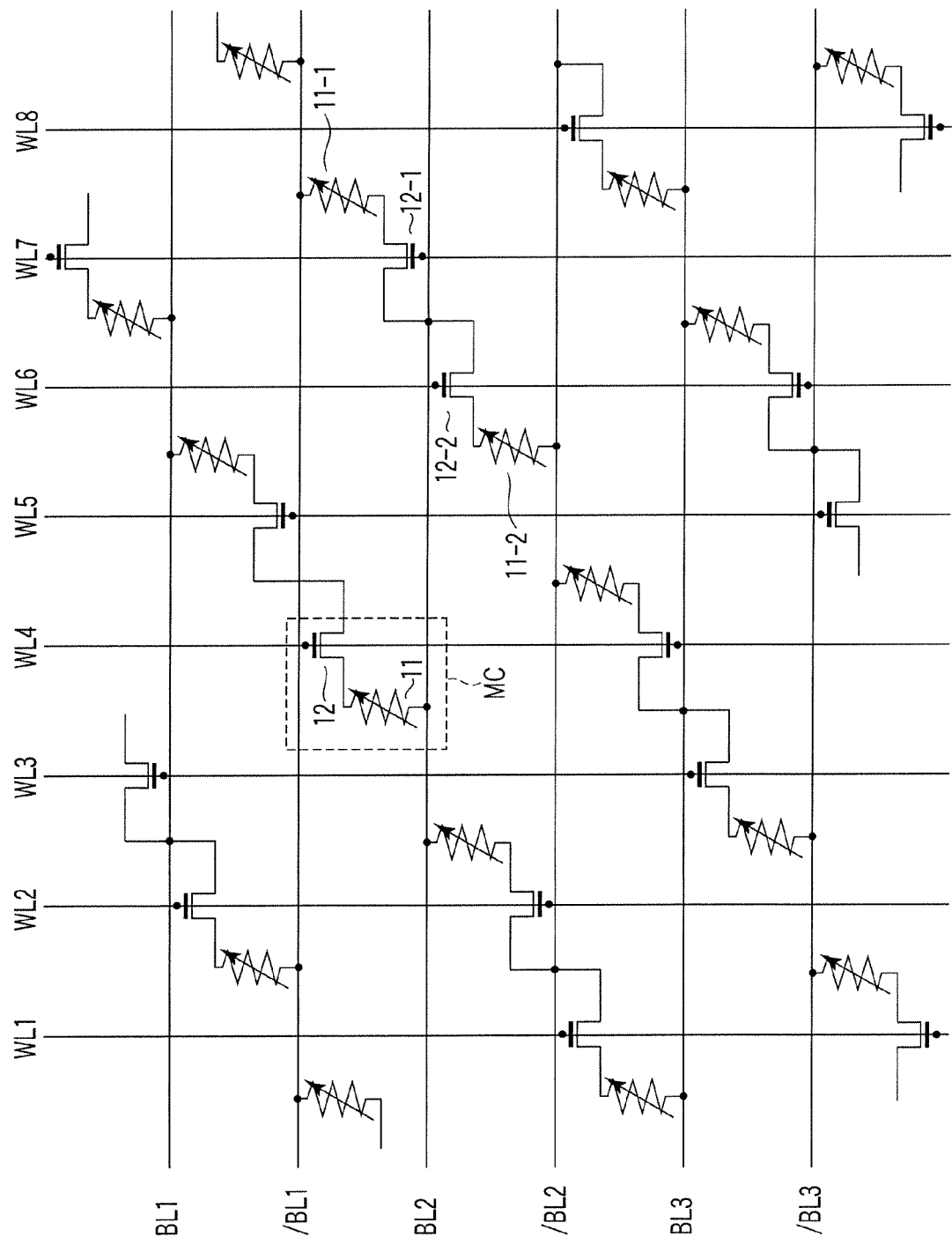
FIG. 16 is a circuit diagram of the MRAM shown in FIG. 15.

FIG. 15 is a plan view illustrating another embodiment of the MRAM. FIG. 16 is a circuit diagram of the MRAM shown in FIG. 15. Note that a sectional view taken along a line IX-IX shown in FIG. 15 is the same as FIG. 9.

Referring to FIG. 15, each active area AA is formed to extend obliquely to the X or Y direction. Active areas AA adjacent to each other in a direction perpendicular to the direction in which the active areas AA extend are translationally symmetrical. A first active area AA1 is spaced apart by two word lines in the X direction and one bit line in the Y direction from a second active area AA2 obliquely adjacent to the first active area AA1. Even when the MRAM is constructed as above, the same effects as described above can be obtained.

Figure 17:
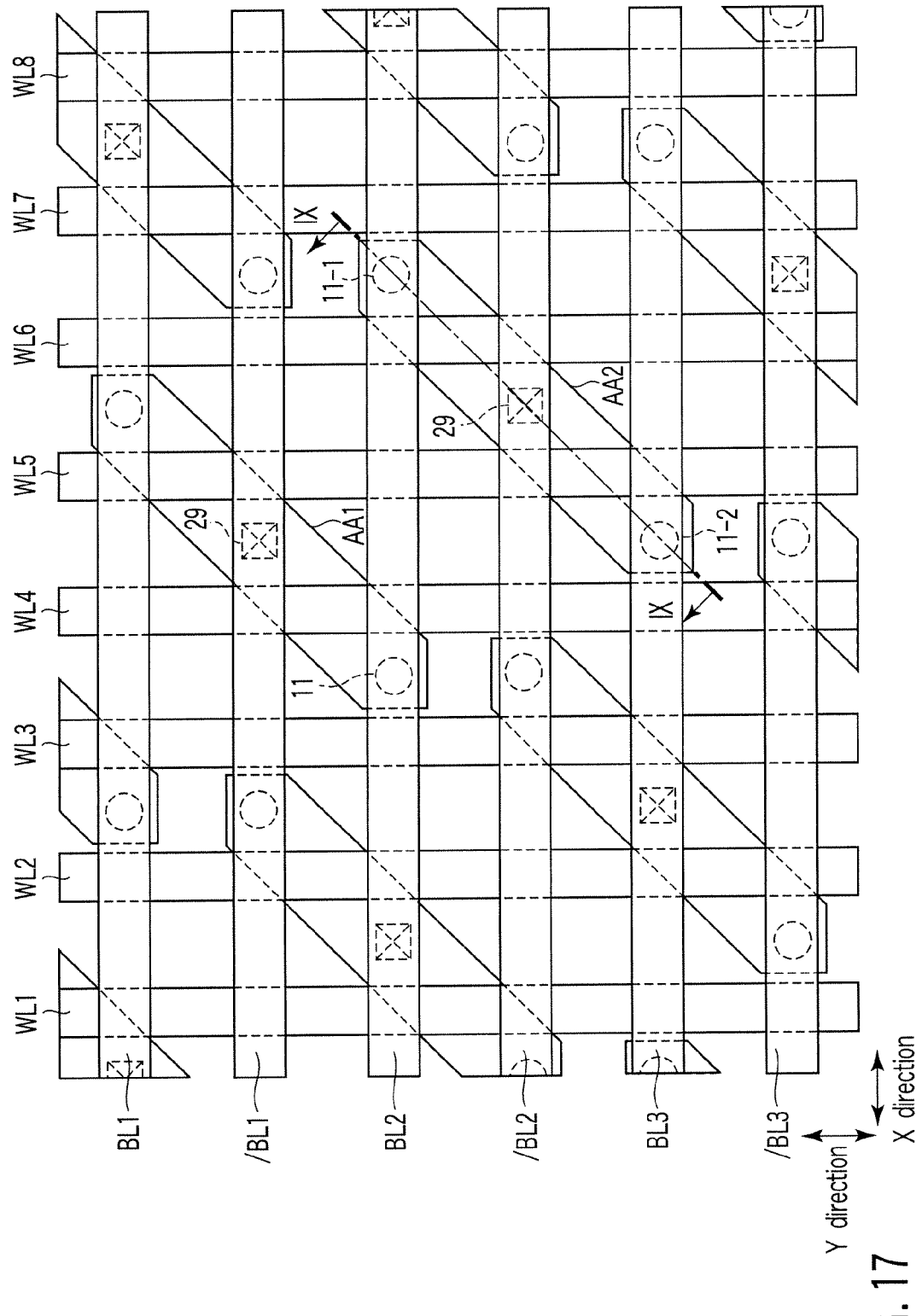
FIG. 17 is a plan view illustrating still another embodiment of the MRAM.

FIG. 17 is a plan view illustrating still another embodiment of the MRAM. FIG. 18 is a circuit diagram of the MRAM shown in FIG. 17. Note that a sectional view taken along a line IX-IX in FIG. 17 is the same as FIG. 9.

Referring to FIG. 17, each active area AA is formed to extend obliquely to the X or Y direction. Active areas AA adjacent to each other in a direction perpendicular to the direction in which the active areas AA extend are translationally symmetrical. A first active area AA1 is spaced apart by one word line in the X direction and two bit lines in the Y direction from a second active area AA2 obliquely adjacent to the first active area AA1. Even when the MRAM is constructed as above, the same effects as described above can be obtained.

Fourth Embodiment

In the fourth embodiment, each active area AA is formed obliquely to a direction in which bit lines or word lines run, and first bit lines BL and second bit lines /BL are formed in wiring layers on different levels.

Figure 20:
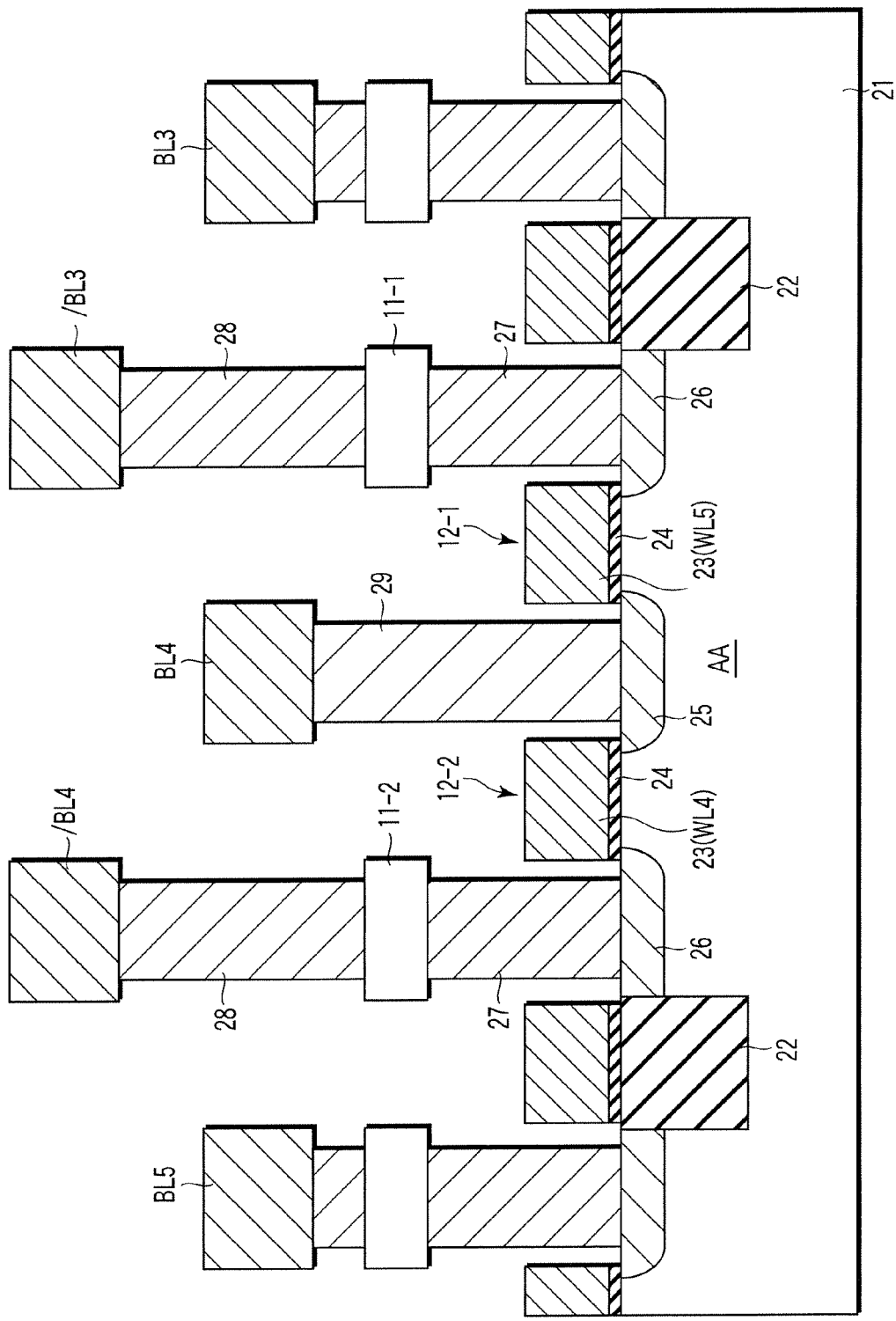
FIG. 20 is a sectional view of the MRAM taken along a line XX-XX in FIG. 19.
Figure 21:
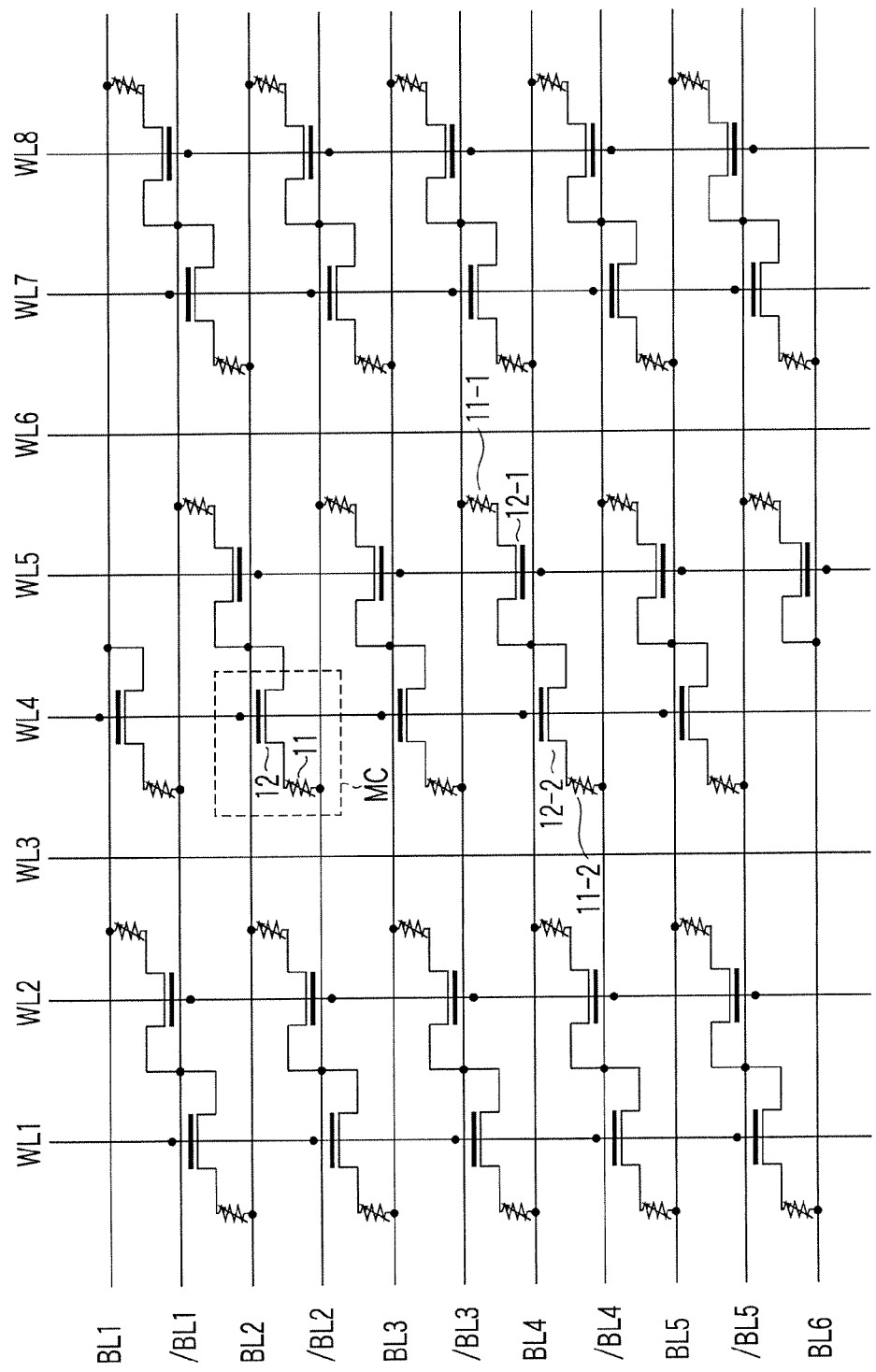
FIG. 21 is a circuit diagram of the MRAM shown in FIG. 19.

FIG. 19 is a plan view illustrating the arrangement of an MRAM according to the fourth embodiment of the present invention. FIG. 20 is a sectional view of the MRAM taken along a line XX-XX in FIG. 19. FIG. 21 is a circuit diagram of the MRAM shown in FIG. 19.

The MRAM comprises the first bit lines BL (in this embodiment, bit lines BL1 to BL6) running in the X direction, the second bit lines /BL (in this embodiment, bit lines /BL1 to /BL5) running in the X direction, and word lines WL (in this embodiment, word lines WL1 to WL8) running in the Y direction. The first bit lines BL and second bit lines /BL are alternately arranged.

Also, as shown in FIG. 20, the first bit lines BL and second bit lines /BL are formed in wiring layers on different levels. That is, the first bit lines BL are formed in a first metal layer, and the second bit lines /BL are formed in a second metal layer above the first metal layer.

Each active area AA is formed to extend obliquely to the X or Y direction. This embodiment shows the case that the end portions of each active area AA are rounded as an example.

Two selection transistors 12-1 and 12-2 are formed in the active area AA. The selection transistors 12-1 and 12-2 share a source region 25. The first bit line BL4 running in the X direction is formed on a contact layer 29 on the source region 25.

An MTJ element 11-1 is formed on a contact layer 27 on one end (i.e., on a drain region 26 of the selection transistor 12-1) of the active area AA. The second bit line /BL3 running in the X direction is formed on a contact layer 28 on the MTJ element 11-1.

An MTJ element 11-2 is formed on a contact layer 27 on the other end (i.e., on a drain region 26 of the selection transistor 12-2) of the active area AA. The second bit line /BL4 running in the X direction is formed on a contact layer 28 on the MTJ element 11-2.

In a plan view, the active area AA is formed to intersect three lines (the second bit line /BL3, first bit line BL4, and second bit line /BL4). That is, the length in the Y direction of the active area AA is made almost equal to or greater than the length corresponding to the three lines in the Y direction.

Active areas AA adjacent to each other in the Y direction are translationally symmetrical. Active areas AA obliquely adjacent to each other are translationally symmetrical. Two active areas AA adjacent to each other in the X direction are spaced apart by one line in the Y direction.

In the MRAM constructed as above, it is possible to reduce the area of the MRAM and increase the distance between the active areas AA obliquely adjacent to each other at the same time. It is also possible to connect the bit line and the source region 25 of the selection transistor 12 via the contact layer 29.

Figure 22:
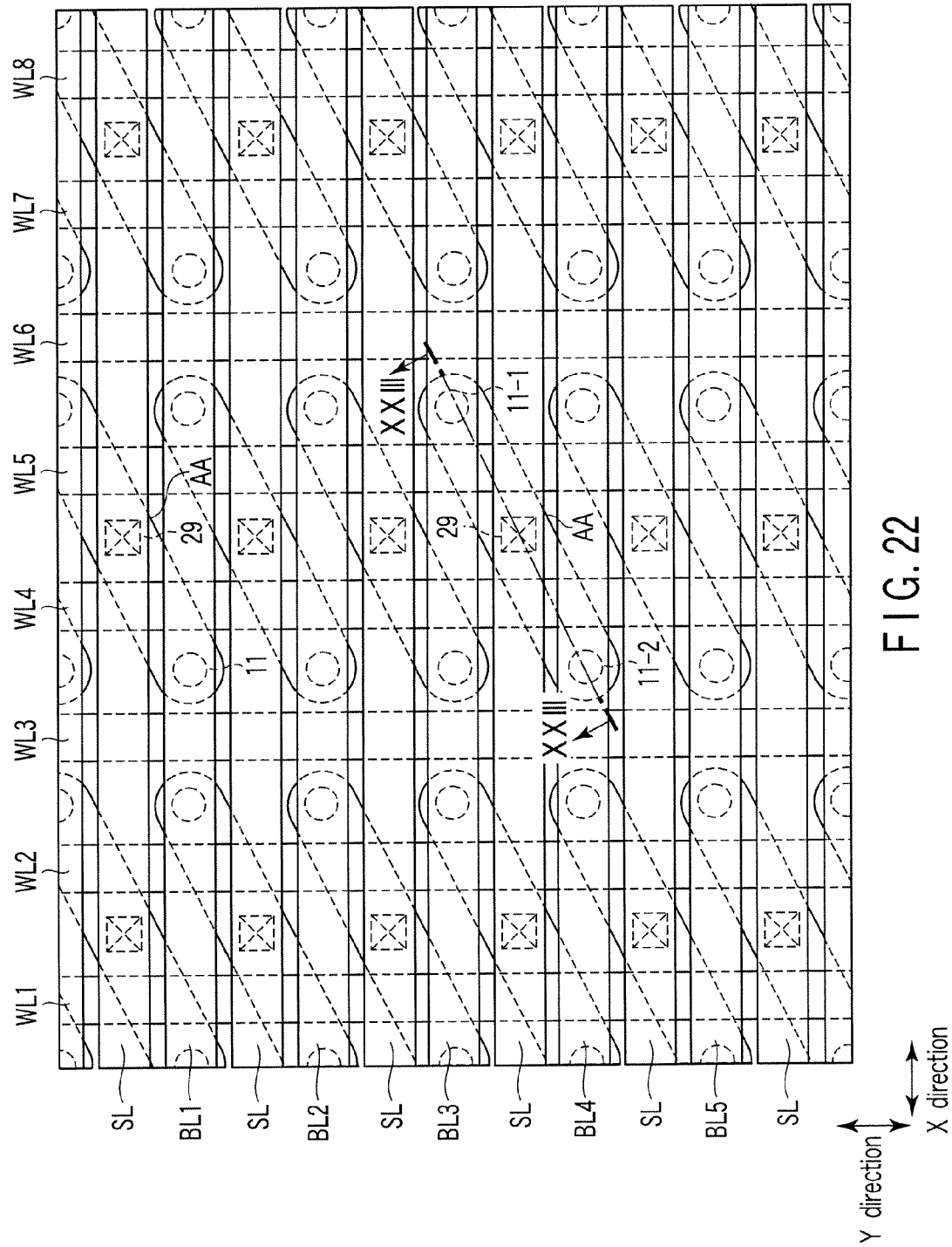
FIG. 22 is a plan view illustrating another embodiment of the MRAM.
Figure 24:
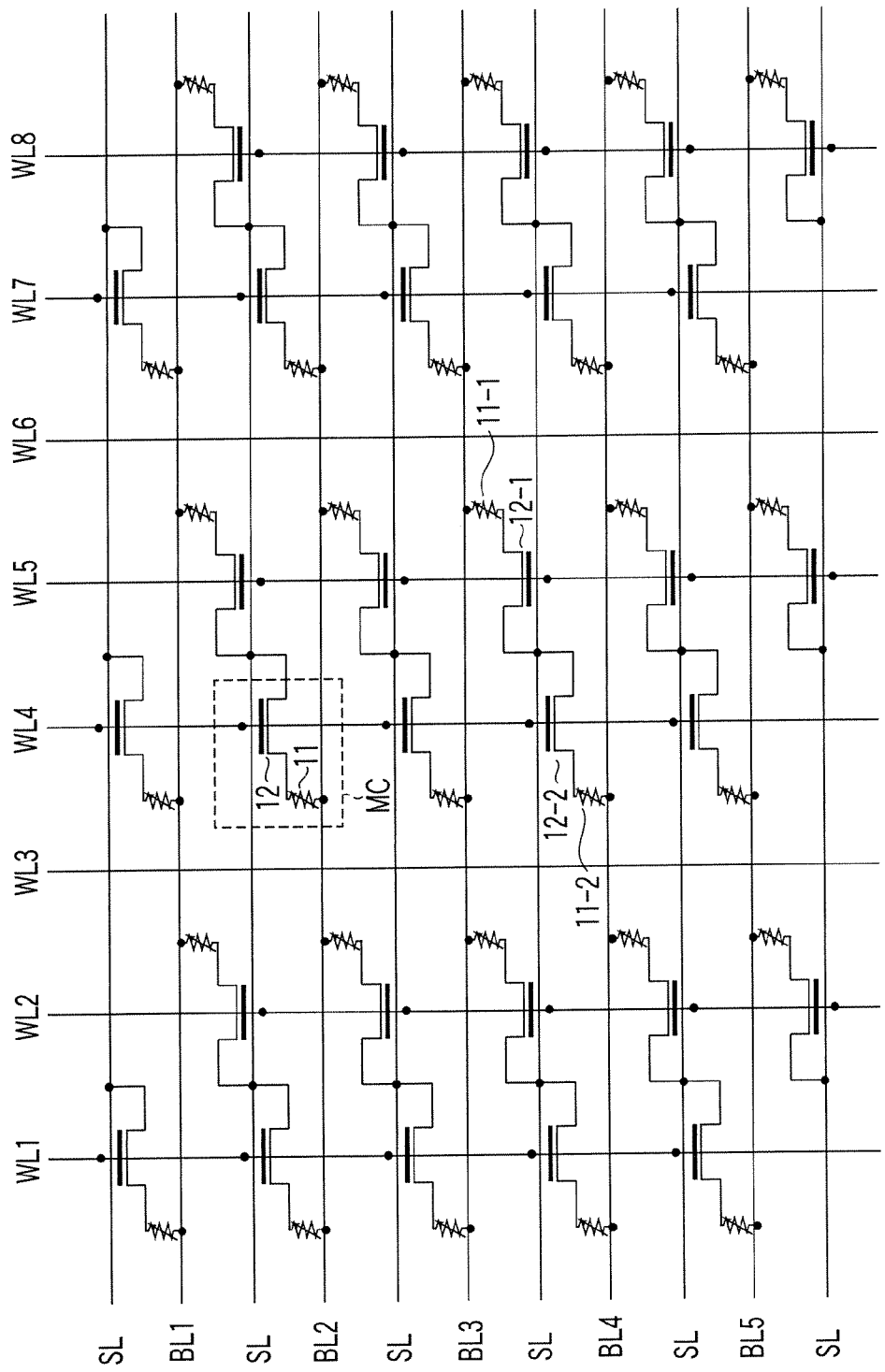
FIG. 24 is a circuit diagram of the MRAM shown in FIG. 22.

FIG. 22 is a plan view illustrating another embodiment of the MRAM. FIG. 23 is a sectional view of the MRAM taken along a line XXIII-XXIII in FIG. 22. FIG. 24 is a circuit diagram of the MRAM shown in FIG. 22.

The MRAM comprises bit lines BL (in this embodiment, bit lines BL1 to BL5) running in the X direction, word lines WL (in this embodiment, word lines WL1 to WL8) running in the Y direction, and source lines SL running in the X direction. The source lines SL are electrically connected. The bit lines BL and source lines SL are alternately arranged.

As shown in FIG. 23, the bit lines BL and source lines SL are formed in wiring layers on different levels. That is, the source lines SL are formed in a first metal layer, and the bit lines BL are formed in a second metal layer above the first metal layer.

Referring to FIG. 22, each active area AA is formed to extend obliquely to the X or Y direction. Active areas AA adjacent to each other in the Y direction are translationally symmetrical. Active areas AA adjacent to each other in the X direction are also translationally symmetrical.

It is possible to reduce the area of the MRAM constructed as above. It is also possible to connect the source line and a source region 25 of a selection transistor 12 via a contact layer 29.

Fifth Embodiment

In the fifth embodiment, each active area AA is formed obliquely to a direction in which bit lines or word lines run, and a plurality of active areas AA are arranged to be obliquely translationally symmetrical.

Figure 25:
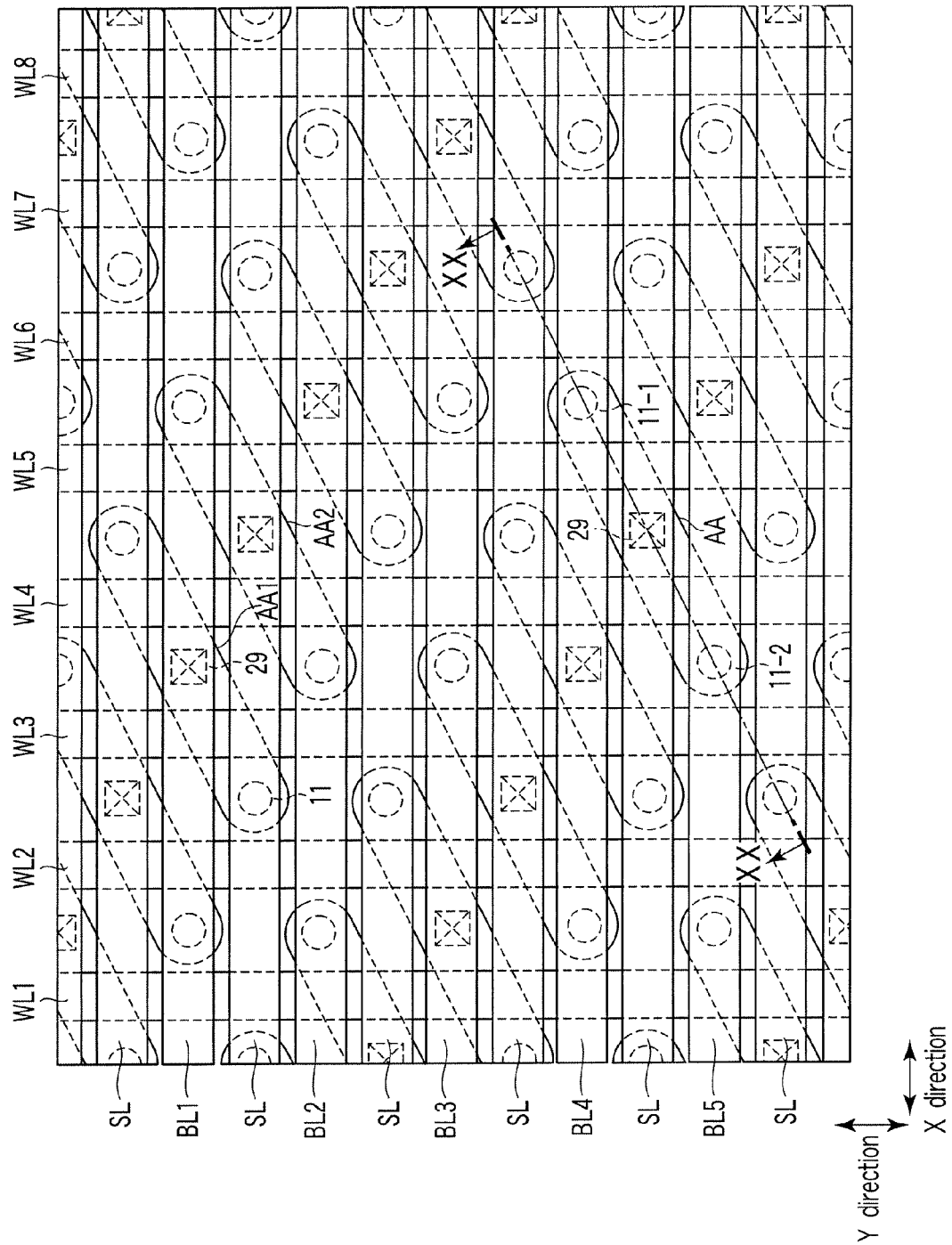
FIG. 25 is a plan view illustrating the arrangement of an MRAM according to the fifth embodiment of the present invention.
Figure 26:
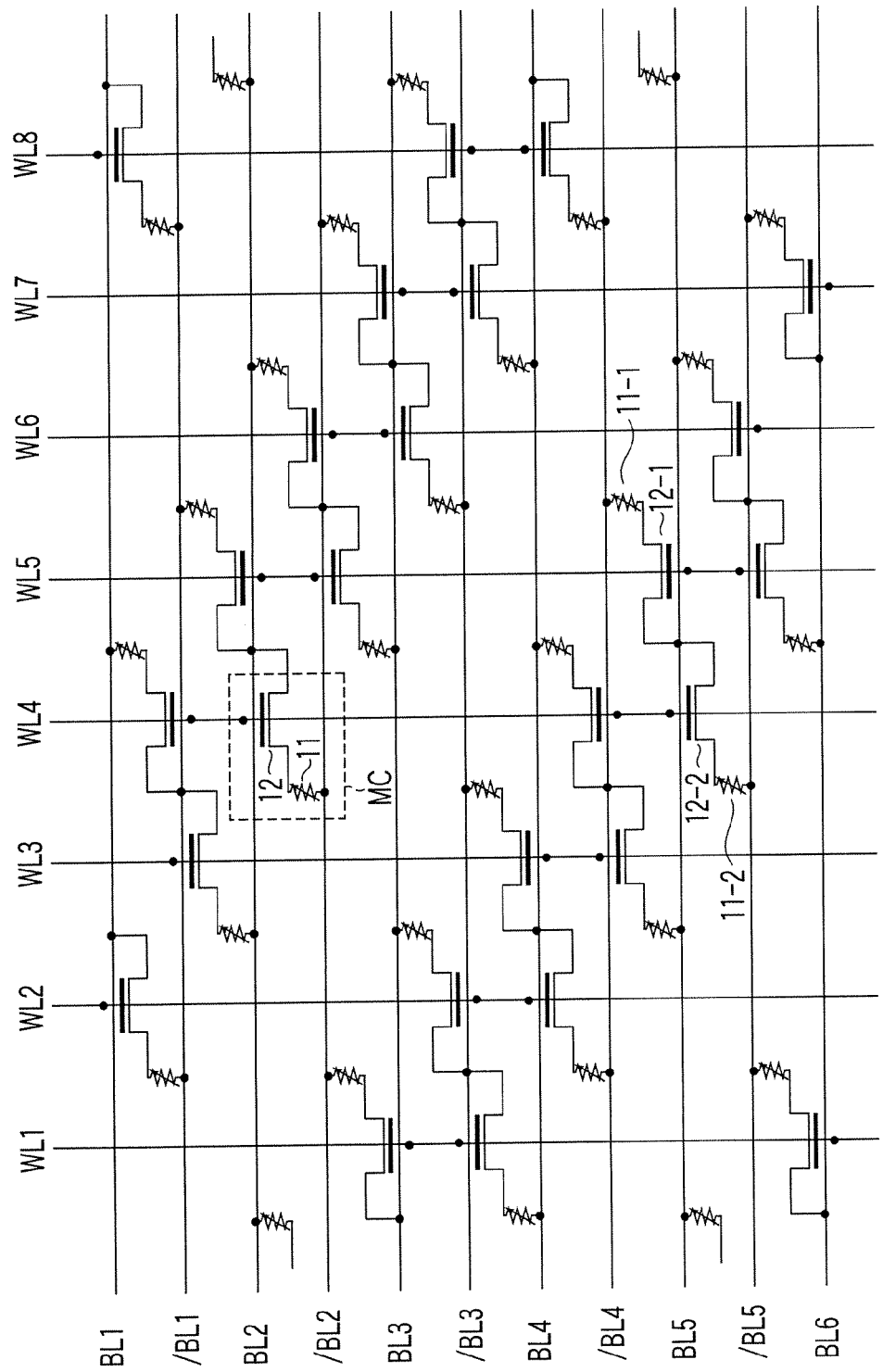
FIG. 26 is a circuit diagram of the MRAM shown in FIG. 25.

FIG. 25 is a plan view illustrating the arrangement of an MRAM according to the fifth embodiment of the present invention. FIG. 26 is a circuit diagram of the MRAM shown in FIG. 25. Note that a sectional view taken along a line XX-XX in FIG. 25 is the same as FIG. 20.

The MRAM comprises first bit lines BL (in this embodiment, bit lines BL1 to BL6) running in the X direction, second bit lines /BL (in this embodiment, bit lines /BL1 to /BL5) running in the X direction, and word lines WL (in this embodiment, word lines WL1 to WL8) running in the Y direction. The first bit lines BL and second bit lines /BL are alternately arranged.

Also, the first bit lines BL and second bit lines /BL are formed in wiring layers on different levels. That is, the first bit lines BL are formed in a first metal layer, and the second bit lines /BL are formed in a second metal layer above the first metal layer.

Each active area AA is formed to extend obliquely to the X or Y direction. Active areas AA obliquely adjacent to each other are translationally symmetrical. Active areas AA adjacent to each other in a direction perpendicular to the direction in which the active areas AA extend are translationally symmetrical. In addition, a first active area AA1 is spaced apart by one word line in the X direction and one bit line in the Y direction from a second active area AA2 obliquely adjacent to the first active area AA1.

In the MRAM constructed as above, it is possible to reduce the area and increase the distance between the active areas AA obliquely adjacent to each other at the same time. Also, the bit line and a source region 25 of a selection transistor 12 can be connected via a contact layer 29.

Figure 27:
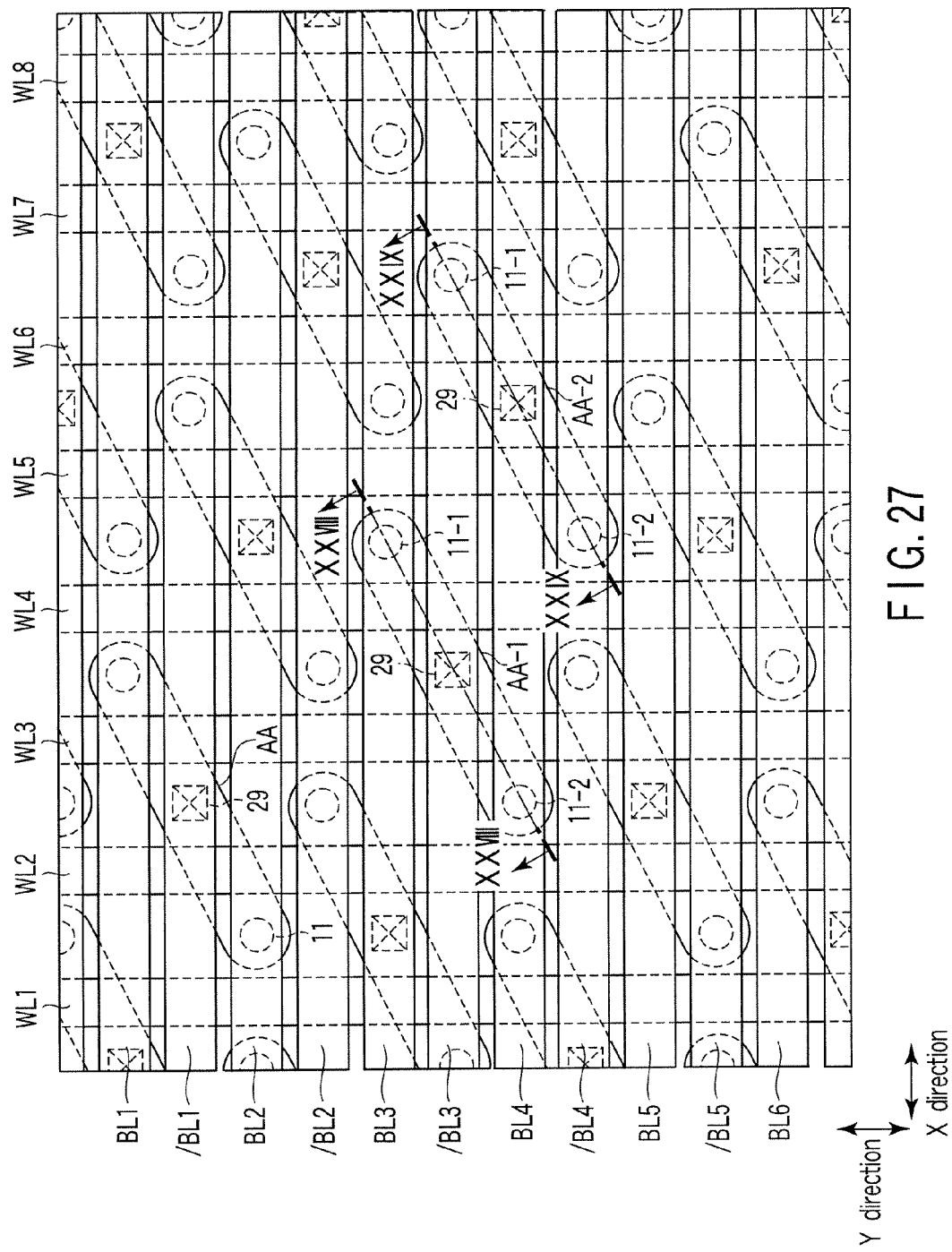
FIG. 27 is a plan view illustrating another embodiment of the MRAM.
Figure 28:
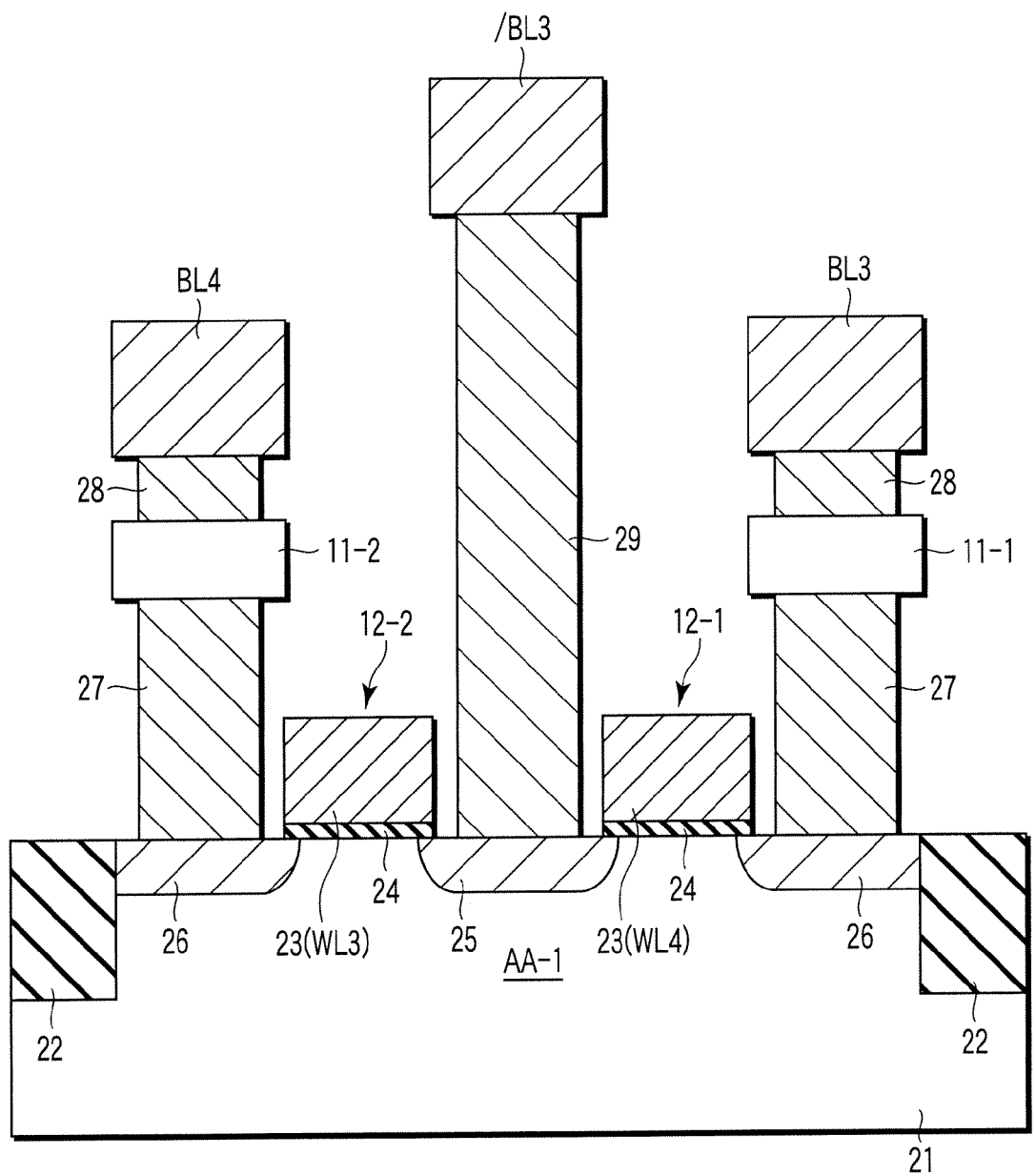
FIG. 28 is a sectional view of the MRAM taken along a line XXVIII-XXVIII in FIG. 27.
Figure 29:
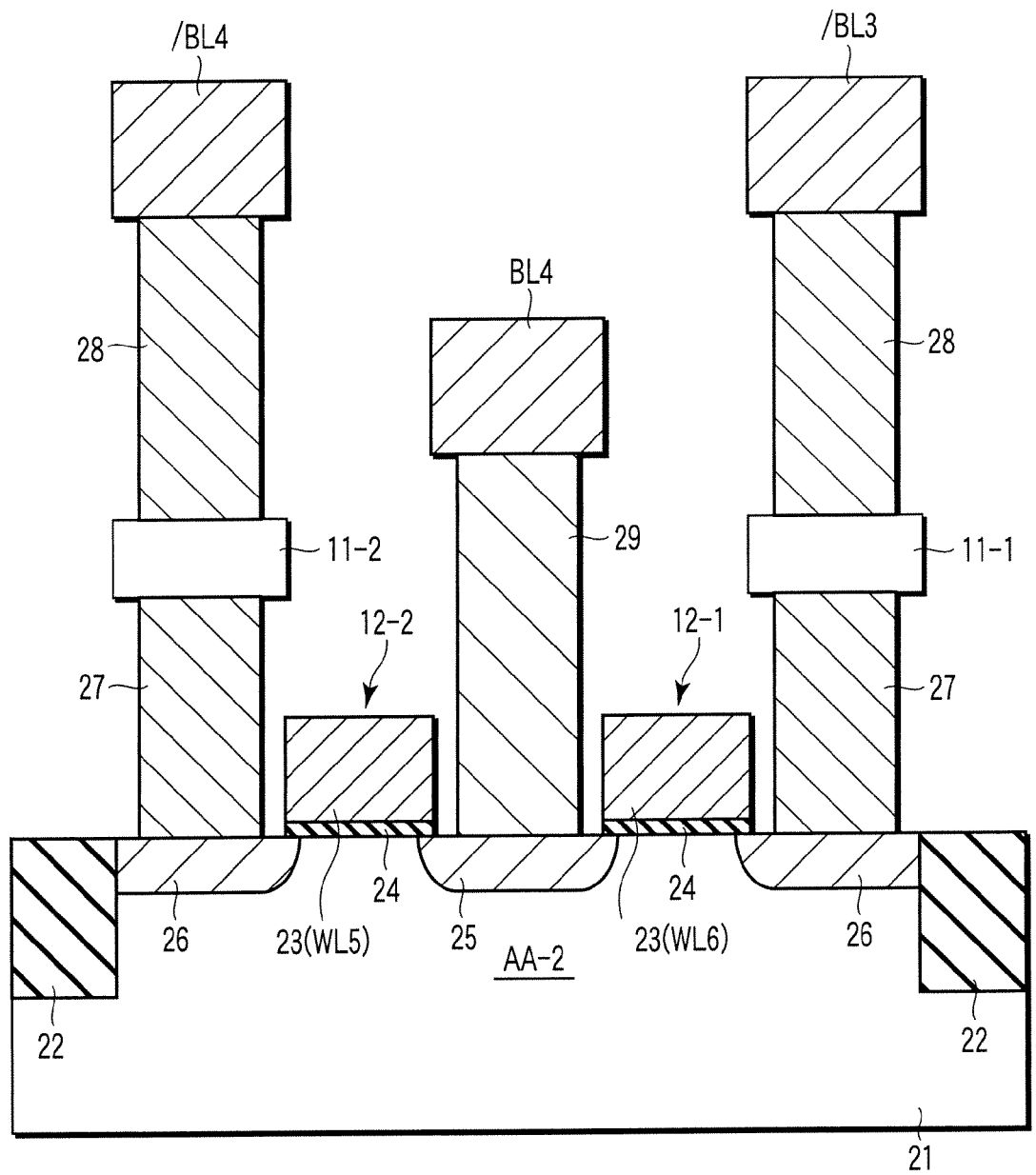
FIG. 29 is a sectional view of the MRAM taken along a line XXIX-XXIX in FIG. 27.

FIG. 27 is a plan view illustrating another embodiment of the MRAM. FIG. 28 is a sectional view of the MRAM taken along a line XXVIII-XXVIII in FIG. 27. FIG. 29 is a sectional view of the MRAM taken along a line XXIX-XXIX in FIG. 27. FIG. 30 is a circuit diagram of the MRAM shown in FIG. 27.

As shown in FIG. 27, active areas AA obliquely adjacent to each other are translationally symmetrical. Also, an active area AA-2 is spaced apart by two word lines in the X direction and one bit line in the Y direction from an active area AA-1 obliquely adjacent to the active area AA-2. The area can be reduced in the MRAM constructed as above. It is also possible to connect the bit line and a source region 25 of a selection transistor 12 via a contact layer 29.

Figure 31:
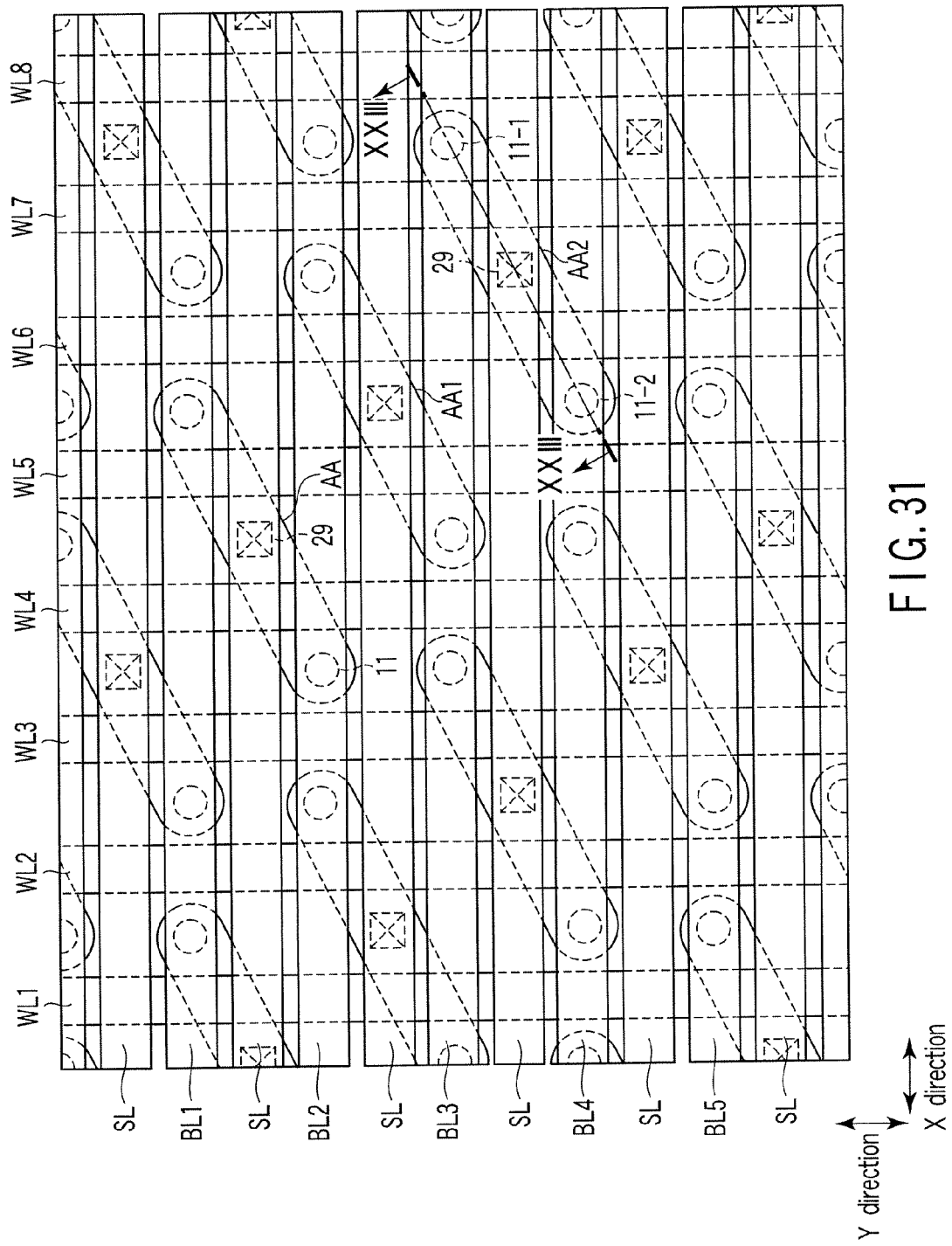
FIG. 31 is a plan view illustrating still another embodiment of the MRAM.
Figure 32:
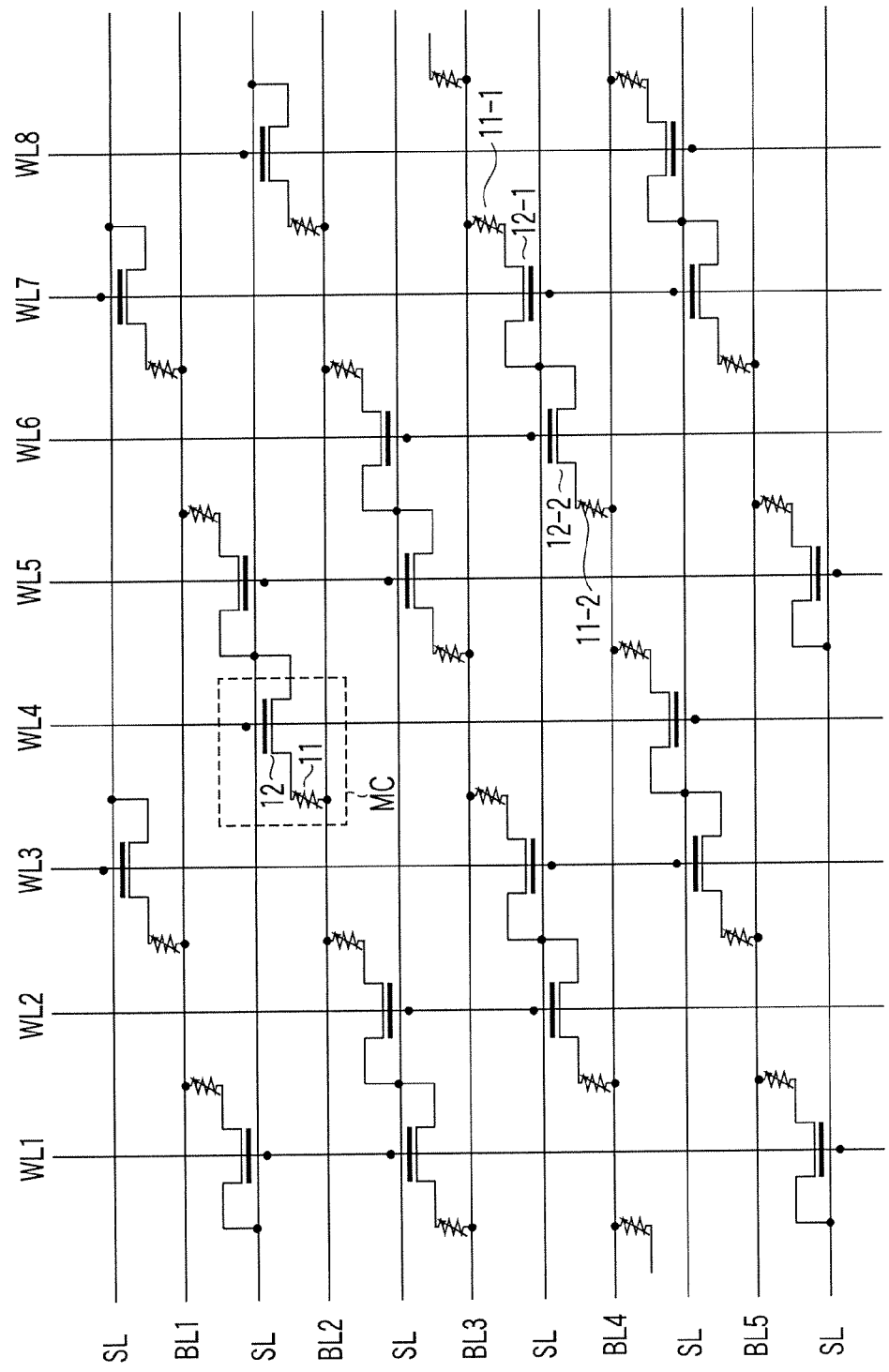
FIG. 32 is a circuit diagram of the MRAM shown in FIG. 31.

FIG. 31 is a plan view illustrating still another embodiment of the MRAM. FIG. 32 is a circuit diagram of the MRAM shown in FIG. 31. Note that a sectional view taken along a line XXIII-XXIII in FIG. 31 is the same as FIG. 23.

The MRAM comprises bit lines BL (in this embodiment, bit lines BL1 to BL5) running in the X direction, word lines WL (in this embodiment, word lines WL1 to WL8) running in the Y direction, and source lines SL running in the X direction. The source lines SL are electrically connected. The bit lines BL and source lines SL are alternately arranged.

Also, the bit lines BL and source lines SL are formed in wiring layers on different levels. That is, the source lines SL are formed in a first metal layer, and the bit lines BL are formed in a second metal layer above the first metal layer.

As shown in FIG. 31, each active area AA is formed to extend obliquely to the X or Y direction. Active areas AA obliquely adjacent to each other are translationally symmetrical. Active areas AA adjacent to each other in the X direction are translationally symmetrical. In addition, a first active area AA1 is spaced apart by one word line in the X direction and two lines (the bit line BL1 and a source line SL1) in the Y direction from a second active area AA2 obliquely adjacent to the first active area AA1.

Figure 33:
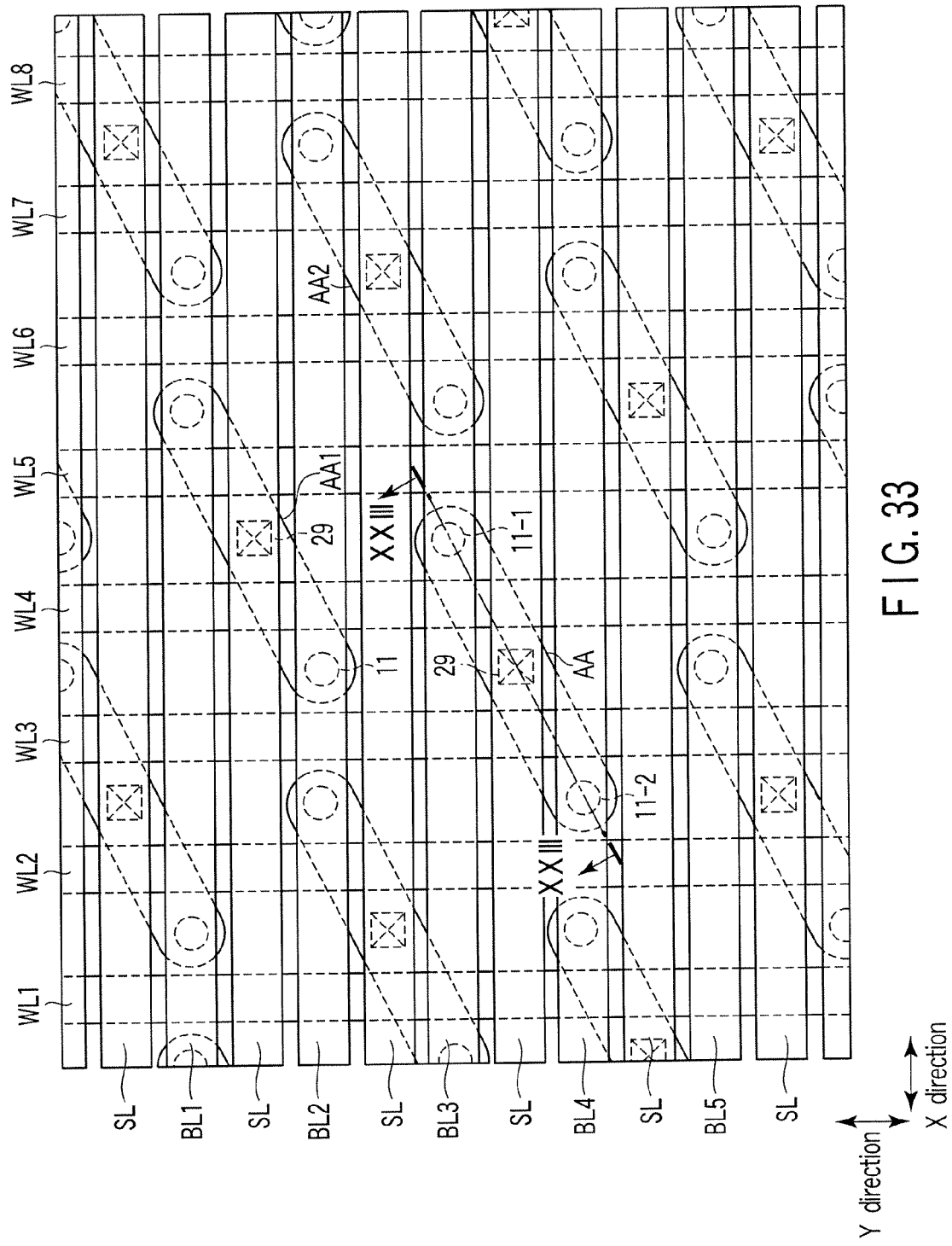
FIG. 33 is a plan view illustrating still another embodiment of the MRAM.
Figure 34:
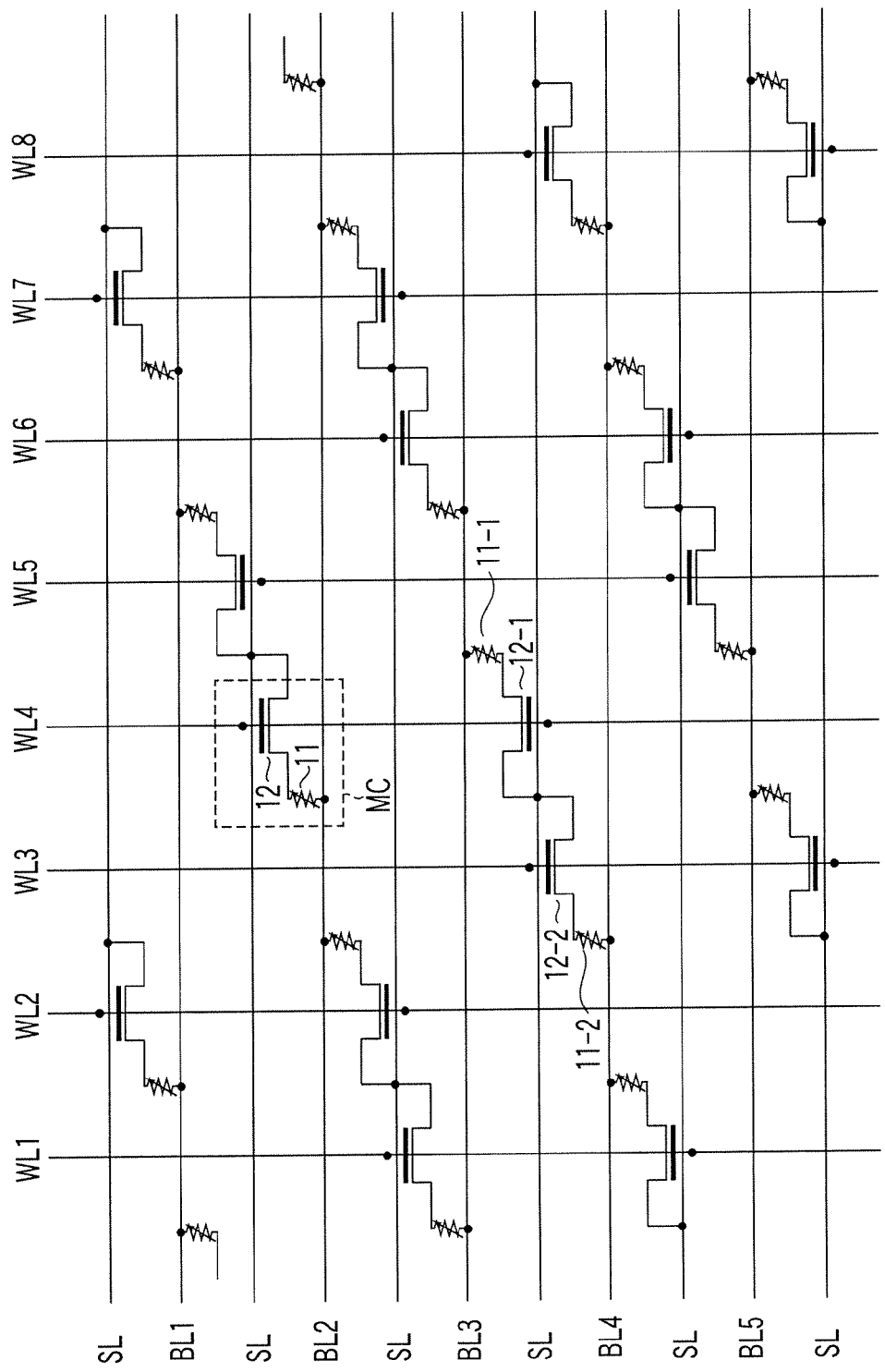
FIG. 34 is a circuit diagram of the MRAM shown in FIG. 33.

FIG. 33 is a plan view illustrating still another embodiment of the MRAM. FIG. 34 is a circuit diagram of the MRAM shown in FIG. 33. Note that a sectional view taken along a line XXIII-XXIII in FIG. 33 is the same as FIG. 23.

As shown in FIG. 33, active areas AA obliquely adjacent to each other are translationally symmetrical. Active areas AA adjacent to each other in the X direction are also translationally symmetrical. In addition, a first active area AA1 is spaced apart by two word lines in the X direction and two lines (bit line BL1 and source line SL1) in the Y direction from a second active area AA2 obliquely adjacent to the first active area AA1. Even when the MRAM is constructed as above, the same effects as described above can be obtained.

Sixth Embodiment

In the sixth embodiment, each active area AA is formed obliquely to a direction in which bit lines or word lines run, and two active areas AA adjacent to each other in the X direction are symmetrically arranged.

Figure 35:
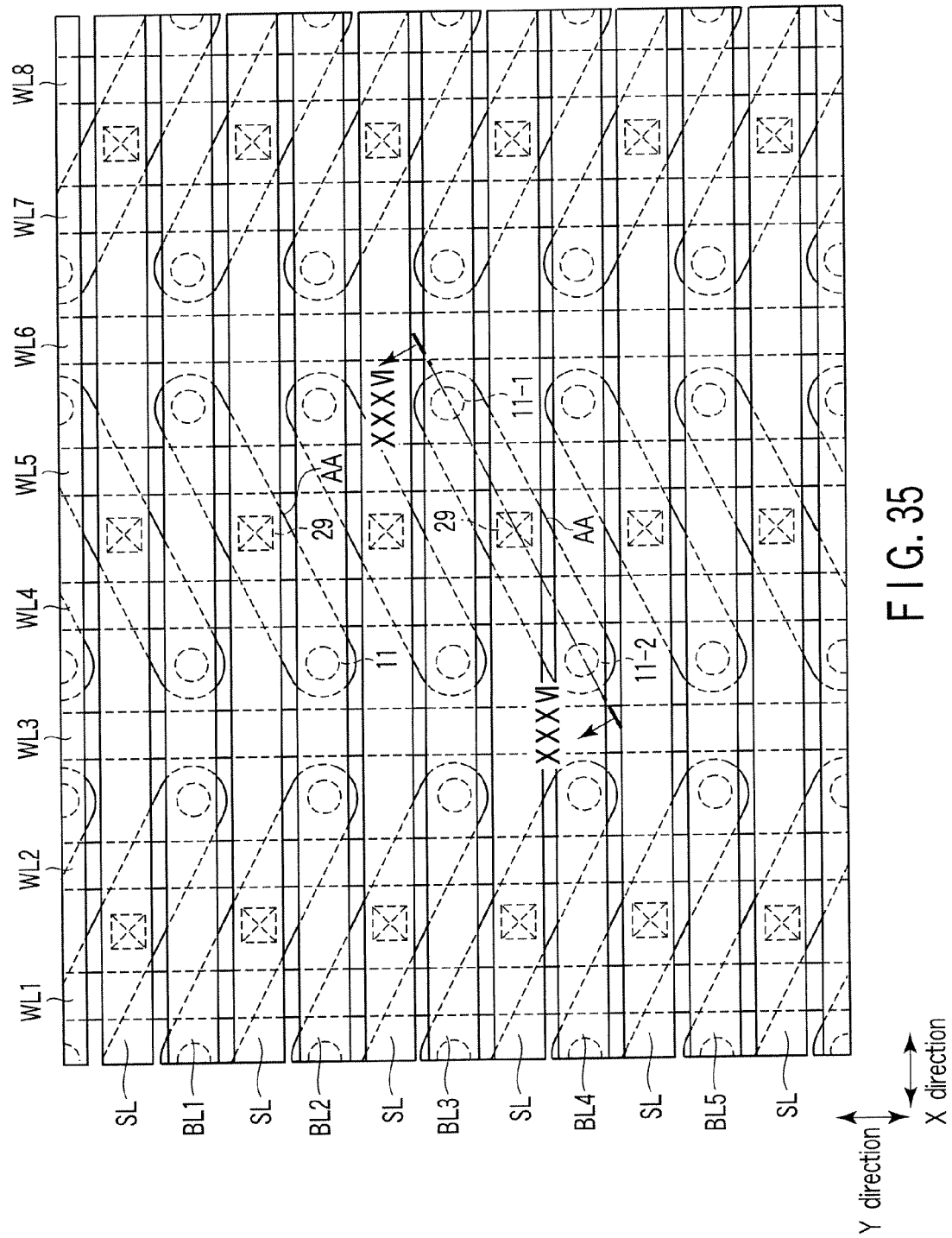
FIG. 35 is a plan view illustrating the arrangement of an MRAM according to the sixth embodiment of the present invention.
Figure 37:
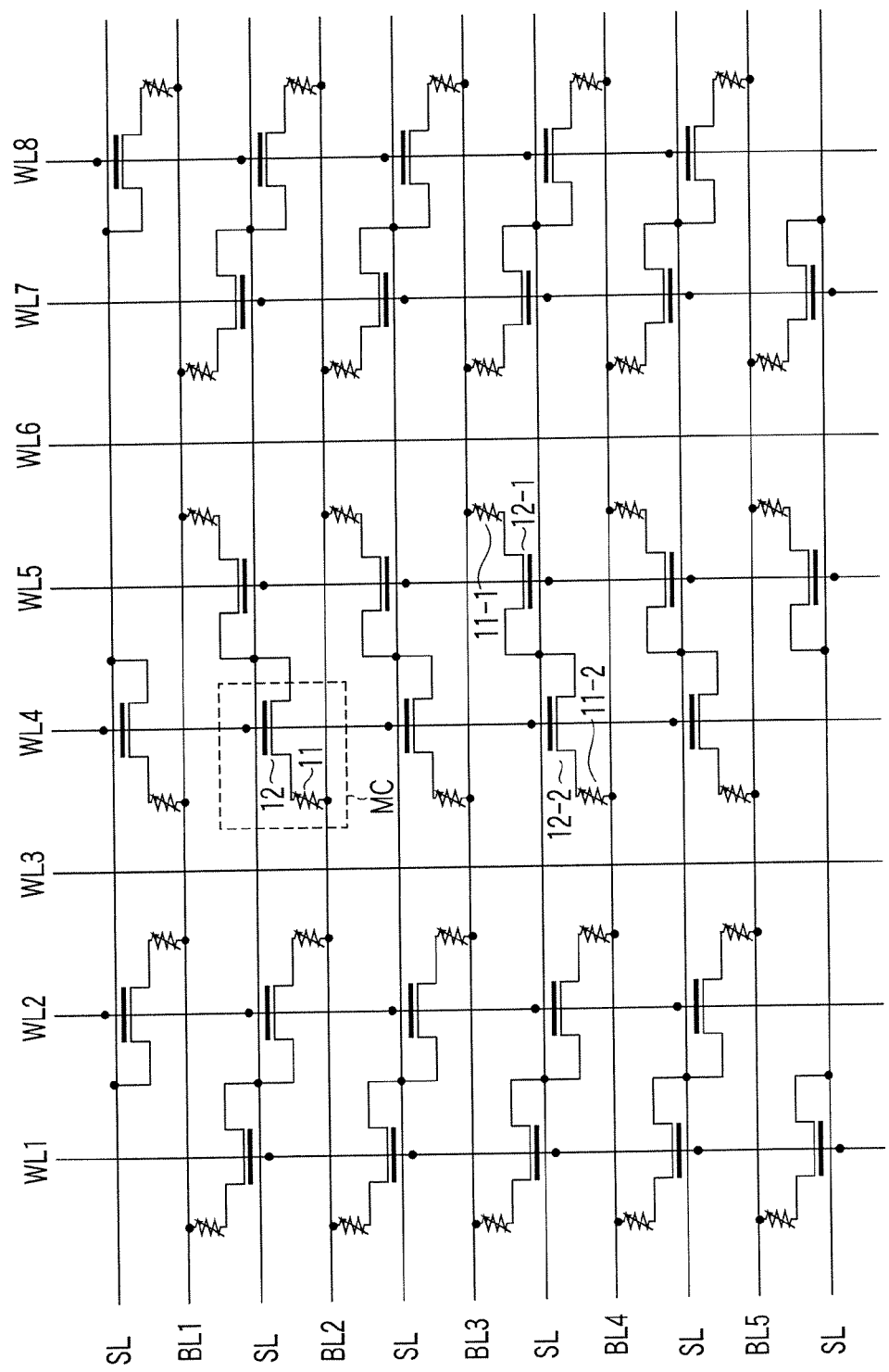
FIG. 37 is a circuit diagram of the MRAM shown in FIG. 36.

FIG. 35 is a plan view illustrating the arrangement of an MRAM according to the sixth embodiment of the present invention. FIG. 36 is a sectional view of the MRAM taken along a line XXXVI-XXXVI in FIG. 35. FIG. 37 is a circuit diagram of the MRAM shown in FIG. 35.

The MRAM comprises bit lines BL (in this embodiment, bit lines BL1 to BL5) running in the X direction, word lines WL (in this embodiment, word lines WL1 to WL8) running in the Y direction, and source lines SL running in the X direction. The source lines SL are electrically connected. The bit lines BL and source lines SL are alternately arranged.

Also, the bit lines BL and source lines SL are formed in wiring layers on different levels. That is, the source lines SL are formed in a first metal layer, and the bit lines BL are formed in a second metal layer above the first metal layer.

As shown in FIG. 35, each active area AA is formed to extend obliquely to the X or Y direction. Active areas AA adjacent to each other in the Y direction are translationally symmetrical. Two active areas AA adjacent to each other in the X direction are axially symmetrical with respect to the word line WL formed between them (axially symmetrical with respect to the word line WL as the axis of symmetry). The area can be reduced in the MRAM constructed as above. It is also possible to connect the source line SL and a source region 25 of a selection transistor 12 via a contact layer 29.

Figure 38:
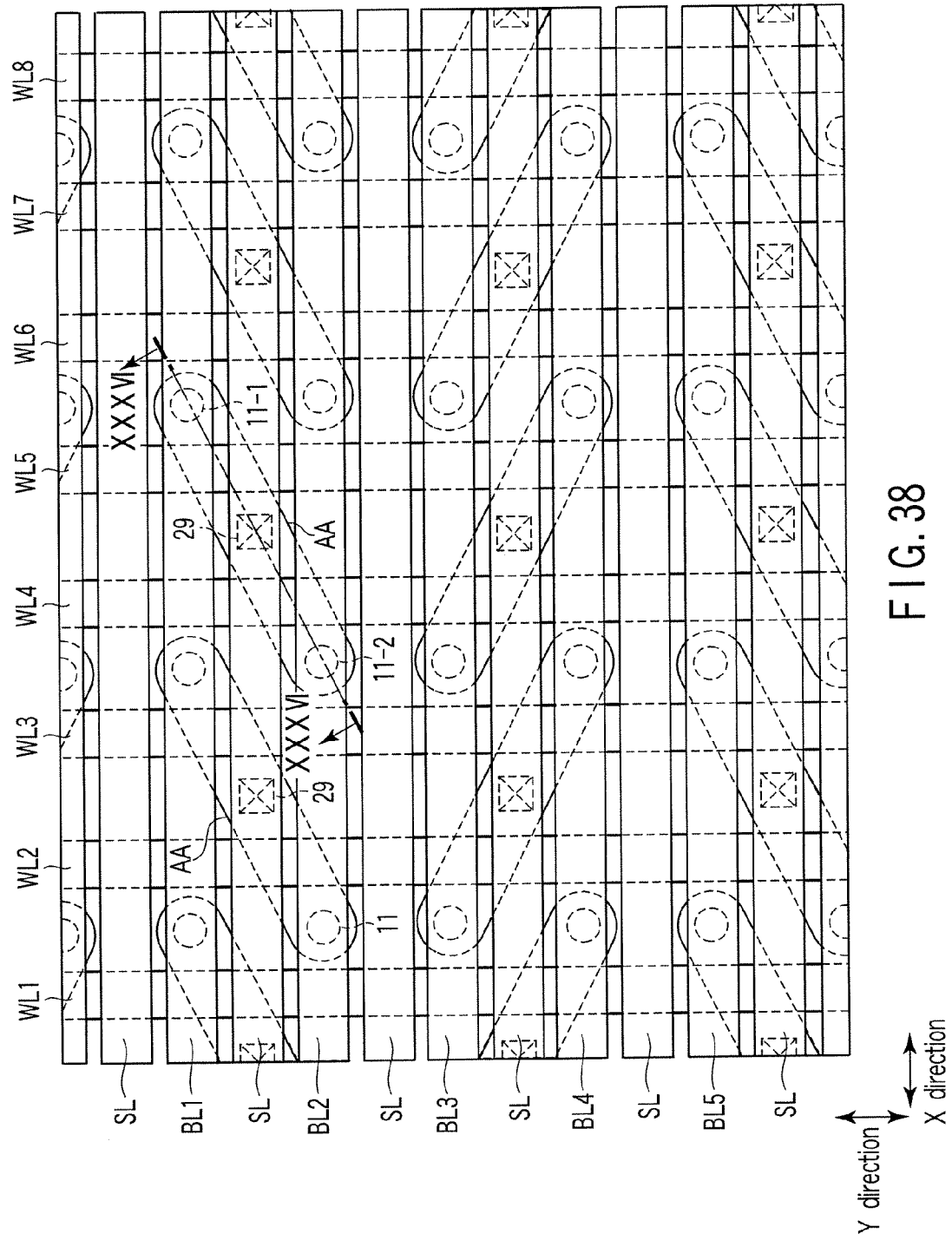
FIG. 38 is a plan view illustrating another embodiment of the MRAM.
Figure 39:
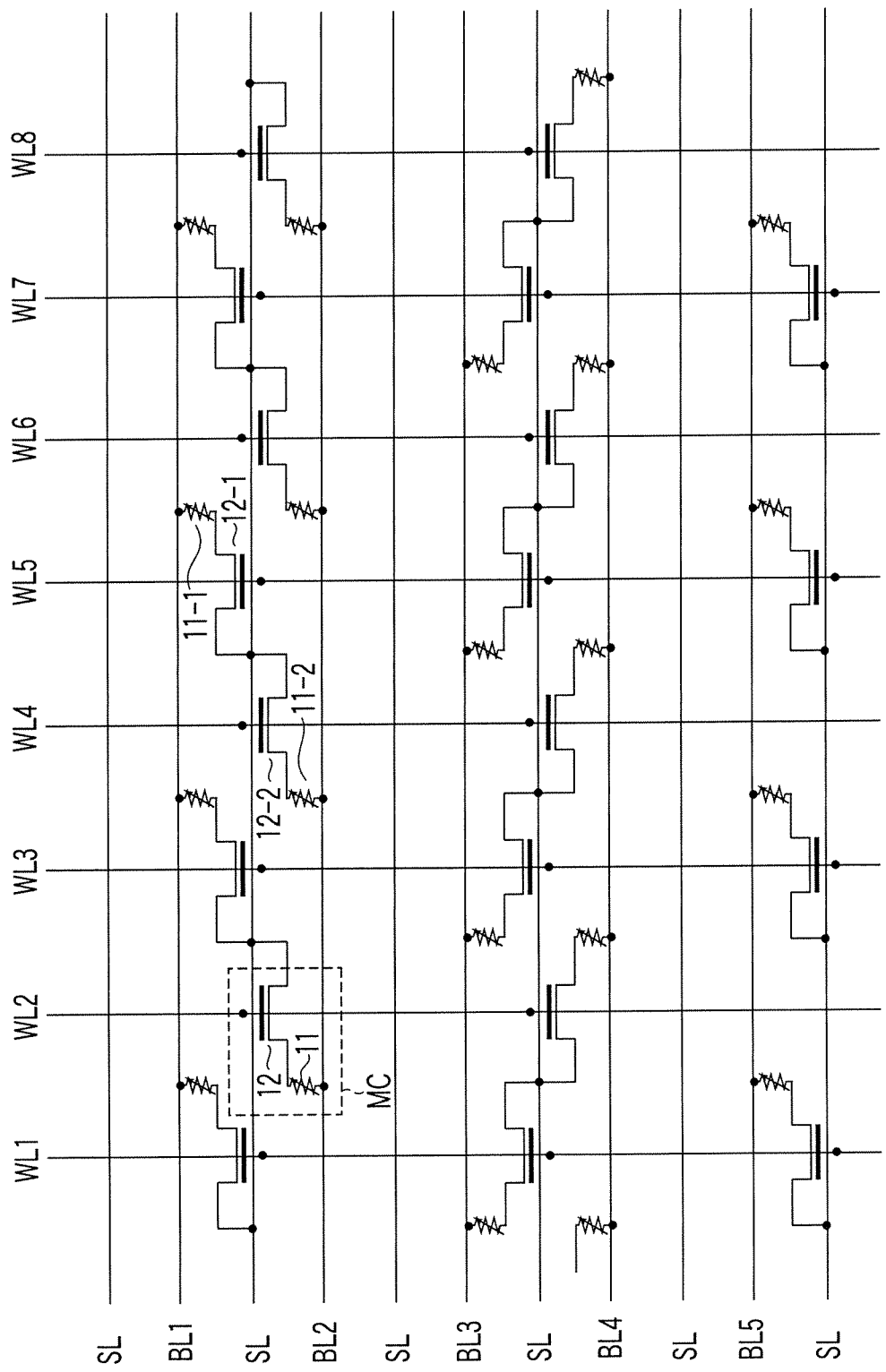
FIG. 39 is a circuit diagram of the MRAM shown in FIG. 38.

FIG. 38 is a plan view illustrating another embodiment of the MRAM. FIG. 39 is a circuit diagram of the MRAM shown in FIG. 38. Note that a sectional view taken along a line XXXVI-XXXVI in FIG. 38 is the same as FIG. 36.

As shown in FIG. 38, each active area AA is formed to extend obliquely to the X or Y direction. Active areas AA adjacent to each other in the X direction are translationally symmetrical. Two active areas AA adjacent to each other in the Y direction are axially symmetrical with respect to a source line SL formed between them.

Figure 40:
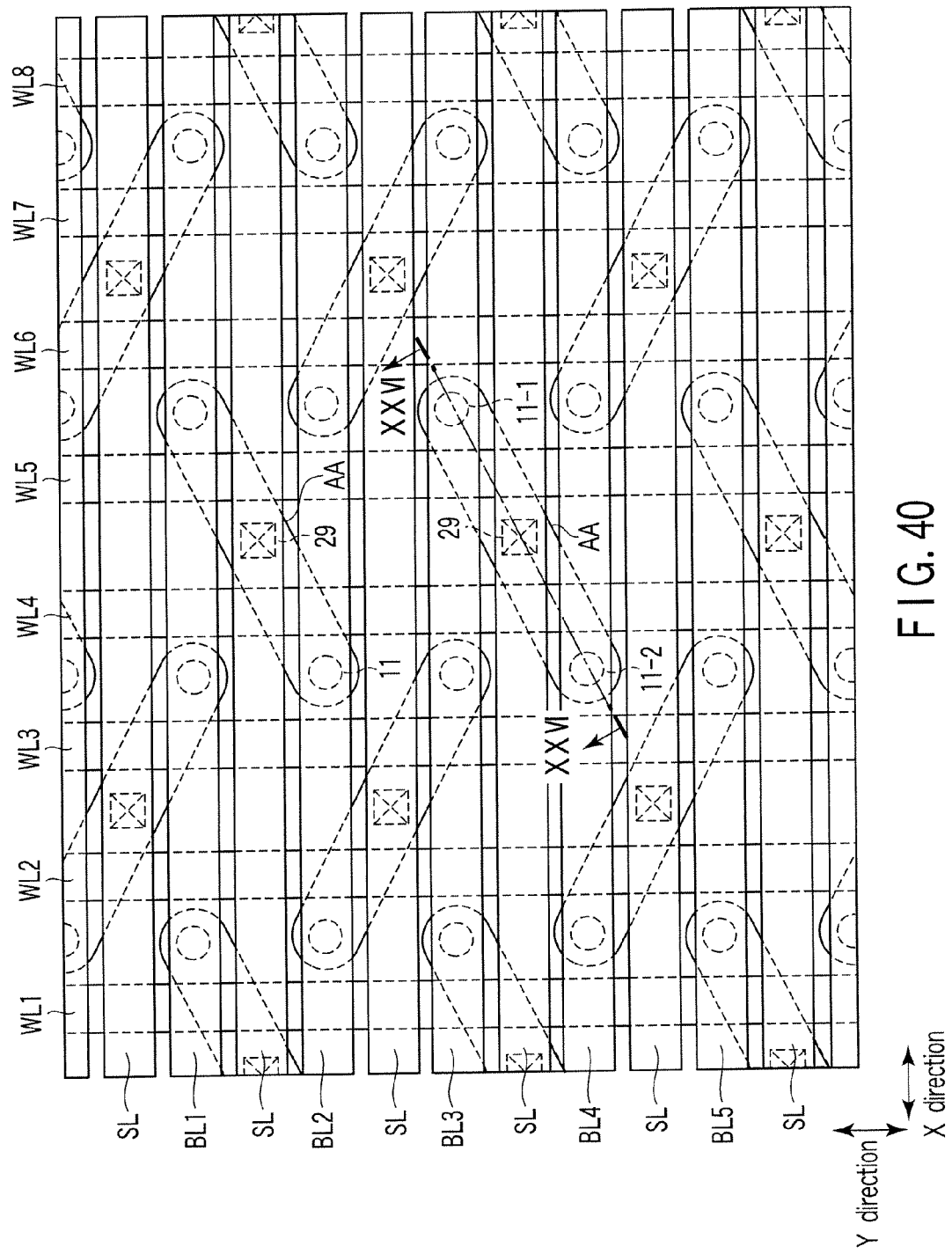
FIG. 40 is a plan view illustrating still another embodiment of the MRAM.
Figure 41:
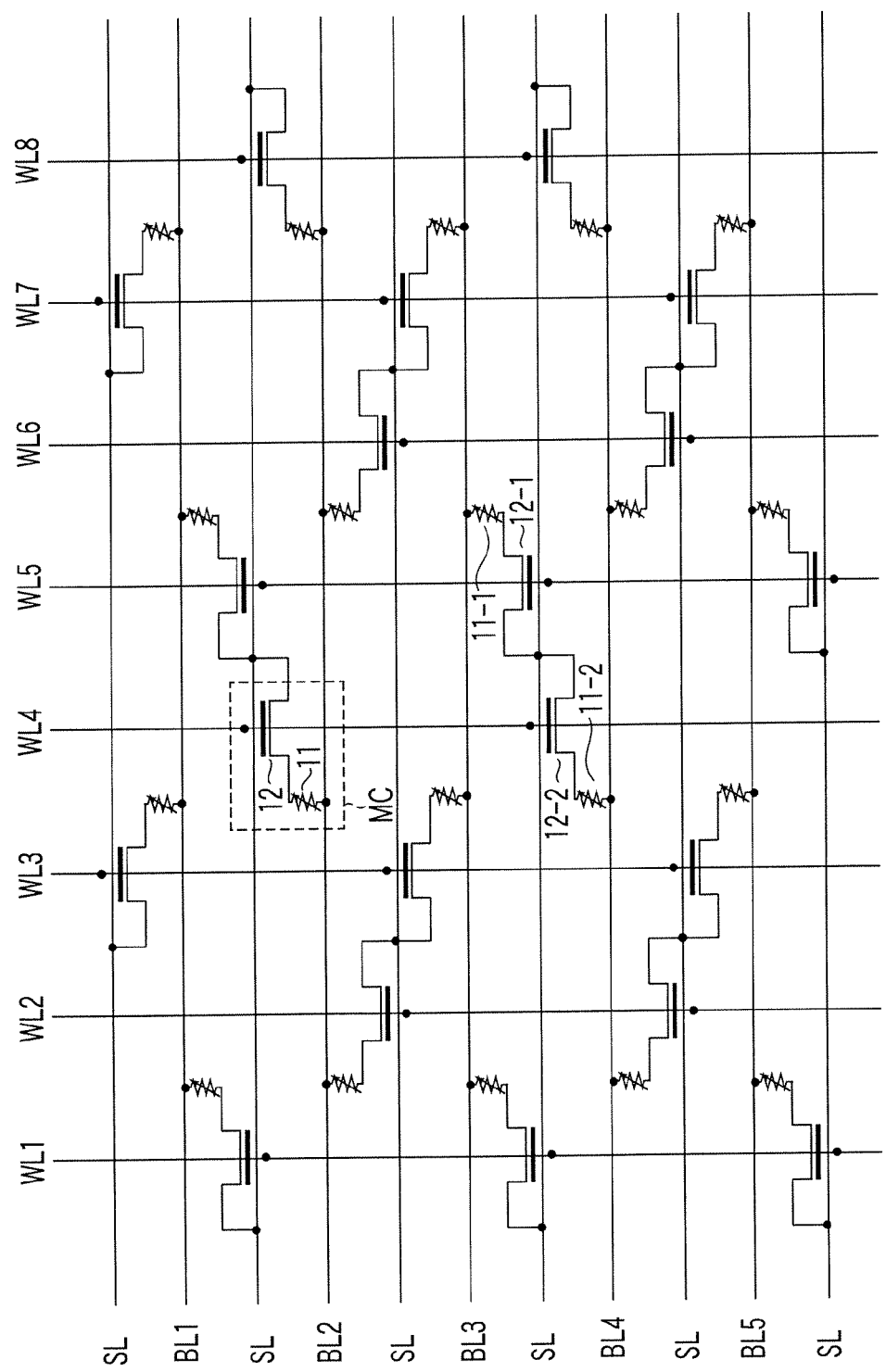
FIG. 41 is a circuit diagram of the MRAM shown in FIG. 40.

FIG. 40 is a plan view illustrating still another embodiment of the MRAM. FIG. 41 is a circuit diagram of the MRAM shown in FIG. 40. Note that a sectional view taken along a line XXXVI-XXXVI in FIG. 40 is the same as FIG. 36.

As shown in FIG. 40, each active area AA is formed to extend obliquely to the X or Y direction. Active areas AA adjacent to each other in the X direction are translationally symmetrical. Two active areas AA obliquely adjacent to each other are arranged to incline in different directions with respect to the X direction.

Figure 42:
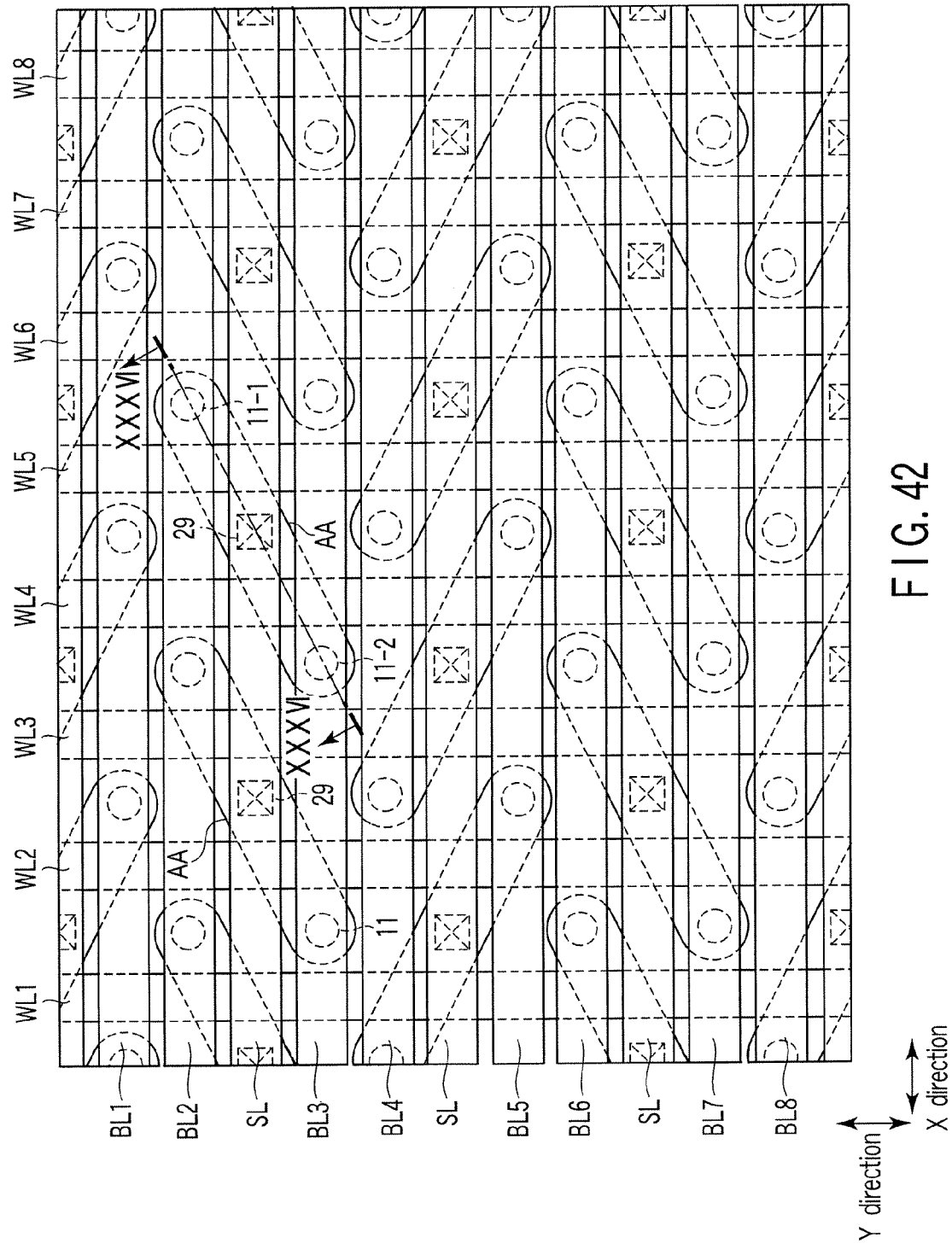
FIG. 42 is a plan view illustrating still another embodiment of the MRAM.
Figure 43:
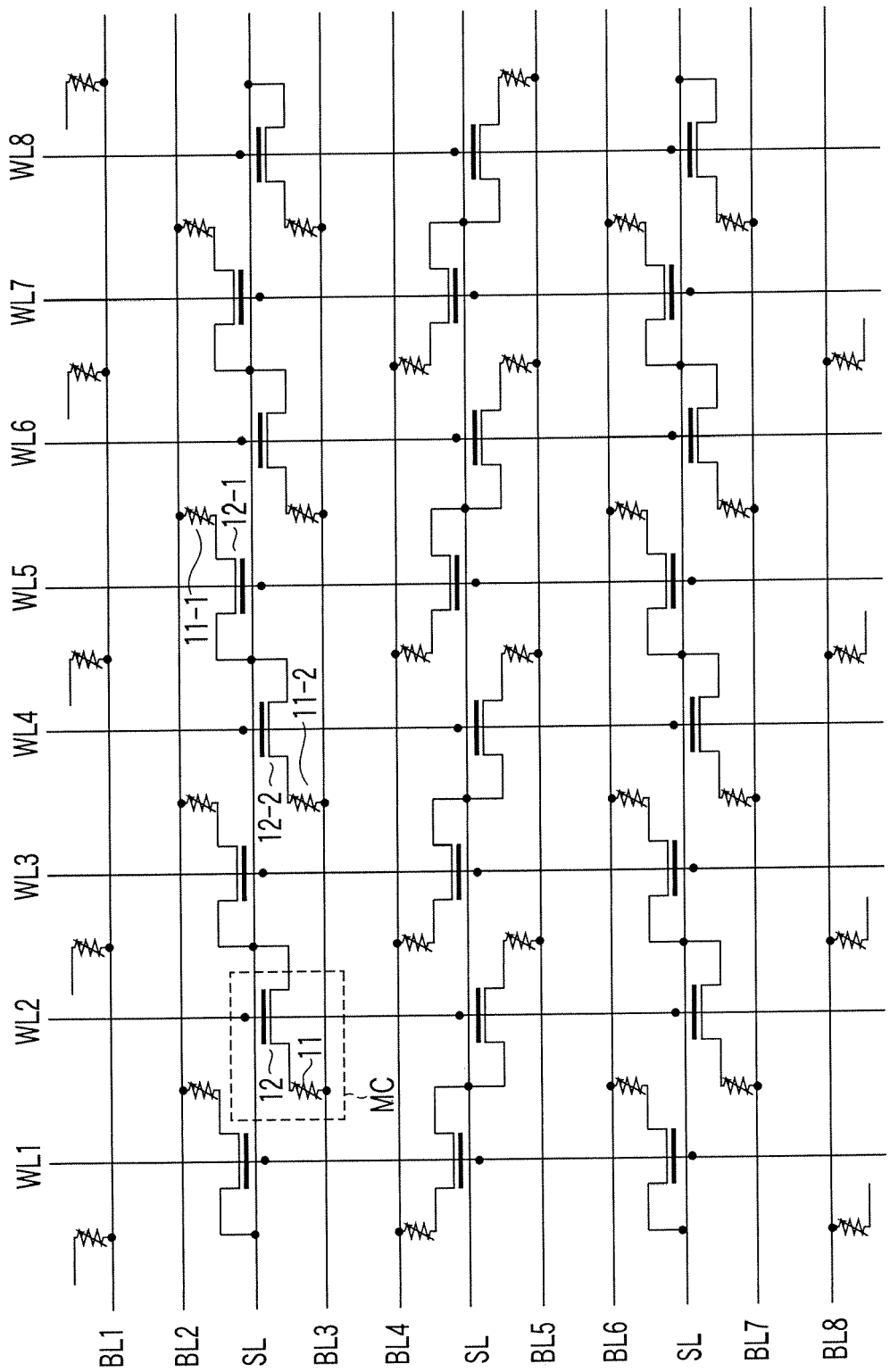
FIG. 43 is a circuit diagram of the MRAM shown in FIG. 42.

FIG. 42 is a plan view illustrating still another embodiment of the MRAM. FIG. 43 is a circuit diagram of the MRAM shown in FIG. 42. Note that a sectional view taken along a line XXXVI-XXXVI in FIG. 42 is the same as FIG. 36.

The MRAM comprises bit lines BL (in this embodiment, bit lines BL1 to BL8) running in the X direction, word lines WL (in this embodiment, word lines WL1 to WL8) running in the Y direction, and source lines SL running in the X direction. The source lines SL are electrically connected. A plurality of sets each including two bit lines BL and a source line SL formed between them are arranged in the Y direction.

The bit lines BL and source lines SL are formed in wiring layers on different levels. That is, the source lines SL are formed in a first metal layer, and the bit lines BL are formed in a second metal layer above the first metal layer.

As shown in FIG. 42, each active area AA is formed to extend obliquely to the X or Y direction. Active areas AA adjacent to each other in the Y direction are translationally symmetrical. Two active areas AA adjacent to each other in the Y direction are arranged to incline in different directions with respect to the X direction. Even when the MRAM is constructed as above, the same effects as described above can be obtained.

Seventh Embodiment

The seventh embodiment reduces the area of an MRAM by zigzagging an active area AA.

Figure 44:
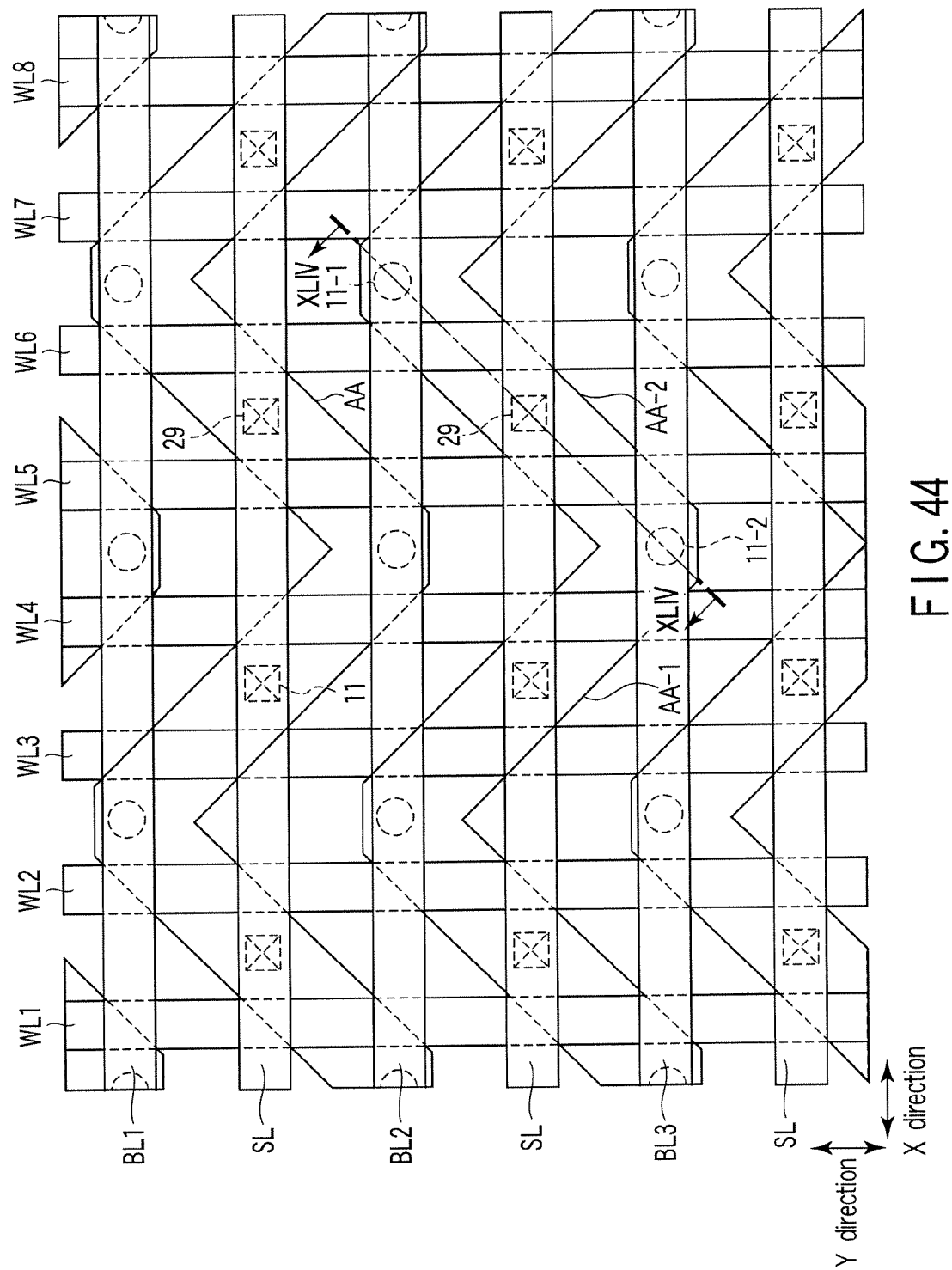
FIG. 44 is a plan view illustrating the arrangement of an MRAM according to the seventh embodiment of the present invention.
Figure 45:
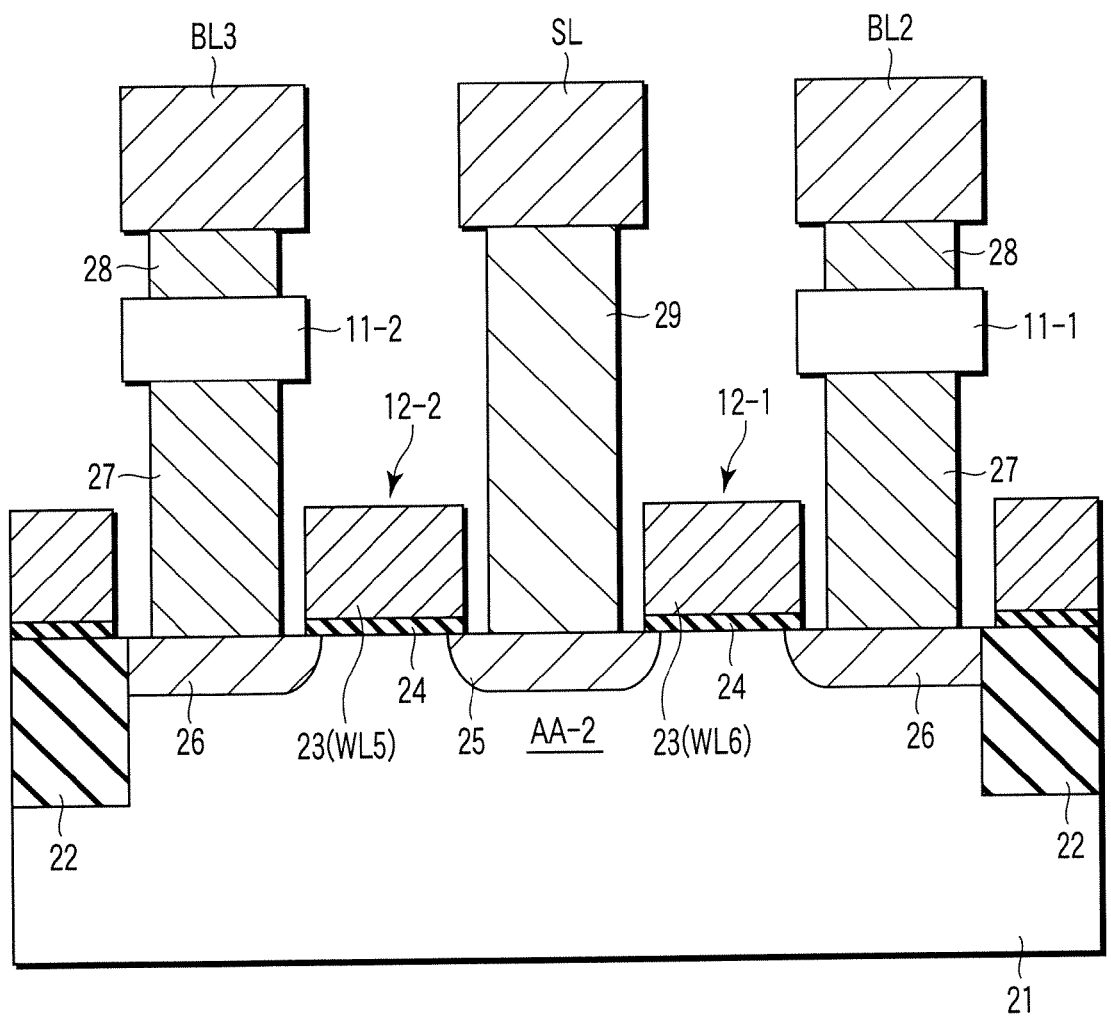
FIG. 45 is a sectional view of the MRAM taken along a line XLIV-XLIV in FIG. 44.

FIG. 44 is a plan view illustrating the arrangement of the MRAM according to the seventh embodiment of the present invention. FIG. 45 is a sectional view of the MRAM taken along a line XLIV-XLIV in FIG. 44. FIG. 46 is a circuit diagram of the MRAM shown in FIG. 44.

The MRAM comprises bit lines BL (in this embodiment, bit lines BL1 to BL4) running in the X direction, word lines WL (in this embodiment, word lines WL1 to WL8) running in the Y direction, and source lines SL running in the X direction. The source lines SL are electrically connected. The bit lines BL and source lines SL are alternately arranged. Also, the bit lines BL and source lines SL are formed in the same wiring layer.

As shown in FIG. 44, the active area AA extends in the X direction, and has a zigzag shape. That is, one active area AA is formed by connecting a plurality of V-shaped active areas along the X direction. Each V-shaped active area comprises two active areas AA-1 and AA-2 extending obliquely to the X direction. The two active areas AA-1 and AA-2 incline in different directions with respect to the X direction. In other words, one active area AA is formed by alternately connecting active areas inclining in one direction with respect to the X direction, and active areas inclining in the other direction with respect to the X direction. The active areas AA are translationally symmetrical in the Y direction.

An MTJ element 11 is formed above a pointed portion of the zigzag active area AA. When writing to a given MTJ element 11, two word lines WL on the two sides of the MTJ element 11 are activated. This turns on two selection transistors 12 on the two sides of the MTJ element 11. As a consequence, the write current can be increased.

The area can be reduced in the MRAM constructed as above. It is also possible to connect the source line SL and a source region 25 of the selection transistor 12 via a contact layer 29.

Furthermore, one wiring layer of the MRAM can be reduced because the bit lines BL and source lines SL can be formed in the wiring layer on the same level. Since this decreases the number of process steps, the fabrication cost can be reduced.

Figure 47:
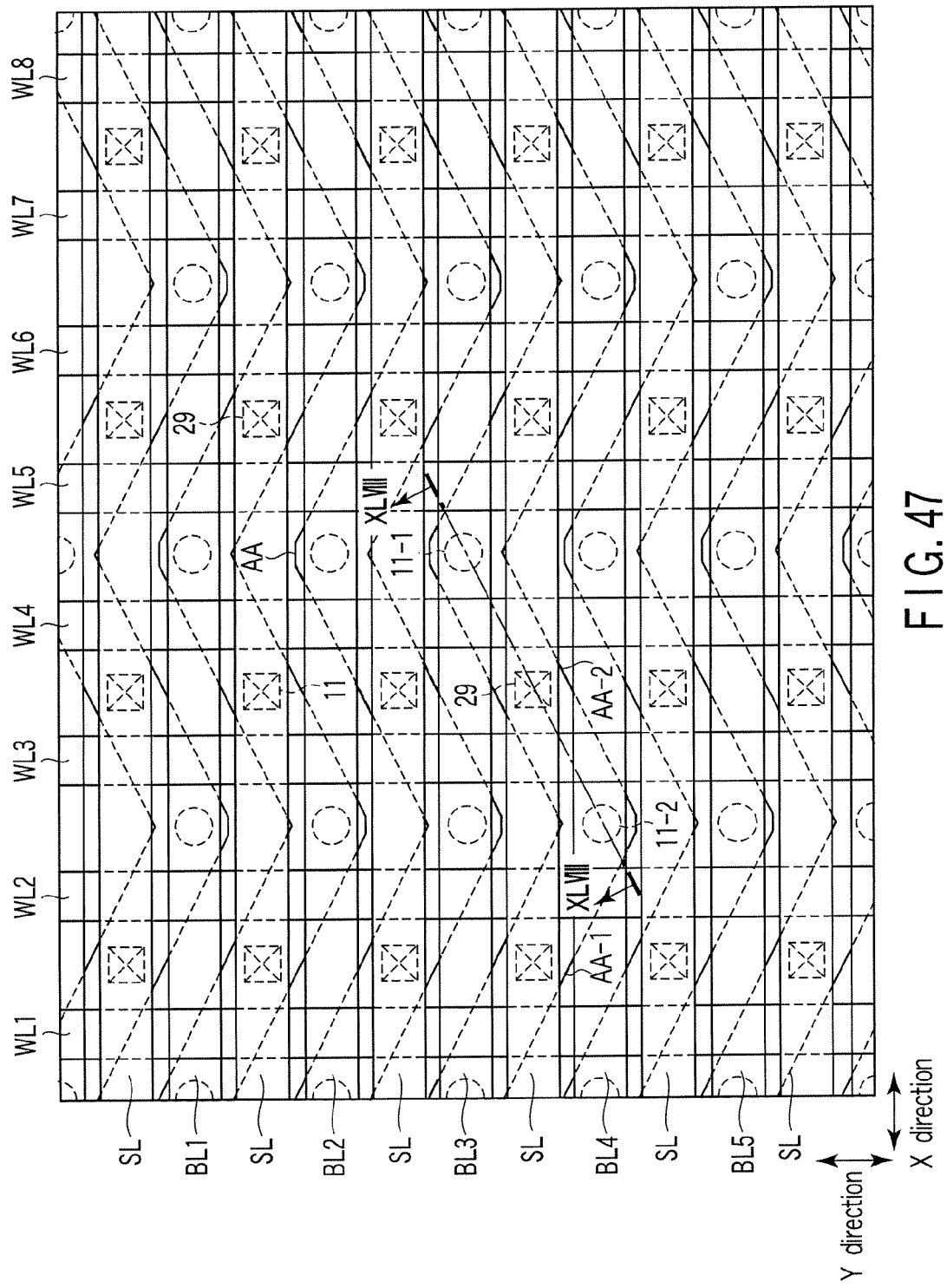
FIG. 47 is a plan view illustrating another embodiment of the MRAM.
Figure 48:
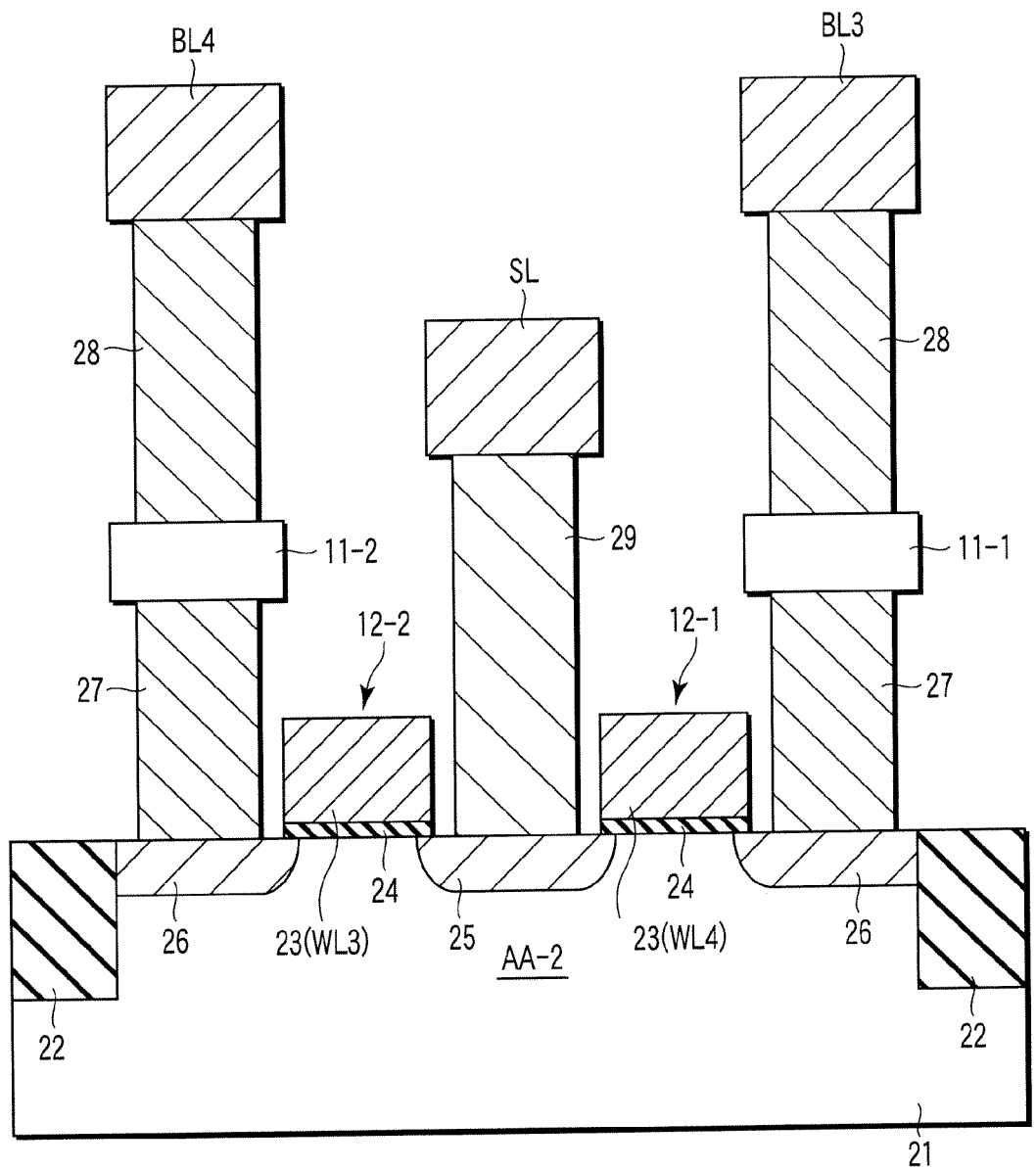
FIG. 48 is a sectional view of the MRAM taken along a line XLVIII-XLVIII in FIG. 47.
Figure 49:
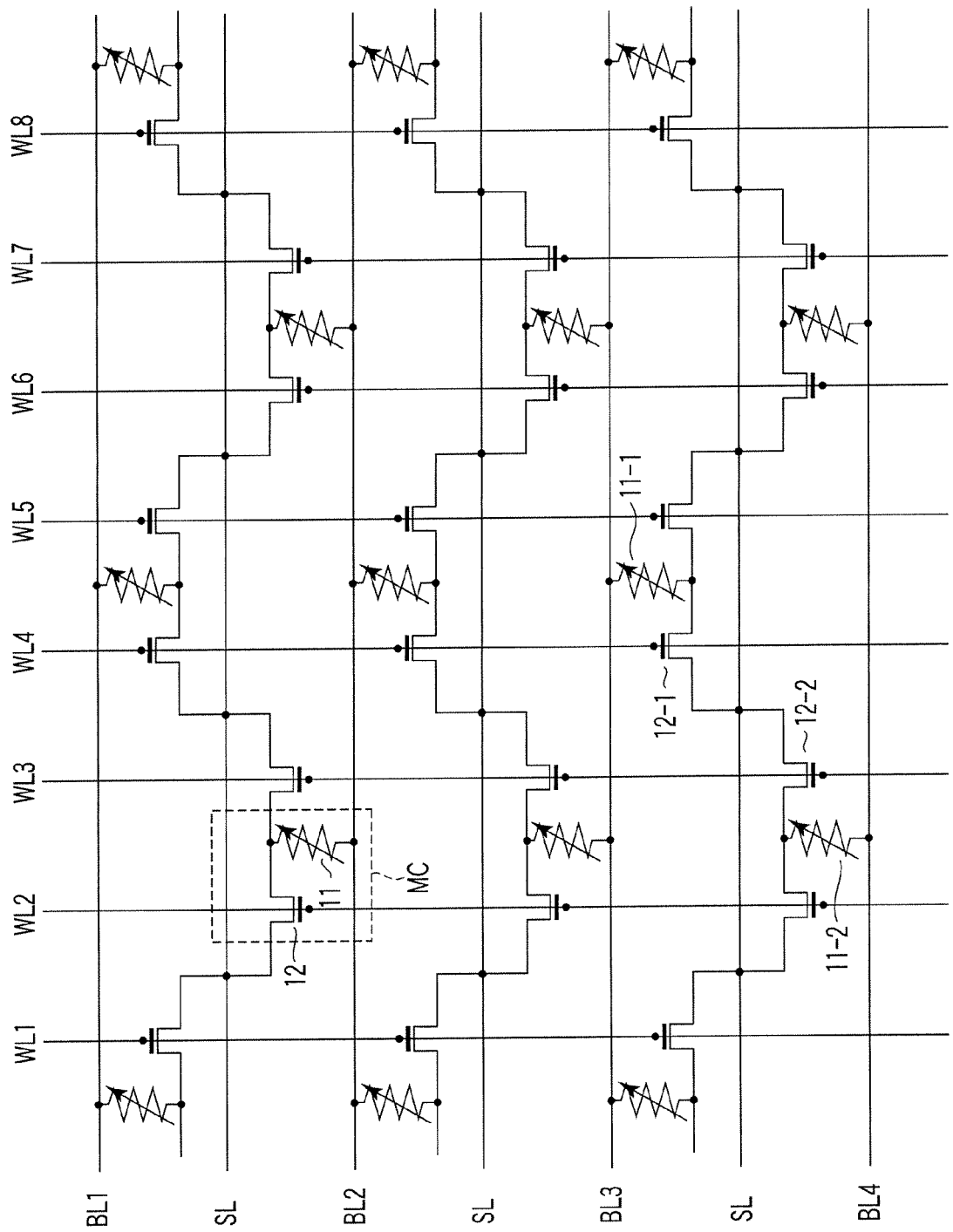
FIG. 49 is a circuit diagram of the MRAM shown in FIG. 47.

FIG. 47 is a plan view illustrating another embodiment the MRAM. FIG. 48 is a sectional view of the MRAM taken along a line XLVIII-XLVIII in FIG. 47. FIG. 49 is a circuit diagram of the MRAM shown in FIG. 47.

The MRAM comprises bit lines BL (in this embodiment, bit lines BL1 to BL5) running in the X direction, word lines WL (in this embodiment, word lines WL1 to WL8) running in the Y direction, and source lines SL running in the X direction. The source lines SL are electrically connected. The bit lines BL and source lines SL are alternately arranged.

Also, the bit lines BL and source lines SL are formed in wiring layers on different levels. That is, the source lines SL are formed in a first metal layer, and the bit lines BL are formed in a second metal layer above the first metal layer.

As shown in FIG. 47, an active area AA extends in the X direction, and has a zigzag shape. That is, one active area AA is formed by connecting a plurality of V-shaped active areas along the X direction. Each V-shaped active area comprises two active areas AA-1 and AA-2 extending obliquely to the X direction. The two active areas AA-1 and AA-2 incline in different directions with respect to the X direction. Also, the active areas AA are translationally symmetrical in the Y direction.

An MTJ element 11 is formed above a pointed portion of the zigzag active area AA. When writing to a given MTJ element 11, two word lines WL on the two sides of the MTJ element 11 are activated. This turns on two selection transistors 12 on the two sides of the MTJ element 11. As a consequence, the write current can be increased.

In the MRAM constructed as above, the area can be reduced more than that of the MRAM shown in FIG. 44. It is also possible to connect the source line SL and a source region 25 of the selection transistor 12 via a contact layer 29.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a semiconductor substrate;
a first wiring layer, a second wiring layer, and a third wiring layer formed above the semiconductor substrate, extending in a first direction, and sequentially arranged in a second direction perpendicular to the first direction;
a plurality of active areas formed in the semiconductor substrate, and extending in a direction oblique to the first direction;
a first selection transistor and a second selection transistor formed in each of the active areas, and sharing a source region electrically connected to the second wiring layer;
a first magnetoresistive element which changes a resistance in accordance with a direction of a supplied current, and has one terminal electrically connected to a drain region of the first selection transistor, and an other terminal electrically connected to the first wiring layer; and
a second magnetoresistive element which changes a resistance in accordance with a direction of a supplied current, and has one terminal electrically connected to a drain region of the second selection transistor, and an other terminal electrically connected to the third wiring layer.

2. The device according to claim 1, wherein the first wiring layer, the second wiring layer, and the third wiring layer are formed in the same level layer.

3. The device according to claim 1, wherein
the second wiring layer is formed in a first level layer, and
the first wiring layer and the third wiring layer are formed in a second level layer formed on the first level layer.

4. The device according to claim 1, further comprising a contact layer which electrically connects the second wiring layer and the source region.

5. The device according to claim 1, wherein a group including a plurality of active areas adjacent to each other in the first direction is translationally symmetrical.

6. The device according to claim 1, wherein a group including a plurality of active areas adjacent to each other in the second direction is translationally symmetrical.

7. The device according to claim 1, wherein a group including a plurality of active areas adjacent to each other in the oblique direction is translationally symmetrical.

8. The device according to claim 1, wherein a group including a plurality of active areas adjacent to each other in a direction perpendicular to the oblique direction is translationally symmetrical.

9. The device according to claim 1, wherein two active areas adjacent to each other in the first direction are axially symmetrical.

10. The device according to claim 1, wherein two active areas adjacent to each other in the second direction are axially symmetrical.

11. The device according to claim 1, wherein
the first selection transistor includes a first gate electrode extending in the second direction and formed on a gate insulating film on the semiconductor substrate, the first gate electrode functioning as a first word line, and
the second selection transistor includes a second gate electrode extending in the second direction and formed on a gate insulating film on the semiconductor substrate, the second gate electrode functioning as a second word line.

12. The device according to claim 1, wherein each magnetoresistive element comprises:
a fixed layer in which a magnetization direction is fixed;
a recording layer in which a magnetization direction is variable; and
a nonmagnetic layer sandwiched between the fixed layer and the recording layer.

13. A semiconductor memory device comprising:
a semiconductor substrate;
a first wiring layer, a second wiring layer, and a third wiring layer formed above the semiconductor substrate, extending in a first direction, and sequentially arranged in a second direction perpendicular to the first direction;
a plurality of active areas formed in the semiconductor substrate, having a V-shape, and including a first member which inclines in one direction with respect to the first direction, and a second member which inclines in the other direction with respect to the first direction;
a first selection transistor and a second selection transistor formed in each of the active areas, and sharing a source region electrically connected to the second wiring layer;
a first magnetoresistive element which changes a resistance in accordance with a direction of a supplied current, and has one terminal electrically connected to a drain region of the first selection transistor, and an other terminal electrically connected to the first wiring layer; and
a second magnetoresistive element which changes a resistance in accordance with a direction of a supplied current, and has one terminal electrically connected to a drain region of the second selection transistor, and an other terminal electrically connected to the third wiring layer.

14. The device according to claim 13, wherein the first wiring layer, the second wiring layer, and the third wiring layer are formed in the same level layer.

15. The device according to claim 13, wherein
the second wiring layer is formed in a first level layer, and the first wiring layer and the third wiring layer are formed in a second level layer formed on the first level layer.

16. The device according to claim 13, further comprising a contact layer which electrically connects the second wiring layer and the source region.

17. The device according to claim 13, wherein said plurality of active areas are translationally symmetrical along the second direction.

18. The device according to claim 13, wherein
the first selection transistor includes a first gate electrode extending in the second direction and formed on a gate insulating film on the semiconductor substrate, the first gate electrode functioning as a first word line, and
the second selection transistor includes a second gate electrode extending in the second direction and formed on a gate insulating film on the semiconductor substrate, the second gate electrode functioning as a second word line.

19. The device according to claim 13, wherein each active area has a zigzag shape, and is formed by sequentially connecting a plurality of V-shaped portions along the first direction.

20. The device according to claim 13, wherein each magnetoresistive element comprises:
a fixed layer in which a magnetization direction is fixed;
a recording layer in which a magnetization direction is variable; and
a nonmagnetic layer sandwiched between the fixed layer and the recording layer.

* * * * *